United States Patent
Shiga et al.

(10) Patent No.: US 9,805,804 B2
(45) Date of Patent: Oct. 31, 2017

(54) SEMICONDUCTOR MEMORY DEVICE AND DATA ERASING METHOD

(71) Applicant: TOSHIBA MEMORY CORPORATION, Tokyo (JP)

(72) Inventors: Hidehiro Shiga, Yokohama Kanagawa (JP); Masanobu Shirakawa, Chigasaki Kanagawa (JP); Kenichi Abe, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/167,918

(22) Filed: May 27, 2016

(65) Prior Publication Data

US 2016/0276032 A1   Sep. 22, 2016

Related U.S. Application Data

(63) Continuation of application No. 14/637,292, filed on Mar. 3, 2015, now Pat. No. 9,355,731.

(30) Foreign Application Priority Data

Aug. 28, 2014 (JP) ................................ 2014-174421

(51) Int. Cl.
   *G11C 16/16* (2006.01)
   *G11C 16/14* (2006.01)
   (Continued)

(52) U.S. Cl.
   CPC .......... *G11C 16/14* (2013.01); *G11C 16/0483* (2013.01); *G11C 16/16* (2013.01);
   (Continued)

(58) Field of Classification Search
   CPC ................ G11C 16/0483; G11C 16/16; H01L 27/11519; H01L 27/11524; H01L 27/11548
   (Continued)

(56) References Cited

U.S. PATENT DOCUMENTS 7,170,796 B1   1/2007   He et al.
8,730,738 B2 *  5/2014   Oh .......................... G11C 16/10
                                                 365/185.17

(Continued)

OTHER PUBLICATIONS

TW Office Action dated May 25, 2016 for Application No. 104106912.

(Continued)

*Primary Examiner* — Tan T. Nguyen
(74) *Attorney, Agent, or Firm* — Patterson & Sheridan, LLP

(57) ABSTRACT

A semiconductor memory device includes a memory cell array including a plurality of groups of memory cells above a substrate, the groups including a first group and a second group, each of the first and second groups including a first memory string and a second memory string, the first memory string including first memory cells that are disposed in a first layer, the second memory string including second memory cell that are disposed in a second layer above the first layer, and a controller configured to perform an erasing operation on the memory cells, the erasing operation including a verifying operation on the memory cells to determine on a layer by layer basis whether the memory cells failed to erase data stored therein.

10 Claims, 76 Drawing Sheets

(51) Int. Cl.
  *G11C 16/04*      (2006.01)
  *G11C 16/34*      (2006.01)
  *H01L 27/11519*   (2017.01)
  *H01L 27/11524*   (2017.01)
  *H01L 27/11548*   (2017.01)
  *H01L 27/11551*   (2017.01)

(52) U.S. Cl.
  CPC .... *G11C 16/3445* (2013.01); *H01L 27/11519* (2013.01); *H01L 27/11524* (2013.01); *H01L 27/11548* (2013.01); *H01L 27/11551* (2013.01)

(58) Field of Classification Search
  USPC ............ 365/185.16, 185.11, 185.18, 185.22, 365/185.29
  See application file for complete search history.

(56) References Cited

U.S. PATENT DOCUMENTS

| | | | |
|---|---|---|---|
| 2012/0243309 A1* | 9/2012 | Asoaka | G11C 16/0483 365/182 |
| 2012/0268978 A1 | 10/2012 | Shibata | |
| 2014/0192594 A1* | 7/2014 | Lue | G11C 16/10 365/185.11 |
| 2015/0262699 A1* | 9/2015 | Shirakawa | G11C 16/3445 365/185.11 |

OTHER PUBLICATIONS

English Translation of TW Office Action dated May 25, 2016 for Application No. 104106912.

\* cited by examiner

ERASING OF FIRST DATA
EVEN-NUMBERED WL OF
EVEN-NUMBERED LAYER

ERASING OF SECOND DATA
ODD-NUMBERED WL OF
EVEN-NUMBERED LAYER

ERASING OF THIRD DATA
EVEN-NUMBERED WL OF
ODD-NUMBERED LAYER

DURING ERASURE

HOLES ARE INJECTED INTO REGION A1 BETWEEN MEMORY CELL TRANSISTORS

DURING PROGRAMMING

"1" IS WRITTEN IN SELECT WORD LINE (CHARGE IS INJECTED), AND HOLES ARE TRAPPED IN REGION A1

▨ MEMORY CELL TRANSISTOR BEING TARGET FOR ERASURE
◯ TRANSISTOR CAUSING GIDL

FIG. 69

| prefix command DURING PREVIOUS ERASURE | THE NUMBER OF DETERMINATIONS M OF THE NUMBER OF ERASING LOOPS m | prefix command TO BE ISSUED |
|---|---|---|
| NO prefix command | $0 < m \leq M1$ | NO prefix command |
| | $m > M1$ | FIRST prefix command |
| FIRST prefix command | $0 < m \leq M2$ | FIRST prefix command |
| | $m > M2$ | SECOND prefix command |
| SECOND prefix command | $0 < m \leq M3$ | SECOND prefix command |
| | $m > M3$ | THIRD prefix command |
| THIRD prefix command | $0 < m \leq M4$ | THIRD prefix command |
| | $m > M4$ | FOURTH prefix command |
| FOURTH prefix command | — | FOURTH prefix command |

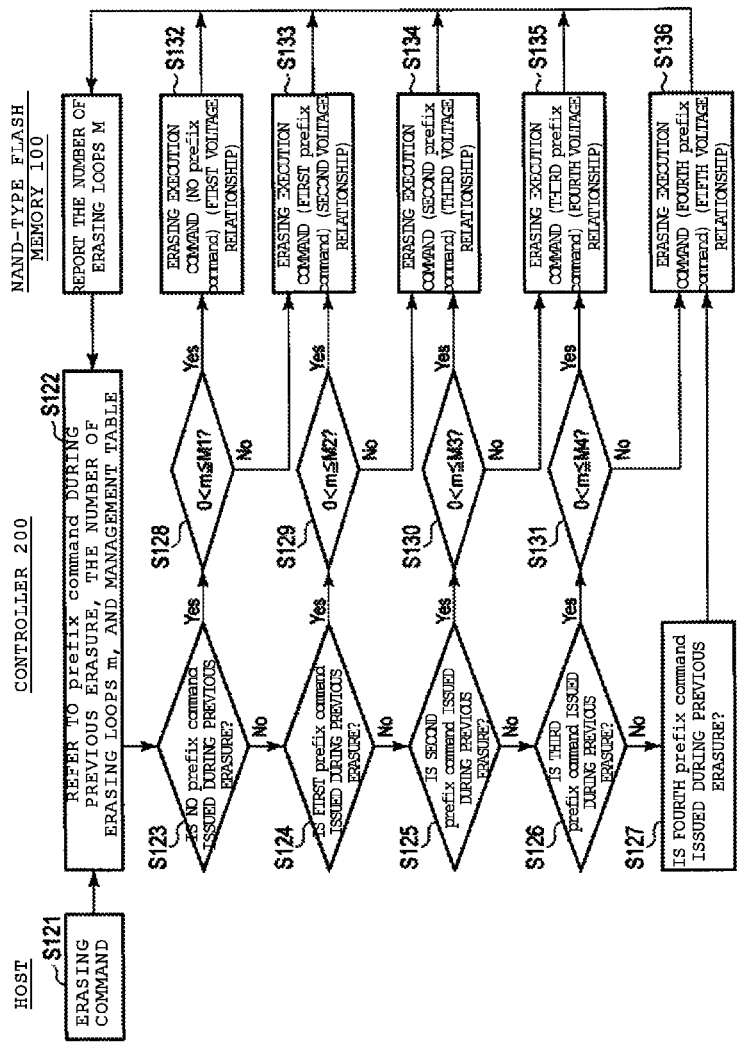

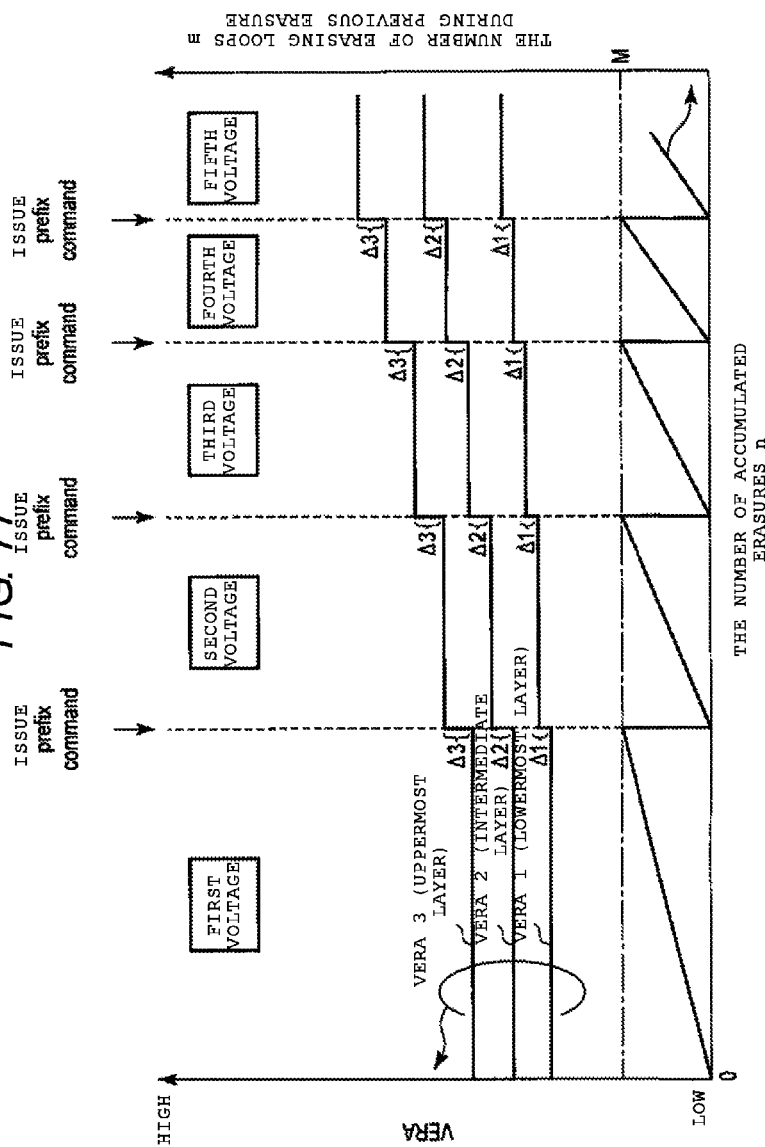

SEMICONDUCTOR MEMORY DEVICE AND DATA ERASING METHOD

CROSS-REFERENCE TO RELATED APPLICATION

This application continuation of U.S. patent application Ser. No. 14/637,292 filed Mar. 3, 2015, which is based upon and claims the benefit of priority from Japanese Patent Application No. 2014-174421, filed Aug. 28, 2014, the entire contents of which are incorporated herein by reference.

FIELD

Embodiments described herein relate to generally a semiconductor memory device and a data erasing method.

BACKGROUND

NAND-type flash memories having memory cell transistors arranged three-dimensionally are known.

DESCRIPTION OF THE DRAWINGS

FIG. 69 is a conceptual diagram of a management table according to a second example of the eleventh embodiment.

FIG. 70 is a flow chart showing a data erasing operation according to the second example of the eleventh embodiment.

FIG. 77 is a graph showing a relationship between the number of accumulated erasures, the number of erasing loops, and VERA according to a modification example of the eleventh embodiment.

DETAILED DESCRIPTION

Figure 1:
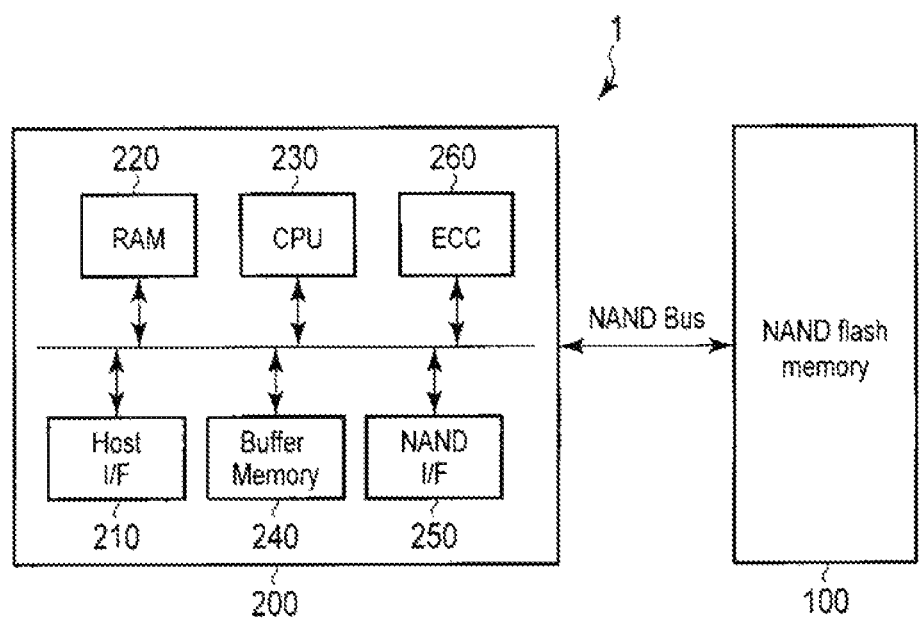
FIG. 1 is a block diagram of a memory system according to a first embodiment.

The present embodiment now will be described more fully hereinafter with reference to the accompanying drawings, in which various embodiments are shown. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to limit the scope of the invention. As used herein, the singular forms "a," "an" and "the" are intended to include the plurality of forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments are described herein with reference to cross section and perspective illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

A semiconductor memory device and a data erasing method which are capable of improving operational reliability are provided.

In general, according to an embodiment, a semiconductor memory device includes a memory cell array including a plurality of groups of memory cells above a substrate, the groups including a first group and a second group, each of the first and second groups including a first memory string and a second memory string, the first memory string including first memory cells that are disposed in a first layer, the second memory string including second memory cell that are disposed in a second layer above the first layer, and a controller configured to perform an erasing operation on the memory cells, the erasing operation including a verifying operation on the memory cells to determine on a layer by layer basis whether the memory cells failed to erase data stored therein.

Hereinafter, embodiments will be described with reference to the accompanying drawings. In this description, common portions will be denoted by common reference numerals and signs throughout all drawings.

1. First Embodiment

A semiconductor memory device and a data erasing method according to a first embodiment will be described below. Hereinafter, a description will be given of a three-dimensional stacked NAND-type flash memory in which memory cell transistors are stacked on a semiconductor substrate as an example of the semiconductor memory device.

1.1 With Regard to Configuration 1.1.1 With Regard to Configuration of Memory System First, the configuration of a memory system including the semiconductor memory device according to this embodiment will be described with reference to FIG. 1. FIG. 1 is a block diagram of the memory system according to this embodiment.

As shown in the drawing, a memory system 1 includes a NAND-type flash memory 100 and a controller 200. For example, a combination of the controller 200 and the NAND-type flash memory 100 may form one semiconductor memory device. Examples of the semiconductor memory device include a memory card such as an SDTM card, a solid state drive (SSD), and the like.

The NAND-type flash memory 100 includes a plurality of memory cell transistors and stores data in a non-volatile manner. The configuration of the NAND-type flash memory 100 will be described later in detail.

The controller 200 commands the NAND-type flash memory 100 to perform reading, writing, erasing, and the like in response to a command from an external host device. In addition, the controller manages a memory space of the NAND-type flash memory 100.

The controller 200 includes a host interface circuit 210, a built-in memory (RAM) 220, a processor (CPU) 230, a buffer memory 240, a NAND interface circuit 250, and an ECC circuit 260.

The host interface circuit 210 is connected to a host device through a controller bus and communicates with the host device. In addition, the host interface circuit transfers the command and the data received from the host device to the CPU 230 and the buffer memory 240. In addition, the host interface circuit transfers data in the buffer memory 240 to the host device in response to the command of the CPU 230.

The NAND interface circuit 250 is connected to the NAND-type flash memory 100 through a NAND bus and communicates with the NAND-type flash memory 100. In addition, the NAND interface circuit transfers the command received from the CPU 230 to the NAND-type flash memory 100, and also transfers write data in the buffer memory 240 to the NAND-type flash memory 100 during writing. Further, the NAND interface circuit transfers data read from the NAND-type flash memory 100 to the buffer memory 240 during reading.

The CPU 230 controls the operation of the entire controller 200. For example, when the CPU receives a writing command from the host device, the CPU issues a writing command based on a NAND interface in response to the writing command. This is same during reading and erasing. In addition, the CPU 230 performs various processes for managing the NAND-type flash memory 100 such as wear leveling. Further, the CPU 230 performs various types of computations. For example, the CPU performs the encryption and randomizing of data, and the like.

The ECC circuit 260 performs error checking and correcting (ECC) of data. That is, the ECC circuit 260 generates a parity based on write data during data wiring, generates a syndrome from the parity during data reading to thereby detect an error, and corrects the error. Meanwhile, the CPU 230 may have a function of the ECC circuit 260.

The built-in memory 220 is a semiconductor memory such as, for example, a DRAM and is used as a working region of the CPU 230. The built-in memory 220 holds firmware for managing the NAND-type flash memory 100, various types of management tables, and the like. In addition, the built-in memory 220 according to this embodiment holds, for example, a management table which is used during an erasing operation.

1.1.2 With Regard to Configuration of Semiconductor Memory Device

Next, the configuration of the NAND-type flash memory 100 will be described.

1.1.2.1 With Regard to Entire Configuration of Semiconductor Memory Device

Figure 2:
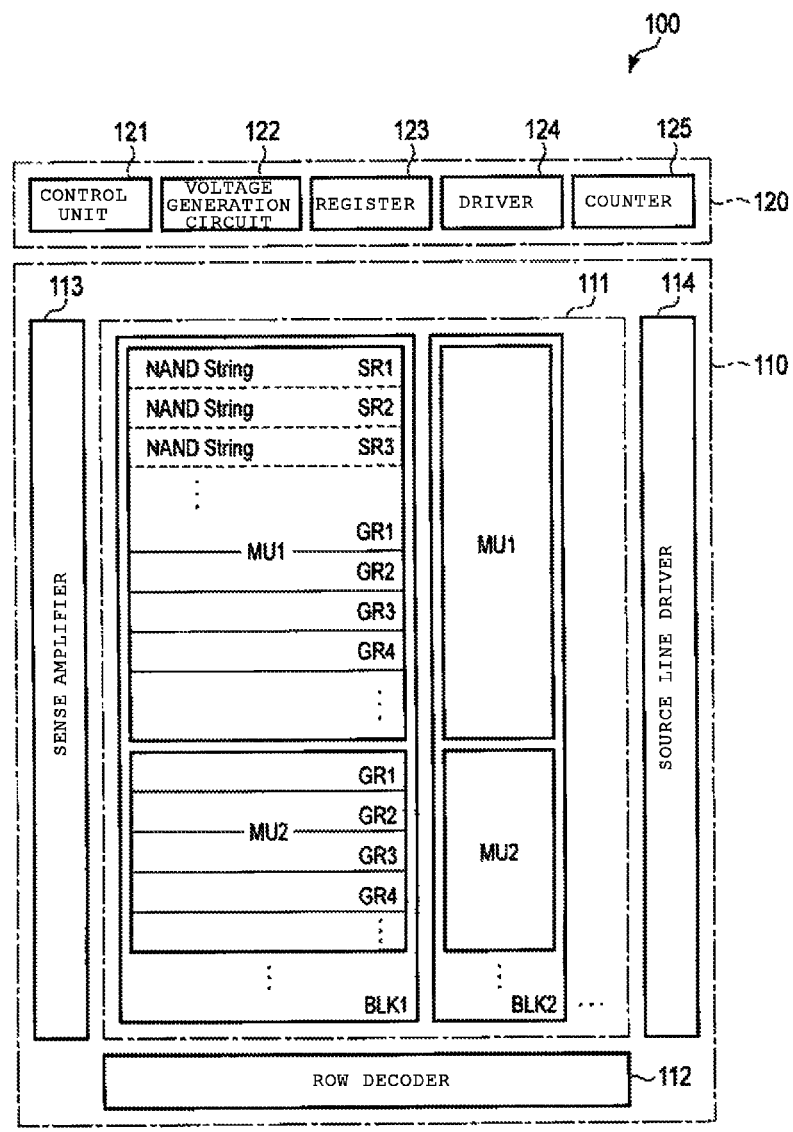
FIG. 2 is a block diagram of a semiconductor memory device according to the first embodiment.

FIG. 2 is a block diagram of the NAND-type flash memory 100 according to this embodiment. As shown in the drawing, the NAND-type flash memory 100 roughly includes a core unit 110 and a peripheral circuit 120.

The core unit 110 includes a memory cell array 111, a row decoder 112, a sense amplifier 113, and a source line driver 114.

The memory cell array 111 includes a plurality of blocks BLK (BLK1, BLK2, . . . ) which is a group of a plurality of non-volatile memory cell transistors MT. Data in the same block BLK are collectively erased. Each of the blocks BLK include a plurality of memory units MU (MU1, MU2, . . . ) which are a group of the memory cell transistors MT associated with word lines and bit lines. Each of the memory units MU includes a plurality of string groups GR (GR1, GR2, GR3, GR4, . . . ) which are a group of NAND strings SR (SR1, SR2, SR3, . . . ) in which the memory cell transistors are connected to each other in series. The number of memory units MU within the memory cell array 111, the number of string groups GR within one memory unit MU, and the number of NAND strings SR within one string group are arbitrary. The memory cell array 111 will be described later in detail.

The row decoder 112 decodes an address of the memory unit MU and an address of a page to be described later and selects any of the word lines WL of the corresponding memory unit MU. The row decoder 112 applies an appropriate voltage to the select word lines WL and the non-select word lines WL.

The sense amplifier 113 includes a sense circuit provided for each bit line BL. Each of the sense circuits senses and amplifies data read into the bit line BL from the memory cell transistor MT during data reading. In addition, the sense circuit transfers write data to the memory cell transistor MT during data writing. Data reading and writing to the memory cell array 111 are performed in units of plurality of memory cell transistors MT, and this unit is a page.

The peripheral circuit 120 includes a control unit 121, a voltage generation circuit 122, a register 123, a driver 124, and a counter 125.

The control unit 121 controls the operation of the entire NAND-type flash memory 100.

The voltage generation circuit 122 generates a voltage necessary for data wiring, reading, and erasing and supplies the generated voltage to the driver 124.

The driver 124 supplies a voltage necessary for data wiring, reading, and erasing to the row decoder 112, the sense amplifier 113, the source line driver 114, and the like. The voltage is applied to the memory cell transistor MT by the row decoder 112, the sense amplifier 113, and the source line driver 114.

The register 123 holds various signals. For example, the register holds the status of data writing and erasing operations, and thus notifies the controller of whether or not the operations have been normally completed. Alternatively, the register 123 may also hold various tables.

The counter 125 counts various data. For example, the counter counts the number of bits failing in erasing data during a data erasing operation and records the counted number of bits.

1.1.2.2 With Regard to Configuration of Memory Cell Array

Figure 3:
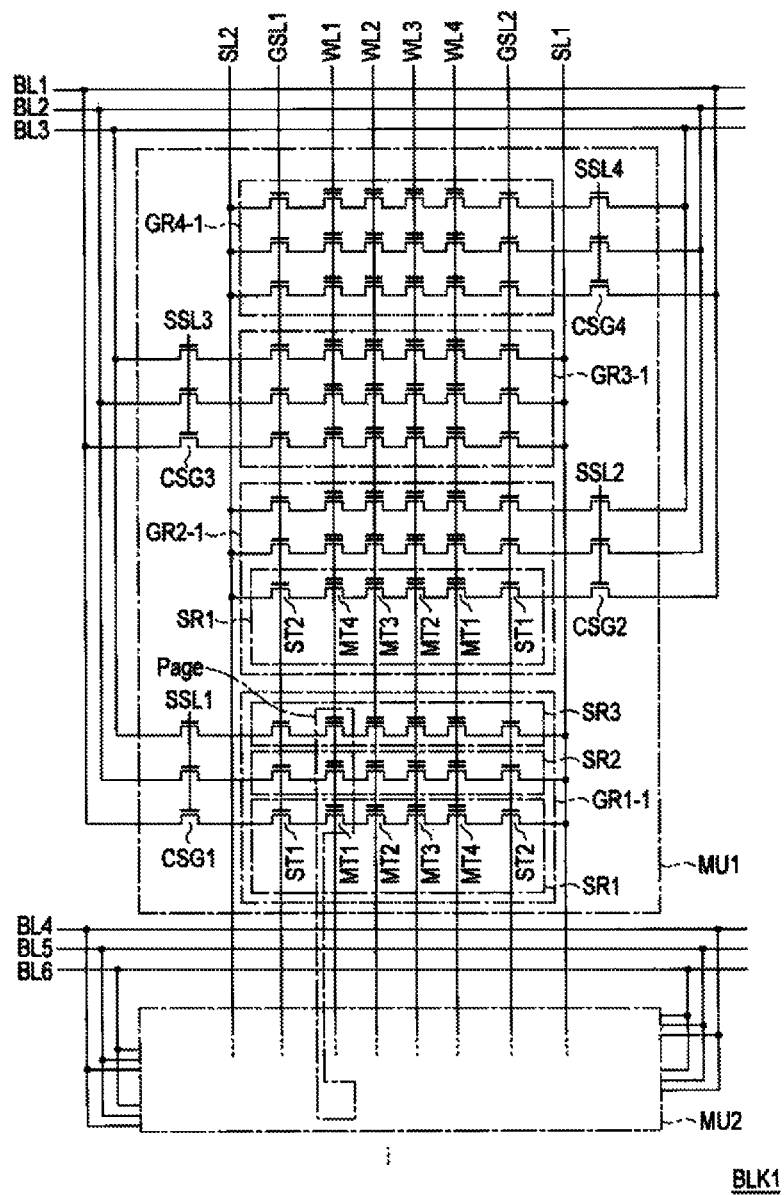
FIG. 3 is a circuit diagram of a memory cell array according to the first embodiment.

FIG. 3 is a circuit diagram of the memory cell array 111 according to this embodiment. As shown in the drawing, the memory cell array 111 includes the plurality of memory units MU (MU1, MU2) within each block BLK. In FIG. 3, only two memory units MU are shown, but there may be three or more memory units and the number of memory units is not limited to two.

Each of the memory units MU includes, for example, four string groups GR (GR1 to GR4). Naturally, the number of string groups GR is not limited to four, and may be three or less or may be five or more. Meanwhile, when distinguishing the memory units MU1 and MU2 from each other, the string groups GR of the memory unit MU1 are referred to as GR1-1 to GR4-1 and the string groups GR of the memory unit MU2 are referred to as GR1-2 to GR4-2.

Each of the string groups GR includes, for example, three NAND strings SR (SR1 to SR3). The number of NAND strings SR is not limited to three and may be four or more. Each of the NAND strings SR includes the selection transistors ST1 and ST2 and four memory cell transistors MT (MT1 to MT4). The number of memory cell transistors MT is not limited to four, and may be five or more or may be three or less. The memory cell transistor MT forms a transistor including a stacked gate that includes a control gate and a charge storage layer and holds data in a non-volatile manner. The memory cell transistors MT are connected in series between the source of the selection transistor ST1 and the drain of the selection transistor ST2. The memory cell transistor MT may be a MONOS type using an insulating film for a charge storage layer and may be an FG type using a conductive film for a charge storage layer. In the case of the MONOS type, the charge storage layer may be continuously formed between the memory cell transistors adjacent to each other. In the case of the FG type, the charge storage layer is separated for each memory cell transistor. Hereinafter, a case where the memory cell transistor MT is a MONOS type will be described as an example.

Three NAND strings SR1 to SR3 are sequentially stacked on the semiconductor substrate within the string group GR. The NAND string SR1 is formed in a lowermost layer, the NAND string SR2 is formed in an intermediate layer, and the NAND string SR3 is formed in an uppermost layer. The gates of the selection transistors ST1 and ST2 included in the same string group GR are connected to the same selection gate lines GSL1 and GSL2, respectively. The control gates of the memory cell transistors MT located at the same column are connected to the same word line WL. Further, the drains of three selection transistors ST1 within a certain string group GR are connected to different bit lines BL through a selection transistor CSG, and the sources of the selection transistors ST2 are connected to the same source line SL.

Specifically, the drains of the selection transistors ST1 of the odd-numbered string groups GR1 and GR3 are connected to the sources of the column selection transistors CSG1 and CSG3, respectively, and the sources of the selection transistors ST2 are connected in common to the source line SL1. On the other hand, the drains of the selection transistors ST1 of the even-numbered string groups GR2 and GR4 are connected to the sources of the column selection transistors CSG2 and CSG4, respectively, and the sources of the selection transistors ST2 are connected in common to the source line SL2.

The gates of the selection transistors ST1 of the string groups GR1 and GR3 and the gates of the selection transistors ST2 of the string groups GR2 and GR4 are connected in common to the same selection gate line GSL1. In addition, the gates of the selection transistors ST2 of the string groups GR1 and GR3 and the gates of the selection transistors ST1 of the string groups GR2 and GR4 are connected in common to the same selection gate line GSL2.

In the string groups GR1 and GR3, the control gates of the memory cell transistors MT1, MT2, MT3, and MT4 are connected to the word lines WL1, WL2, WL3, and WL4, respectively. On the other hand, in the string groups GR2 and GR4, the control gates of the memory cell transistors MT4, MT3, MT2, and MT1 are connected to the word lines WL1, WL2, WL3, and WL4.

In addition, the NAND strings SR1 to SR3 of four string groups GR1 to GR4 included in a certain memory unit MU are connected to the same bit line BL, and different memory units MU are connected to different bit lines BL. More specifically, in the memory unit MU1, the drains of the selection transistors ST1 of the NAND strings SR1 to SR3 in the string groups GR1 to GR4 are connected to the bit lines BL1 to BL3, respectively, through the column selection transistors CSG (CSG1 to CSG4). For example, the column selection transistor CSG has the same configuration as those of the memory cell transistor MT and the selection transistors ST1 and ST2. In each memory unit MU, one string group GR connected to the bit lines BL is selected. Accordingly, the gates of the column selection transistors CSG1 to CSG4 associated with the each string group GR are controlled by the control signal lines SSL1 to SSL4 different from each other.

The plurality of memory units MU having the above-mentioned configuration are arrayed in a vertical direction in the paper describing FIG. 3. The plurality of memory units MU share the word lines WL and the selection gate lines GSL1 and GSL2 with the memory unit MU1. On the other hand, the bit line BL is independently provided for each memory unit. For example, the memory unit MU2 is associated with three bit lines BL4 to BL6 different from those of the memory unit MU1. Similarly, the memory unit MU3 is associated with bit lines BL7 to BL9. In other words, the number of bit lines BL associated with each memory unit MU corresponds to the total number of NAND strings SR included in one string group GR. Accordingly, when the NAND string SR is configured with four layers, the number of bit lines corresponding to one memory unit MU is four. In addition, the control signal lines SSL1 to SSL4 are shared between the memory units MU.

In the above-mentioned configuration, a group of the plurality of memory cell transistors MT connected to the same word line WL in one string group GR selected from each memory unit MU is set as a unit referred to as a "page". Data writing and reading are performed in units of pages. For example, in FIG. 3, when the signal SSL1 and the word line WL1 are selected as an example, one page is formed by the memory cell transistors MT connected to the word line WL1 in the string group GR1-1 of the memory unit MU1 and the string group GR1-2 of the memory unit MU2. In addition, six memory cell transistors MT1 included in the page are connected to the bit lines BL1 to BL6, respectively. When three memory units MU are provided, the memory cell transistors MT1 in the string group GR1-3 of the memory unit MU3 are included in the page. This is the same as in a case where other signal lines SSL or word lines WL are selected.

Figure 4:
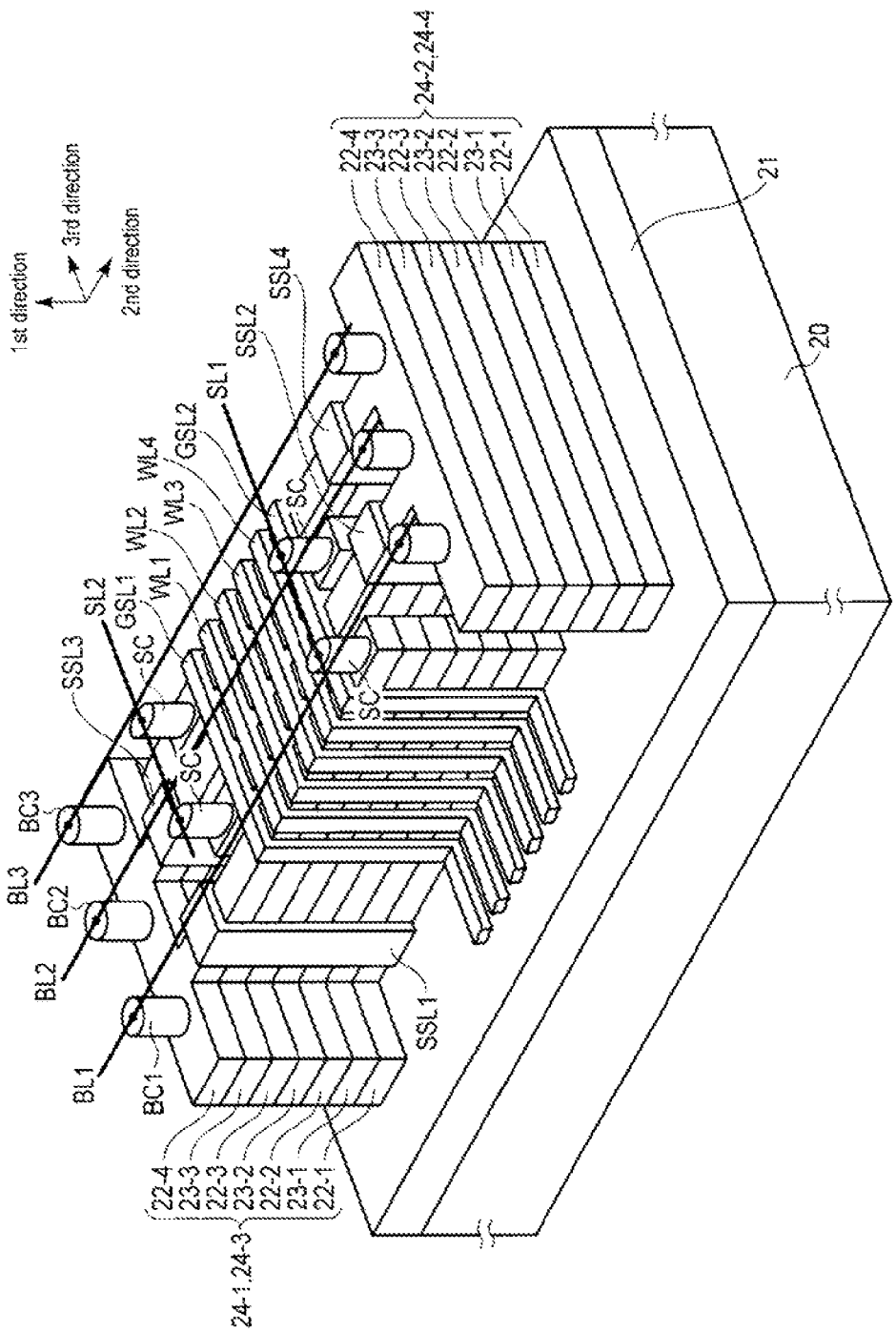
FIG. 4 is a perspective view of the memory cell array according to the first embodiment.
Figure 5:
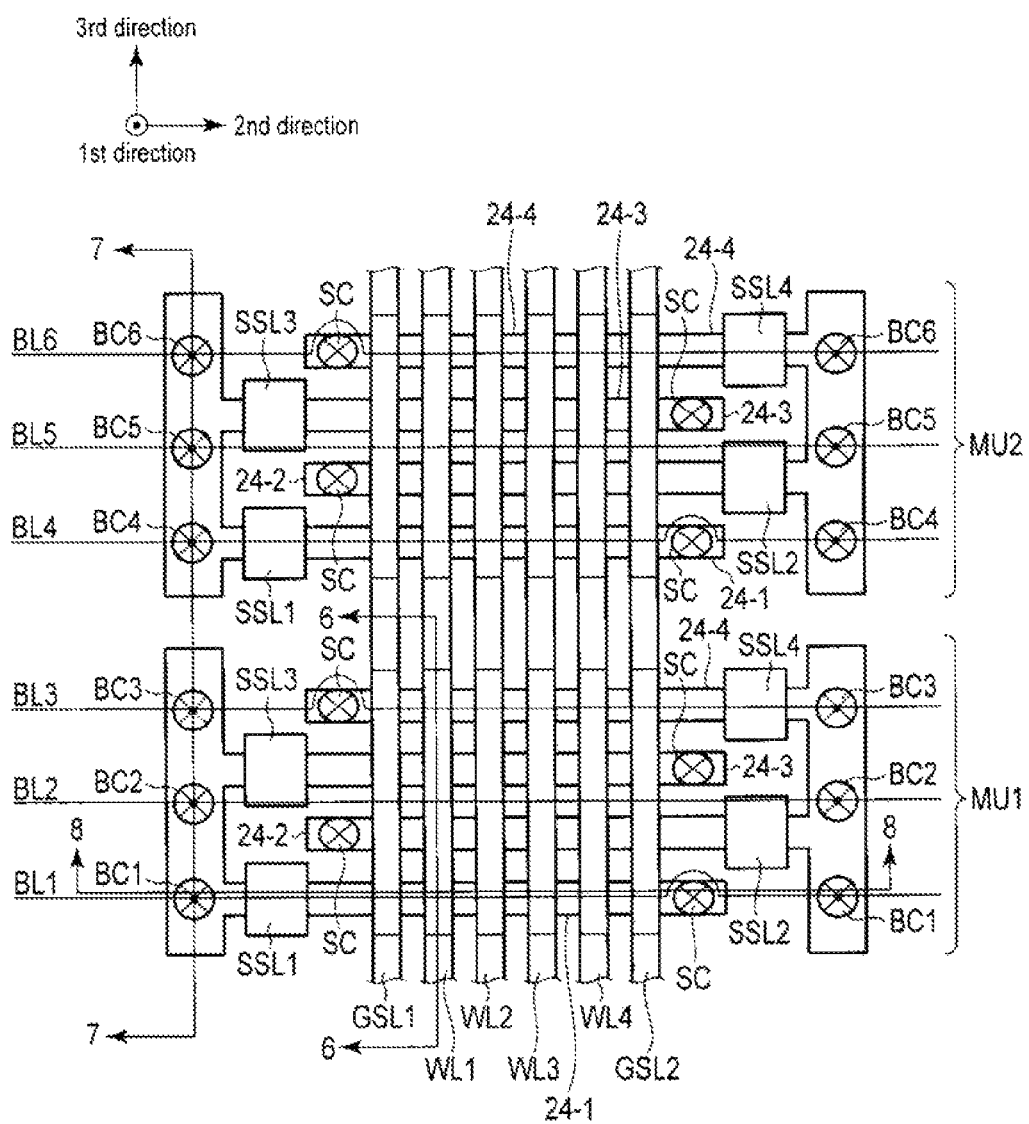
FIG. 5 is a plan view of the memory cell array according to the first embodiment.
Figure 6:
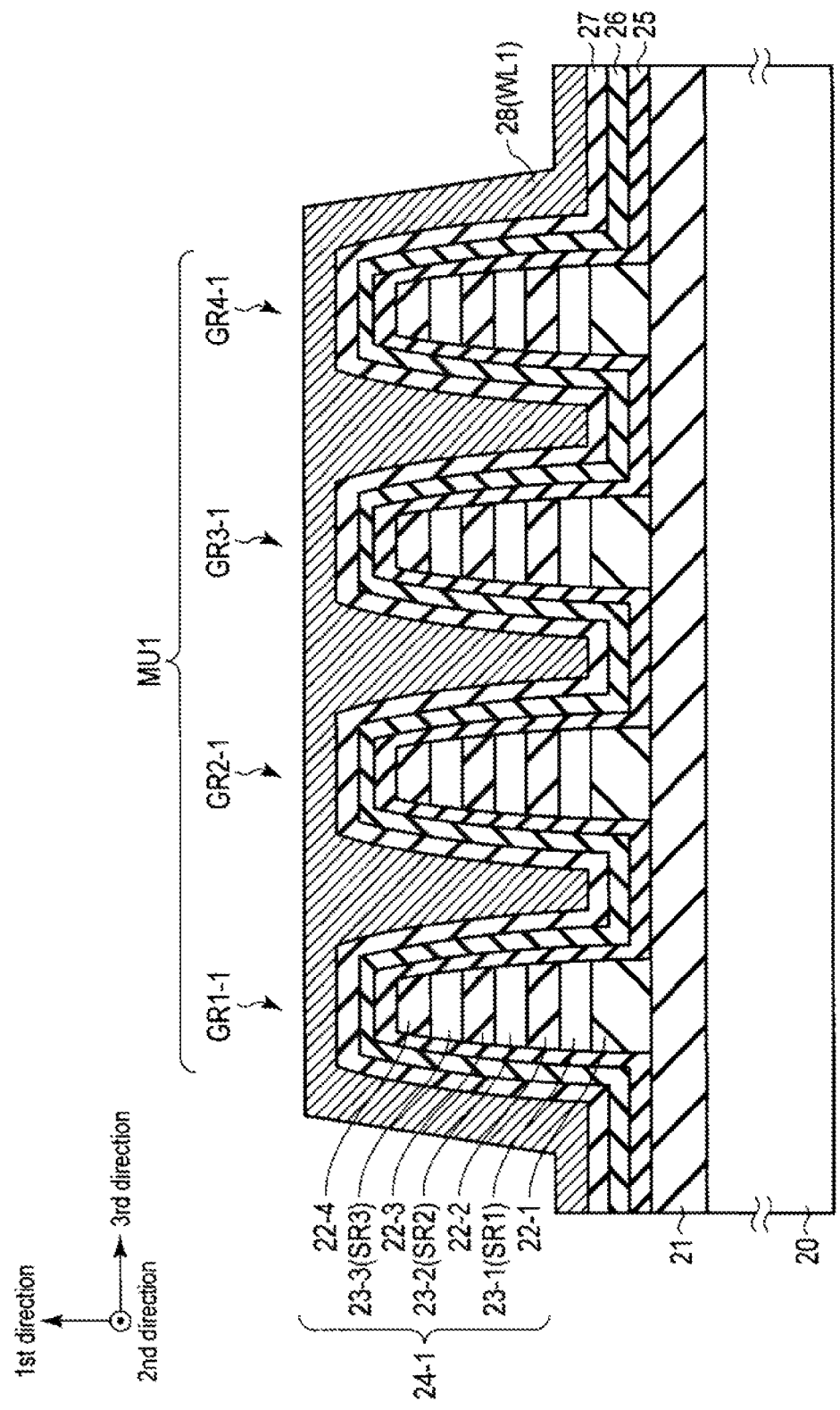
FIG. 6 is a cross-sectional view taken along line 6-6 in FIG. 5.
Figure 7:
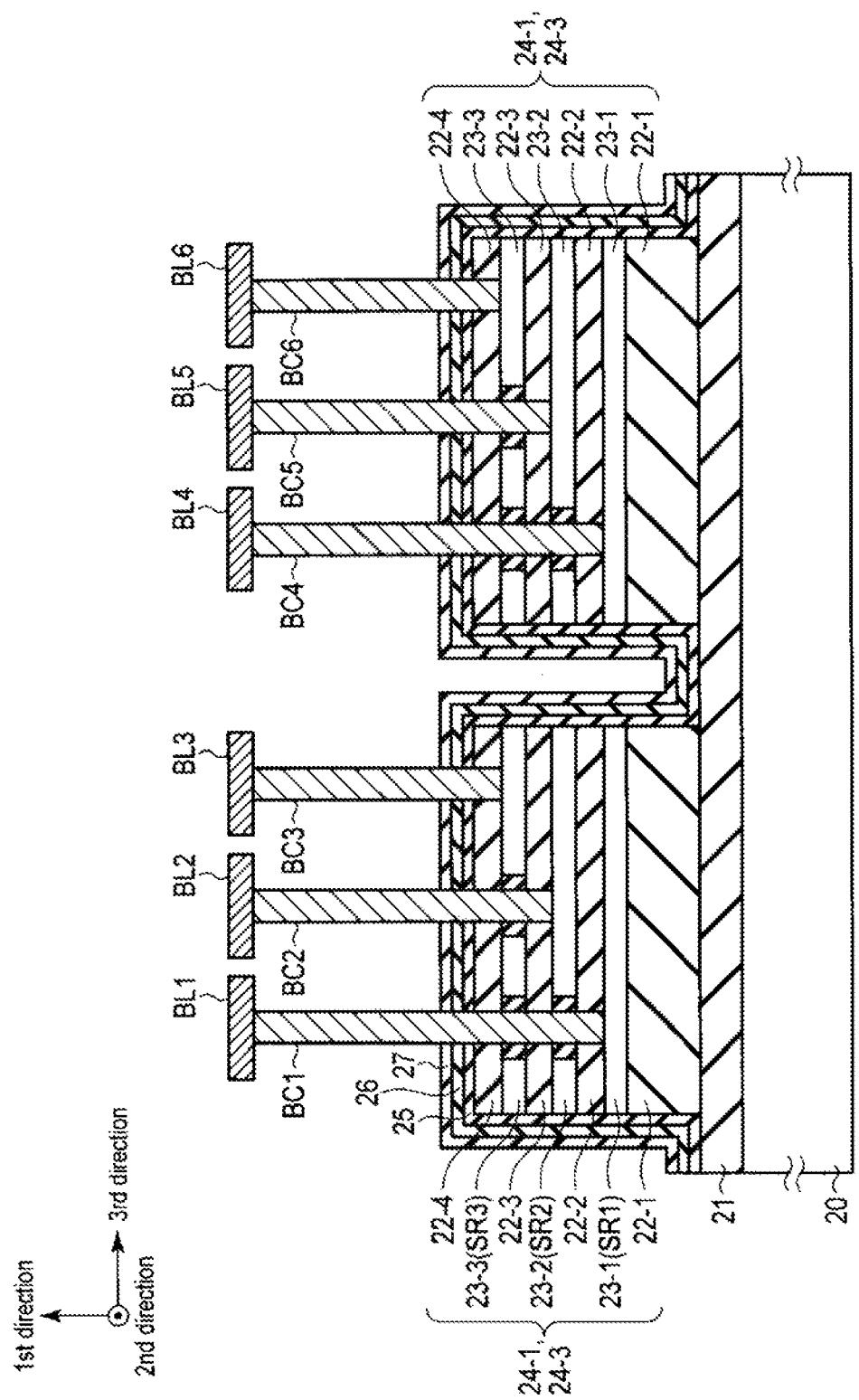
FIG. 7 is a cross-sectional view taken along line 7-7 in FIG. 5.
Figure 8:
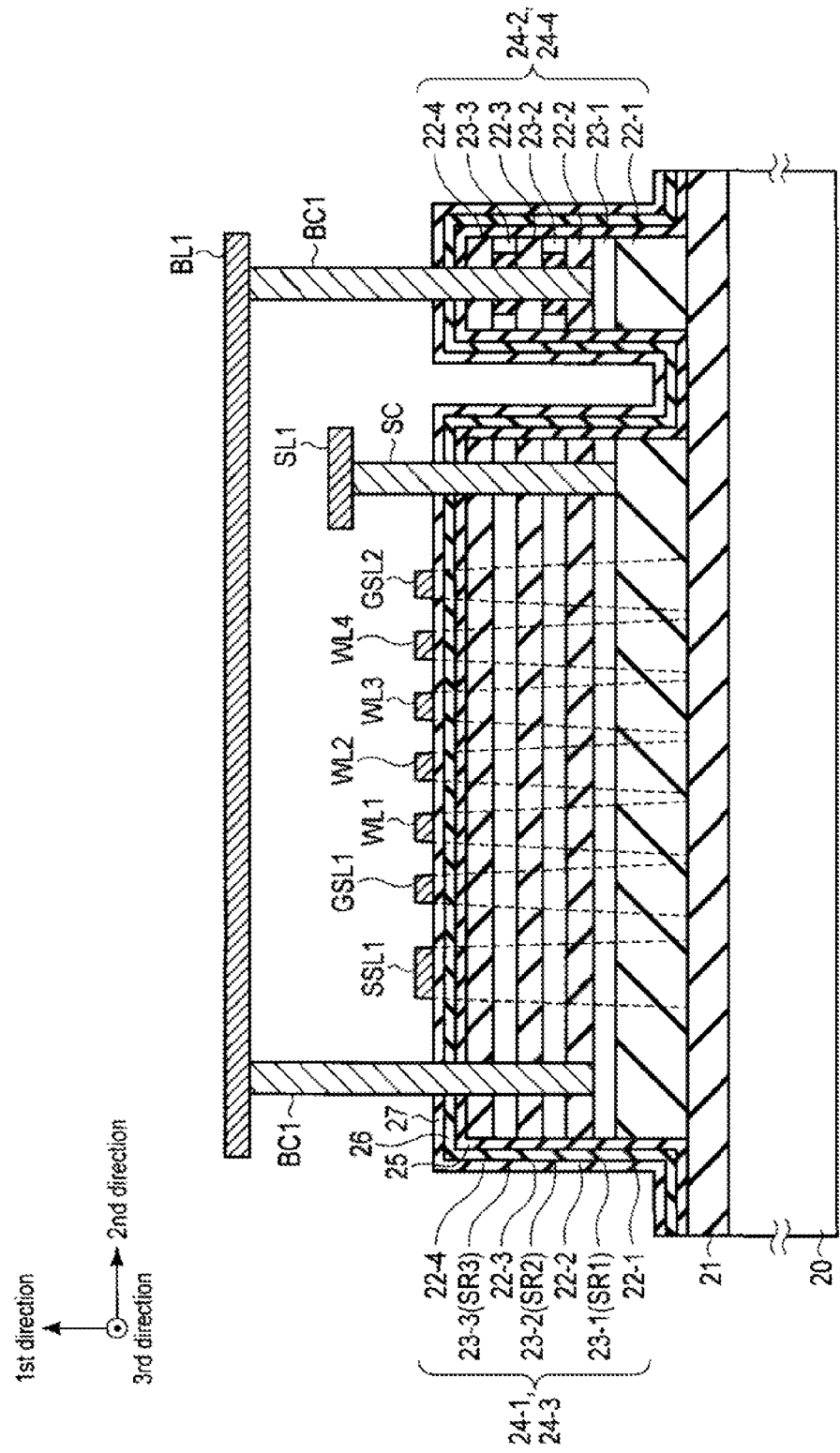
FIG. 8 is a cross-sectional view taken along line 8-8 in FIG. 5.

FIG. 4 is a perspective view of the memory cell array 111, FIG. 5 is a plan view of the memory cell array 111, FIG. 6 is a cross-sectional view taken along line 6-6 in FIG. 5, FIG. 7 is a cross-sectional view taken along line 7-7 in FIG. 5, and FIG. 8 is a cross-sectional view taken along line 8-8 in FIG. 5. In FIG. 4, FIG. 6, and FIG. 8, one memory unit MU is shown, and FIG. 5 and FIG. 7 show two memory units MU1 and MU2.

As shown in the drawing, an insulating film 21 is formed on the semiconductor substrate 20, and the memory cell array 111 is formed on the insulating film 21.

For example, four fin type structures 24 (24-1 to 24-4) having a stripe shape are formed on the insulating film 21 in a second direction intersecting a first direction which is a direction perpendicular to the surface of the semiconductor substrate 20, and thus one memory unit MU is formed. Each of the fin type structures 24 includes insulating films 22 (22-1 to 22-4) and semiconductor layers 23 (23-1 to 23-3) which are alternately stacked. Each of the fin type structures 24 is equivalent to the string group GR described in FIG. 3. The semiconductor layer 23-1 which is the lowermost layer is equivalent to a current path (region where a channel is formed) of the NAND string SR1, the semiconductor layer 23-3 which is the uppermost layer is equivalent to a current path of the NAND string SR3, and the semiconductor layer 23-2 located therebetween is equivalent to a current path of the NAND string SR2.

A tunnel insulating film 25, a charge storage layer 26, a block insulating film 27, and a conductive film 28 are sequentially formed on the top surface and the side surface of the fin type structure 24 (see FIG. 6). The charge storage layer 26 is formed of, for example, an insulating film. In addition, the conductive film 28 is formed of, for example, a metal and functions as the word line WL or the selection gate lines GSL1 and GSL2. The word line WL and the selection gate lines GSL1 and GSL2 are formed so as to straddle the plurality of fin type structures 24 between the plurality of memory units MU. On the other hand, the control signal lines SSL1 to SSL4 are independently provided for each fin type structure 24.

One end of the fin type structure 24 is extracted to an end of the memory cell array 111 and is connected to the bit line BL in the extracted region. That is, when focusing on the memory unit MU1 as an example, one end of each of the odd-numbered fin type structures 24-1 and 24-3 is extracted to a certain region along the second direction and is connected in common to the region, and contact plugs BC1 to BC3 are formed in the region. The contact plug BC1 formed in the region is connected to the semiconductor layers 23-1 of the string groups GR1 and GR3 and the bit line BL1 and is insulated from the semiconductor layers 23-2 and 23-3. The contact plug BC2 is connected to the semiconductor layers 23-2 of the string groups GR1 and GR3 and the bit line BL2 and is insulated from the semiconductor layers 23-1 and 23-3. The contact plug BC3 is connected to the semiconductor layers 23-3 of the string groups GR1 and GR3 and the bit line BL3 and is insulated from the semiconductor layers 23-1 and 23-2.

On the other hand, one end of each of the even-numbered fin type structures 24-2 and 24-4 is extracted to a region facing one end of each of the fin type structures 24-1 and 24-3 in the second direction and is connected in common to the region, and the contact plugs BC1 to BC3 are formed in the region. The contact plug BC1 formed in the region is connected to the semiconductor layers 23-1 of the string groups GR2 and GR4 and the bit line BL1 and is insulated from the semiconductor layers 23-2 and 23-3. The contact plug BC2 is connected to the semiconductor layers 23-2 of the string groups GR2 and GR4 and the bit line BL2 and is insulated from the semiconductor layers 23-1 and 23-3. The contact plug BC3 is connected to the semiconductor layers 23-3 of the string groups GR2 and GR4 and the bit line BL3 and is insulated from the semiconductor layers 23-1 and 23-2.

As described above, the odd-numbered fin type structures 24-1 and 24-3 (that is, the string groups GR1 and GR3) and the even-numbered fin type structures 24-2 and 24-4 (that is, the string groups GR2 and GR4) are disposed so that the dispositions of the NAND strings SR thereof are mutually reversed. For example, in FIG. 5, the odd-numbered fin type structures 24-1 and 24-3 are connected to the bit lines BL on the left side of the drawing, and the control signal lines SSL1 and SSL3 are disposed on the left side of the drawing. Accordingly, the selection transistor ST1 is located at the left side of the drawing, and the selection transistor ST2 is located at the right side of the drawing. In addition, the memory cell transistors MT1 to MT4 are located in the order of MT1 to MT4 from the left side of the drawing. On the other hand, the even-numbered fin type structures 24-2 and 24-4 are connected to the bit lines BL on the right side of the drawing, and the control signal lines SSL2 and SSL4 are disposed on the right side of the drawing. Accordingly, the selection transistor ST1 is located at the right side of the drawing, and the selection transistor ST2 is located at the left side of the drawing. In addition, the memory cell transistors MT1 to MT4 are located in the order of MT1 to MT4 from the right side of the drawing.

The above description relates to a case of the memory unit MU1. In a case of the memory unit MU2, contact plugs BC4 to BC6 are formed, and the contact plugs connects the semiconductor layers 23-1 to 23-3 to the bit lines BL4 to BL6, respectively (see FIG. 7).

In addition, a contact plug SC is formed on the other end of the fin type structure 24. The contact plug SC connects the semiconductor layers 23-1 to 23-3 to the source line SL.

In the above-mentioned configuration, the memory cell transistors MT included in the NAND strings SR1 to SR3 may have different shapes depending on processing characteristics of dry etching, and the like in the manufacturing process thereof. For example, when the insulating films 22 (22-1 to 22-4) and the semiconductor layers 23 (23-1 to 23-3) which are alternately stacked are collectively processed, the processed films and layers may have a shape in which the film or layer located at a higher layer has a smaller width and the side surface thereof has a curved shape as shown in FIG. 6. At this time, the lengths of the side surfaces of the semiconductor layers 23 are formed in the first direction and the second direction. When seen in a plan view, the memory cell transistor MT formed in the semi- conductor layer 23-1 has the smallest gate width. The memory cell transistor MT formed in the semiconductor layer 23-2 has the next smallest gate width. The memory cell transistor MT formed in the semiconductor layer 23-3 has the largest gate width. In other words, the memory cell transistor MT located at a higher layer has a larger gate width, and the memory cell transistor MT located at a lower layer has a smaller gate width. In addition, among the semiconductor layers 23 along the second direction, the semiconductor layer 23-1 has a largest length, the semiconductor layer 23-2 has the next largest length, and the semiconductor layer 23-1 has a smallest length. In other words, the semiconductor layer 23 has a smaller length as the semiconductor layer is located at a higher layer, and the semiconductor layer 23 has a larger length as the semiconductor layer is located at a lower layer.

In addition, as shown in FIG. 8, the word line WL (conductive film 28) located at the upper side may have a narrower shape. As shown in the drawing, the memory cell transistor MT formed in the semiconductor layer 23-1 has the largest width of the word line WL along the second direction, that is, the largest gate width. The memory cell transistor MT formed in the semiconductor layer 23-2 has the next largest gate width. Then, the memory cell transistor MT formed in the semiconductor layer 23-3 has the smallest gate width. In other words, the memory cell transistor has a smaller gate width as the memory cell transistor is located at a higher layer, and the memory cell transistor has a larger gate width as the memory cell transistor is located at a lower layer.

In this manner, the memory cell transistors MT of the respective layers may have different shapes due to manufacturing variations. As a result, the characteristics of the memory cell transistor MT varies for each layer. Meanwhile, in the examples of FIG. 6 and FIG. 8, a case where a to-be-processed layer located at the upper side becomes narrower has been described. However, for example, a to-be-processed layer located at the lower side or intermediate portion of a to-be-processed layer may become narrower depending on the characteristics of dry etching. Accordingly, variations in the characteristics of the memory cell transistor MT between the layers are not constant. However, this embodiment may be applied to any case.

Meanwhile, the configuration of the memory cell array 111 may be as described in, for example, U.S. patent application Ser. No. 12/407,403 entitled "THREE-DIMENSIONAL STACKED NON-VOLATILE SEMICONDUCTOR MEMORY" and filed on Mar. 19, 2009. In addition, the configuration of the memory cell array may be as described in U.S. patent application Ser. No. 12/406,524 entitled "THREE-DIMENSIONAL STACKED NON-VOLATILE SEMICONDUCTOR MEMORY" and filed on Mar. 18, 2009, U.S. patent application Ser. No. 12/679,991 entitled "NON-VOLATILE SEMICONDUCTOR MEMORY DEVICE AND METHOD OF MANUFACTURING THE SAME" and filed on Mar. 25, 2010, and U.S. patent application Ser. No. 12/532,030 entitled "SEMICONDUCTOR MEMORY AND METHOD OF MANUFACTURING THE SAME" and filed on Mar. 23, 2009. These patent applications are incorporated by reference herein in their entireties.

1.2 With Regard to Data Erasing Operation

Next, a data erasing operation according to this embodiment will be described. The data erasing operation includes data erasing operation (operation of extracting charge from the charge storage layer) and a verifying operation to be described later (erasing verification and retry determination). A set of the data erasing operation and the verifying operation is repeated, and thus threshold voltages of all the memory cell transistors MT being targets for erasing are set to be in an erasing level. Hereinafter, the set of the data erasing operation and the verifying operation may be referred to as an "erasing loop". In addition, hereinafter, a case where the memory units MU1 and MU2 shown in FIG. 3 are provided within the block BLK being a target for erasing will be described as an example. Meanwhile, the number of memory units MU that make up one block BLK may be one or three or more.

1.2.1 With Regard to Overall Flow of Data Erasing Operation

Figure 9:
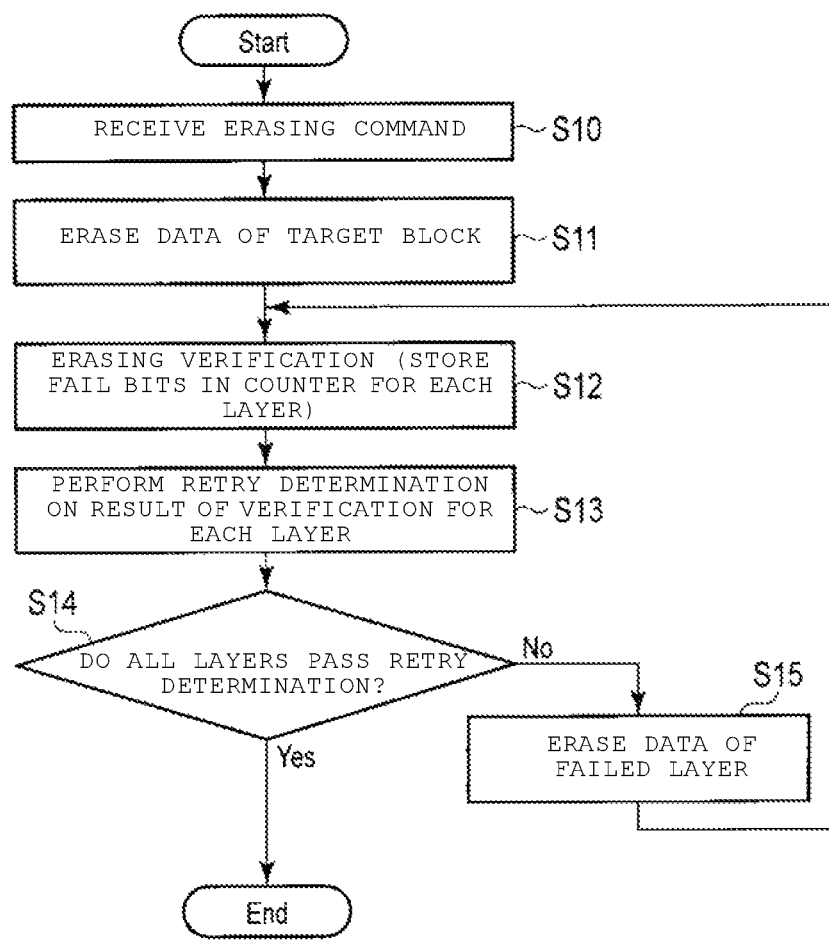
FIG. 9 is a flow chart showing a data erasing operation according to the first embodiment.

FIG. 9 is a flow chart showing a flow of a data erasing operation. As shown in the drawing, first, the control unit 121 receives an erasing command from the controller 200 (step S10).

The control unit 121 of the NAND-type flash memory 100 starts an erasing operation by receiving the command. That is, the driver 124 gives an "H" level to the control signal lines SSL1 to SSL4 which are connected in common to the memory units MU1 and MU2 being targets for erasing in accordance with the command of the control unit 121, and thus sets the column selection transistor CSG1 to CSG4 to be in an on-state. As a result, the string groups GR1-1 to GR4-1 and GR1-2 to GR4-2 are selected as erasing targets. On the other hand, the driver 124 sets control signal lines SSL of memory units MU which are not erasing targets to be in an "L" level, and thus sets the memory units MU to be in a non-selected state.

Meanwhile, the control signal lines SSL1 to SSL4 may be connected in common to the memory units MU1 and MU2, or may be independently provided. When the control signal line SSL is independently provided for each memory unit MU, the memory unit MU2 is connected to the control signal lines SSL5 to SSL8. Then, the driver 124 also gives an "H" level to the control signal lines SSL5 to SSL8.

Next, the row decoder 112 applies a voltage necessary for erasing to all of the word lines WL1 to WL4 and the selection gate lines GSL1 and GSL2. In addition, the source line driver 114 applies a voltage necessary for erasing to the source lines SL1 and SL2. The sense amplifier 113 or the driver 124 applies a voltage necessary for erasing to the bit lines BL1 to BL6 (details of the voltage will be described later in 1.2.3). Thus, data held in the memory cell transistors MT of the memory units MU1 and MU2 are erased (step S11).

Next, the control unit 121 performs erasing verification (step S12). The erasing verification is a process of reading data from the memory cell transistor MT after the erasing and determining whether the data is erased, in other words, whether a threshold value of the memory cell transistor MT is sufficiently decreased. Hereinafter, a state where it is determined that the data of the memory cell transistor MT is erased is referred to as "passing erasing verification", and a state where it is determined that data erasing has not been yet completed will be referred to as "failing in erasing verification".

The control unit 121 performs erasing verification in units of string groups GR (columns). In this embodiment, first, the control unit 121 performs the erasing verifications of the string groups GR1-1 and GR1-2. That is, the driver 124 gives an "H" level to the control signal line SSL1 in accordance with the command of the control unit 121 and gives an "L" level to the control signal lines SSL2 to SSL4. Thus, the column selection transistor CSG1 is set to be in an on-state, and the NAND strings SR1 to SR3 of the string groups GR1-1 and GR1-2 are electrically connected to the bit lines BL1 to BL6, respectively. On the other hand, the column selection transistors CSG2 to CSG4 are set to be in an off-state, and the NAND strings SR1 to SR3 of the string groups GR2-1 to GR4-1 and GR2-2 to GR4-2 are electrically separated from the bit lines BL1 to BL6.

Next, the row decoder 112 applies a voltage for erasing verification to the word lines WL1 to WL4. In addition, the row decoder 112 gives an "H" level to the selection gate lines GSL1 and GSL2 and sets the selection transistors ST1 and ST2 to be in an on-state.

Next, the sense amplifier 113 applies a precharge voltage to the bit lines BL1 to BL6. Then, the sense amplifier 113 senses and amplifies the current or voltage of the bit lines BL1 to BL6. Thus, the sense amplifier 113 reads data from all of the memory cell transistors MT of the NAND strings SR1 to SR3 of the string groups GR1-1 and GR1-2 respectively connected to the bit lines BL1 to BL6.

In the erasing verification, the sense amplifier 113 reads the data from all of the memory cell transistors MT included in the NAND string SR connected to the bit line BL by the column selection gate CSG. Accordingly, when the data erasing of all of the memory cell transistors MT of any of the NAND strings SR is completed, a current flows to the source line SL from the bit line BL corresponding to the NAND string SR. As a result, the NAND string SR passes the erasing verification. On the other hand, when at least one memory cell transistor MT which is not erased is present within any of the NAND strings SR, a current does not flow to the source line SL from the corresponding bit line BL. Accordingly, the NAND string SR fails in the erasing verification.

Next, the results of the erasing verification are counted as fail bits. That is, when the NAND string SR connected to a certain bit line BL passes erasing verification, the number of fail bits is counted as 0. When the NAND string fails in the erasing verification, the number of fail bits is counted as 1. The number of fail bits is counted separately for each layer by the counter 125. That is, the counter 125 counts the number of fail bits (herein, i=0, 1, 2, 3, . . . ) of the bit lines BL1, BL4, BL7, . . . BL (3i+1) as a result of the erasing verification of the NAND string SR1. In addition, the counter 125 counts the number of fail bits for the bit lines BL2, BL5, BL8, . . . BL (3i+2) as a result of the erasing verification of the NAND string SR2. Further, the counter 125 counts the number of fail bits for the bit lines BL3, BL6, BL9, . . . BL (3i+3) as a result of the erasing verification of the NAND string SR3.

It should be understood that, for erasing verification, it is sufficient to just monitor the bit lines BL connected to the memory unit MU to be erased. Accordingly, in this embodiment, fail bits present in the bit lines BL1 to BL6 are set as targets for counting.

Subsequently, the control unit 121 performs erasing verification on the NAND strings SR1 to SR3 of the string groups GR2-1 and GR2-2. Next, the control unit 121 performs erasing verification on the NAND strings SR1 to SR3 of the string groups GR3-1 and GR3-2. Finally, the control unit 121 performs erasing verification on the NAND strings SR1 to SR3 of the string groups GR4-1 and GR4-2. In other words, the number of times erasing verification is performed on the string groups GR is the same as the number of string groups GR included in one memory unit MU. Then, the counter 125 counts the number of fail bits for each layer.

Next, the control unit 121 performs retry determination on a result of the erasing verification for each layer (step S13). Hereinafter, an operation for determining whether "the erasing is completed" or "the erasing is not completed and thus is required to be performed again (the erasing is required to be retried)" from the results of the erasing verification is referred to as "retry determination" for each layer.

In the retry determination, the control unit 121 sums up the numbers of fail bits counted by the counter 125 for individual layers, and compares the summed-up number with the number of determination reference bits, which is a numerical value that is arbitrarily set for the retry determination. For example, the number of determination reference bits may be equal to the number of fail bits which may be corrected by the ECC circuit 260. In addition, the number of determination reference bits may be common for each layer or may be different for each layer.

When sum of the fail bits regarding any of the layers is less than the number of determination reference bits, the control unit 121 determines that the erasing of the layer is completed. On the other hand, when the sum of the fail bits regarding any of the layers is greater than the number of determination reference bits, the control unit 121 determines that the erasing of the layer is not completed.

When all of the layers pass the retry determination (step S14, Yes), the control unit 121 terminates the data erasing operation. On the other hand, when any of the layers fails in the retry determination (step S14, No), the control unit 121 performs data erasing on the layer after resetting the counter 125 (step S15). At this time, the control unit 121 does not perform data erasing on the layer passing the retry determination (does not apply an erasing voltage).

Next, returning to step S12, the control unit 121 performs erasing verification on the layer failing in the previous retry determination. Then, the counter 125 counts the number of fail bits (step S12). Further, the control unit 121 performs retry determination of a result of the erasing verification on the layer failing in the previous retry determination (step S13). Meanwhile, the control unit 121 does not perform erasing verification and retry determination on the layer passing the previous retry determination.

The control unit 121 repeatedly performs an erasing loop including the data erasing, the erasing verification, and the retry determination until all of the layers pass the retry determination (step S14, Yes) or until the number of erasing loops which is set in advance reaches an upper limit.

1.2.2 With Regard to Specific Example of Erasing Operation

Figure 10:
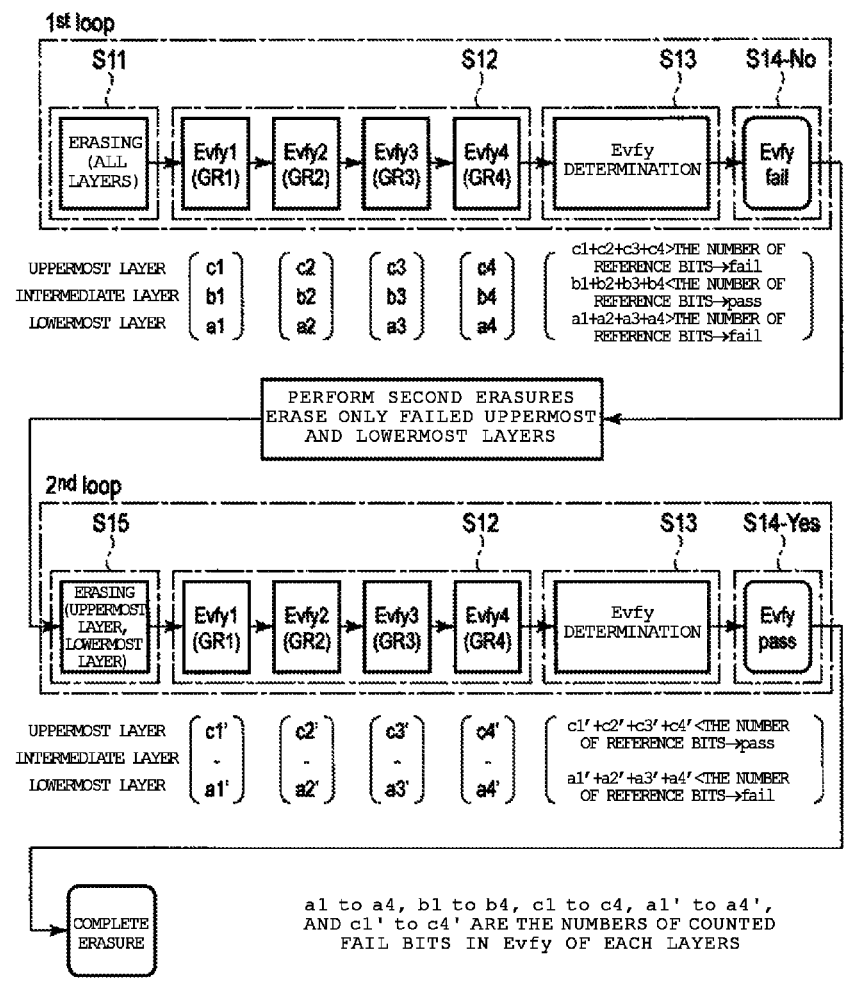
FIG. 10 is a flow chart showing a first example of the data erasing operation according to the first embodiment.

The erasing operation described in 1.2.1 mentioned above will be described below with reference to a specific example. FIG. 10 shows a flow when retry determination is passed through two erasing loops in the flow chart shown in FIG. 9, as a specific example.

As shown in the drawing, first, in the first erasing loop, the control unit 121 sets the NAND strings SR of all layers (an uppermost layer, an intermediate layer, and a lowermost layer) as targets for erasing and erases data held in the NAND strings SR (corresponding to step S11 of FIG. 9).

Next, the control unit 121 performs erasing verification in units of string groups GR (columns) (corresponding to step S12 of FIG. 9). That is, first, the control unit 121 performs erasing verification on, for example, the string group GR1 in each memory unit MU ("Evfy1" of FIG. 10). Then, the counter 125 counts the number of fail bits for each of the NAND strings SR corresponding to the respective layers. That is, the counter 125 counts the number of fail bits included in the bit lines BL1, BL4, BL7, . . . BL (3i+1) corresponding to the NAND string SR1. At this time, in this example, it is assumed that a1 fail bits are found (counted number=a1). Then, the counter 125 causes the counted number a1 to be held in any latch circuit.

Similarly, the counter 125 counts the number of fail bits included in the bit lines BL2, BL5, BL8, . . . BL (3i+2) corresponding to the NAND string SR2. At this time, in this example, it is assumed that b1 fail bits are found (counted number=b1). Then, the counter 125 causes the counted number b1 to be held in any latch circuit. The same is true of the bit lines BL3, BL6, BL9, . . . BL (3i+3) corresponding to the NAND string SR3. At this time, it is assumed that c1 fail bits are found (counted number=c1). Then, the counter 125 causes the counted number c1 to be held in any latch circuit.

Next, the control unit 121 performs erasing verification on the string group GR2 ("Evfy2" of FIG. 10). As a result, it is assumed that a2 fail bits are found with respect to the bit lines BL corresponding to the NAND string SR1 (counted number=a2). In addition, it is assumed that b2 fail bits are found with respect to the bit lines BL corresponding to the NAND string SR2 (counted number=b2) and that c2 fail bits are found with respect to the bit lines BL corresponding to the NAND string SR3 (counted number=c2). Then, the counter 125 causes the counted numbers a2, b2, and c2 to be held in any latch circuit.

Hereinafter, similarly, the control unit 121 performs erasing verification on the string groups GR3 and GR4 ("Evfy3" and "Evfy4" of FIG. 10). As a result, with respect to the bit lines BL of the lowermost layer, the intermediate layer, and the uppermost layer, it is assumed that a3, b3, and c3 fail bits are found in the string group GR3 and that a4, b4, and c4 fail bits are found in the string group GR4.

Next, the control unit 121 performs retry determination (Evfy determination) (corresponding to step S13 of FIG. 9). That is, the control unit 121 sums up a4 held in the counter 125 and a1, a2, and a3 saved in the latch circuits. A result of the summing-up is the number of defects of the NAND string SR1. In other words, a result of the summing-up is the total number of fail bits present in the bit lines BL1, BL4, BL7, . . . BL (3i+1). Then, the control unit 121 compares the total number of a1 to a4 with the number of determination reference bits. As a result, it is assumed that the relationship of (a1+a2+a3+a4)>the number of determination reference bits is established. Then, the control unit 121 determines that the NAND string SR1 fails in the retry determination.

Similarly, the control unit 121 compares the total number of b1 to b4 with the number of determination reference bits. As a result, it is assumed that the relationship of (b1+b2+b3+b4)>the number of determination reference bits is established. Then, the control unit 121 determines that the NAND string SR2 passes the retry determination. In addition, the control unit 121 compares the total number of c1 to c4 with the number of determination reference bits. As a result, it is assumed that the relationship of (c1+c2+c3+c4)>the number of determination reference bits is established. Then, the control unit 121 determines that the NAND string SR3 fails in the retry determination (step S14, No). Accordingly, the control unit 121 performs the second erasing of the NAND strings SR1 and SR3 (corresponding to step S15 of FIG. 9).

Next, the control unit 121 performs erasing verification (corresponding to step S12 of FIG. 9) and retry determination (corresponding to step S13 of FIG. 9) of the NAND strings SR1 and SR3 in the above-mentioned manner. It is assumed that the number of fail bits corresponding to the NAND string SR1 is a1' to a4' and that the number of fail bits corresponding to the NAND string SR3 is c1' to c4' in the second erasing loop. As a result, it is assumed that the relationship of (a1'+a2'+a3'+a4')<the number of determination reference bits and the relationship of (c1'+c2'+c3'+c4') <the number of determination reference bits are established. Then, the control unit 121 determines that the NAND strings SR1 and SR3 pass the second retry determination (corresponding to Yes of step S14 in FIG. 9) and terminates the data erasing operation.

Meanwhile, here, the counter 125 moves the numbers of fail bits in the respective erasing verifications (Evfy1 to Evfy4) to the latch circuit and counts the numbers individually. However, the counter may sequentially add up the numbers of fail bits counted in the respective erasing verifications (Evfy1 to Evfy4) for each layer.

As a specific example, the numbers of fail bits a1 to a4 of the NAND string SR1 will be described.

For example, when the numbers of fail bits are sequentially added up, the counter 125 adds the number of fail bits a2 of the erasing verification (Evfy2) in a state where the counter holds the number of fail bits a1 of the erasing verification (Evfy1). Accordingly, the sum of the numbers of fail bits a1 and a2 (a1+a2) is held in the counter 125 after the erasing verification (Evfy2). Next, the counter 125 adds the number of fail bits a3 in the erasing verification (Evfy3), and thus holds the total number (a1+a2+a3). Next, the counter 125 adds the number of fail bits a4 in the erasing verification (Evfy4), and thus holds the total number (a1+a2+a3+a4). Similarly, the counter 125 adds up the numbers of fail bits b1 to b4 and adds up the numbers of fail bits c1 to c4. As a result, the counter 125 holds the total numbers (a1+a2+a3+a4), (b1+b2+b3+b4), and (c1+c2+c3+c4) of the numbers of fail bits of the respective layers after the erasing verification is terminated.

1.2.3 With Regard to Erasing Voltage

Figure 11:
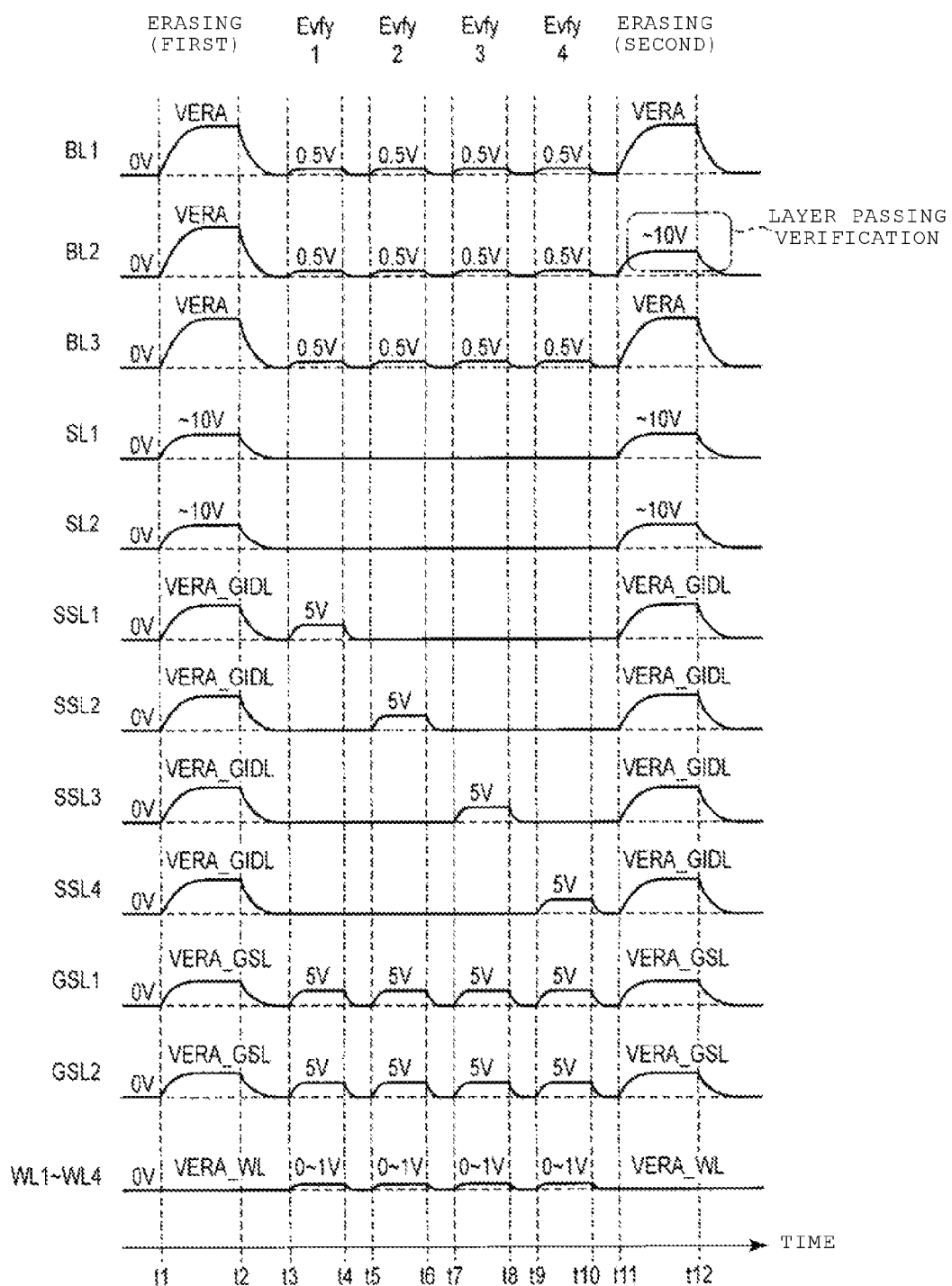
FIG. 11 is a timing chart showing potentials of wirings during the data erasing operation according to the first embodiment.

Next, a voltage relationship between wirings during a data erasing operation will be described. FIG. 11 is a timing chart showing potentials of wirings in the first erasing operation, the erasing verifications (Evfy1 to Evfy4) thereof, and the second erasing in the flow chart shown in FIG. 10. Meanwhile, here, only a wiring regarding the memory unit MU1 is described, but the same description applies to other memory units MU that are erasing targets. For example, with respect to a voltage of a wiring regarding the memory unit MU2, the bit lines BL1 to BL3 may be interchangeable with the bit lines BL4 to BL6 in the following description.

First, in the first erasing (time t1 to t2), the driver 124 applies a voltage VERA (for example, 20V) to the bit lines BL1 to BL3 and applies a voltage VERA_GIDL (for example, 12V) to the control signal lines SSL1 to SSL4. Here, VERA and VERA_GIDL are voltages for causing gate induced drain leakage (GIDL) in a transistor during data erasing. Here, VERA is a high voltage applied to the source or drain of the transistor, and VERA_GIDL is a voltage applied to the gate of the transistor. In addition, VERA is a voltage higher than VERA_GIDL.

Thus, GIDL occurs in the gate terminals of the column selection transistors CSG1 to CSG4. In this embodiment, a case where GIDL occurs in the column selection transistor CSG on the bit line side and does not occur in the column selection transistor CSG on the source line side will be described as an example.

In this state, the row decoder 112 applies a voltage VERA_GSL (for example, approximately 10 V) to the selection gate lines GSL1 and GSL2. Here, VERA_GSL is a voltage for setting the selection transistors ST1 and ST2 to be in an on-state. In addition, VERA_GSL is a voltage for enabling holes generated due to GIDL to be transferred to the selection transistors ST1 and ST2 and may be, for example, equal to or less than (VERA−Vt). However, Vt is a threshold voltage of the column selection transistor CSG. More preferably, VERA_GSL may be a voltage of approximately 10 V.

In addition, the source line driver 114 applies a voltage that does not cause GIDL, for example, the same potential (for example, approximately 10 V) as that of VERA_GSL to the source lines SL1 and SL2. Further, the row decoder 112 applies a voltage VERA_WL (for example, 0 V) to the word lines WL1 to WL4. Here, VERA_WL is a voltage applied to the word line WL during data erasing. In addition, VERA_WL is set to a voltage which is sufficiently lower than a voltage (that is, VERA) of the semiconductor layer 23 so that holes generated due to GIDL are injected into the charge storage layer 26 of the memory cell transistor MT. Thus, the holes generated due to GIDL are supplied to the charge storage layers 26 of the memory cell transistors MT1 to MT4 connected to the word lines WL1 to WL4, and data is erased. Meanwhile, in an unselected memory unit MU, the bit line BL is set to have a potential that does not cause GIDL, and the control signal line SSL is set to be in an "L" level, and thus it is possible to exclude the unselected memory unit from an erasing target.

Next, the control unit 121 performs the erasing verification (Evfy1) of the string group GR1-1 (time t3 to t4). That is, the sense amplifier 113 applies a precharge voltage (for example, 0.5 V) to the bit lines BL1 to BL3. In addition, the source line driver 114 applies a voltage (for example, 0 V) which is lower than that of the bit line BL to the source lines SL1 and SL2. Then, the driver 124 sets the column selection transistor CSG1 to be in an on-state, and thus applies a voltage (for example, approximately 5 V) which is higher than that of the bit line BL to the control signal line SSL1. Further, the driver 124 sets the column selection transistors CSG2 to CSG4 to be in an off-state, and thus applies, for example, 0 V which is the same potential as that of the source line SL to the control signal lines SSL2 to SSL4. In addition, the row decoder 112 sets the selection transistors ST1 and ST2 to be in an on-state, and thus applies a voltage (for example, approximately 5 V) which is higher than that of the bit line BL to the selection gate lines GSL1 and GSL2. As a result, the string group GR1-1 is selected.

In this state, the row decoder 112 further applies a verification voltage (for example, 0 V to 1 V) to all of the word lines WL1 to WL4. Thus, for example, in the NAND strings SR1 to SR3, when all of the memory cell transistors MT1 to MT4 included in each of the NAND strings are in an on-state (state where the data erasing is completed), a current flows to the source line SL1 through current paths of the NAND strings SR1 to SR3 from the bit lines BL1 to BL3. On the other hand, in the NAND strings SR, when at least one memory cell transistor MT is in an off-state (state where the data erasing is not completed), a current does not flow.

Subsequently, the control unit 121 sequentially performs the erasing verifications (Evfy2 to Evfy4) of the string groups SR2-1, SR3-1, and SR4-1 (time t5 to t6, time t7 to t8, and time t9 to t10). When the string group GR2-1 is selected, the driver 124 applies, for example, approximately 5 V to the control signal line SSL2 and applies, for example, 0 V to the control signal lines SSL1, SSL3, and SSL4. Thus, the driver 124 sets the column selection transistor CSG2 in an on-state and sets the column selection transistors CSG1, CSG3, and CSG4 to be in an off-state. When the string group GR3-1 is selected, the driver 124 applies, for example, approximately 5 V to the control signal line SSL3 and applies, for example, 0 V to the control signal lines SSL1, SSL2, and SSL4. Thus, the driver 124 sets the column selection transistor CSG3 to be in an on-state and sets the column selection transistor CSG1, CSG2, CSG4 to be in an off-state. When the string group GR4-1 is selected, the driver 124 applies, for example, approximately 5 V to the control signal line SSL4 and applies, for example, 0 V to the control signal lines SSL1 to SSL3. Thus, the driver 124 sets the column selection transistor CSG4 to be in an on-state and sets the column selection transistors CSG1 to CSG3 to be in an off-state. In this manner, the string group GR is selected by the control signal line SSL.

Then, the control unit 121 performs the second erasing after the retry determination (time t11 to t12). The second erasing is different from the first erasing in that, for example, the sense amplifier 113 applies a voltage, which is lower than VERA and does not cause GIDL, for example, a voltage (approximately 10 V) having the same potential as that of VERA_GSL to the bit line BL2 corresponding to the intermediate layer that has passed the retry determination. Thus, GIDL does not occur in the column selection transistor CSG connected to the bit line BL2.

In addition, in this embodiment, the verification is performed from the string group GR1-1, but may be performed for any of the string groups GR.

Further, in this embodiment, although the sense amplifier 113 applies a voltage that does not cause GIDL to the bit line BL2, the driver 124 may apply a voltage that does not cause GIDL. In addition, the voltage applied to the bit line BL2 is not particularly limited as long as the voltage does not cause GIDL.

Figure 12:
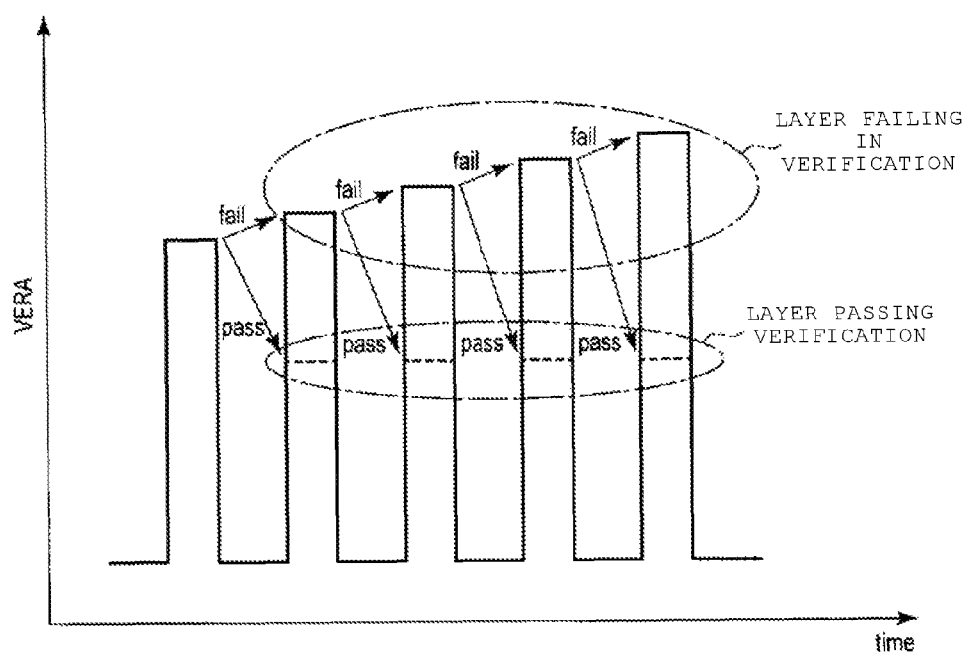
FIG. 12 is a timing chart showing changes in a potential of VERA in a data erasing loop according to the first embodiment.

FIG. 12 is a graph showing a relationship between the number of erasing loops and VERA. As shown in the drawing, for example, the value of VERA is stepped up whenever an erasing loop is repeated. Meanwhile, in the NAND string SR of a layer that has passed retry determination, a voltage (for example, approximately 10 V) which does not cause GIDL is applied from the next erasing loop, instead of VERA. For example, the voltage may be always constant unlike VERA or may be stepped up similar to VERA.

1.3 With Regard to Effects According to this Embodiment

In the configuration according to this embodiment, it is possible to improve the reliability of a data erasing operation. The effects thereof will be described below.

A three-dimensional stacked memory in which memory cell transistors MT are stacked on a semiconductor substrate is known. In such a memory, the size of the memory cell transistor MT may vary depending on a layer formed. For example, when the fin type structure 24 has the shape shown in FIG. 6, the memory cell transistor MT located at a higher layer has a larger gate length. In addition, for example, when the word line WL has a tapered shape as shown in FIG. 8, the memory cell transistor MT located at a higher layer has a smaller gate width. In this manner, when the sizes thereof are different from each other, the erasing characteristics may different form each other between the layers accordingly.

The reason is as follows. In the erasing of the memory cell transistor MT, an electric field concentrates on the corner of the gate. At this time, when the gate length or the gate width is reduced, both ends of the gate, that is, locations having a tendency to concentrate an electric field become closer to each other. Thus, data is more likely to be erased. Accordingly, for example, when the fin type structure 24 has the shape shown in FIG. 6, the memory cell transistor MT has a larger gate length as the memory cell transistor is located at a higher layer, and thus the erasing is not likely to be performed (erasing speed is reduced). In addition, for example, when the word line WL has a tapered shape as shown in FIG. 8, a gate width decreases as the memory cell transistor MT is located at a higher layer, and thus data is more likely to be erased (erasing speed is increased).

Consequently, in the configuration according to this embodiment, retry determination is performed for each layer with a focus on the difference in erasing characteristics. More specifically, the number of fail bits of erasing verification is counted for each layer. Comparison between the number of fail bits of the erasing verification and the number of determination reference bits is performed for each layer. Thus, it is possible to distinguish between a layer which is easily erased and a layer which is difficult to erase. In addition, an erasing voltage is not applied to the layer passing the retry determination in the subsequent erasing loop.

Accordingly, even when the erasing speed varies, a layer that passes the retry determination early is not exposed to stress of the erasing voltage again. Accordingly, it is possible to suppress damage to the memory cell transistor MT and to improve the reliability of the erasing operation.

2. Second Embodiment

Next, a semiconductor memory device and a data erasing method according to a second embodiment will be described. In this embodiment, data is erased by causing GIDL in the selection transistor ST2 on the source line side in the first embodiment described above. Hereinafter, only differences from the first embodiment will be described.

2.1 with Regard to Configuration of Memory Cell Array

Figure 13:
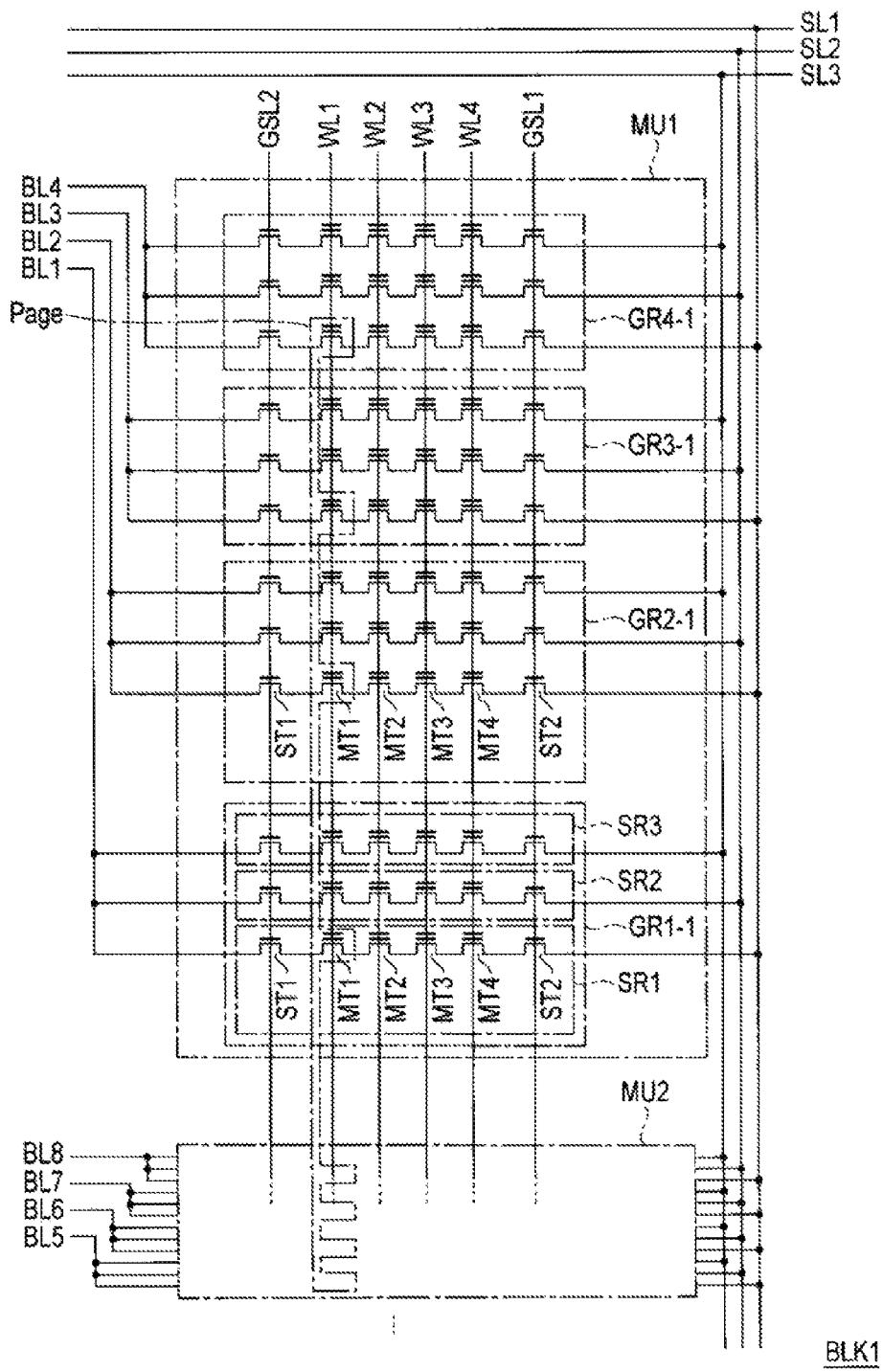
FIG. 13 is a circuit diagram of a memory cell array according to a second embodiment.

FIG. 13 is a circuit diagram of a memory cell array 111 according to the second embodiment and shows the configuration of the inside of any one block. As shown in the drawing, the memory cell array 111 according to this embodiment is configured such that the NAND strings SR1 to SR3 within the same string group GR in FIG. 3 described in the first embodiment share bit lines BL, and, on the other hand, source lines SL are independently provided.

For example, when focusing on a memory unit MU1, the drain terminals of NAND strings SR1 to SR3 of a string group GR1-1 are connected in common to a bit line BL1, and the source terminals thereof are connected to source lines SL1 to SL3, respectively. In addition, the drain terminals of NAND strings SR1 to SR3 of a string group GR2-1 are connected in common to a bit line BL2, and the source terminals thereof are connected to the source lines SL1 to SL3, respectively. Further, the drain terminals of NAND strings SR1 to SR3 of a string group GR3-1 are connected in common to a bit line BL3, and the source terminals thereof are connected to the source lines SL1 to SL3, respectively. Similarly, the drain terminals of NAND strings SR1 to SR3 of a string group GR4-1 are connected in common to a bit line BL4, and the source terminals thereof are connected to the source lines SL1 to SL3, respectively.

The same is true of a memory unit MU2. The drain terminals of string groups GR1-2 to GR4-2 are connected to bit lines BL5 to BL8, respectively. On the other hand, the source terminals of the NAND strings SR1 to SR3 of the string groups GR1-2 to GR4-2 are connected to the source lines SL1 to SL3, respectively.

Accordingly, in this embodiment, the NAND strings SR1 to SR3 may be selected by the source lines SL1 to SL3. In addition, the number of bit lines BL corresponding to each memory unit MU corresponds to the total number of string groups GR included in one memory unit MU.

Further, in this embodiment, the gates of the selection transistors ST1 are connected in common to a selection gate line GSL2, the gates of the selection transistors ST2 are connected in common to a selection gate line GSL1.

In the above-mentioned configuration, a group of a plurality of memory cell transistors MT connected to the same word line WL in one NAND string SR selected from each string group GR of each memory unit MU is set as a unit referred to as a "page". For example, in FIG. 13, when the source line SL1 and the word line WL1 are selected as an example, one page is formed by the memory cell transistors MT1 connected to the word line WL1 in the respective NAND strings SR1 of four string groups GR1-1 to GR4-1 of the memory unit MU1 and four string groups GR1-2 to GR4-2 of the memory unit MU2. In addition, eight memory cell transistors MT1 included in the page are connected to the bit lines BL1 to BL8, respectively. When three memory units MU are provided, memory cell transistors MT1 in the respective NAND strings SR1 of four string groups GR1-3 to GR4-3 of a memory unit MU3 are included in the page. This is the same as in a case where other source lines SL or word lines WL are selected.

Figure 14:
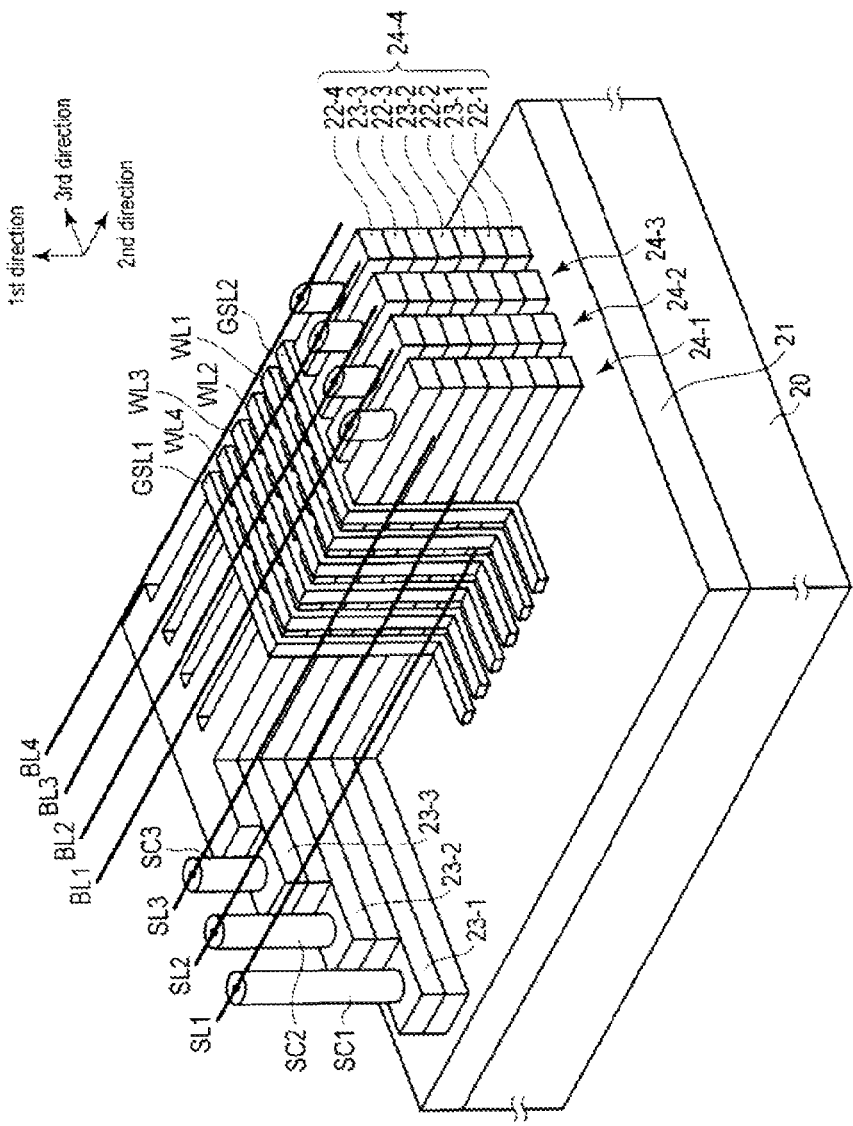
FIG. 14 is a perspective view of the memory cell array according to the second embodiment.
Figure 15:
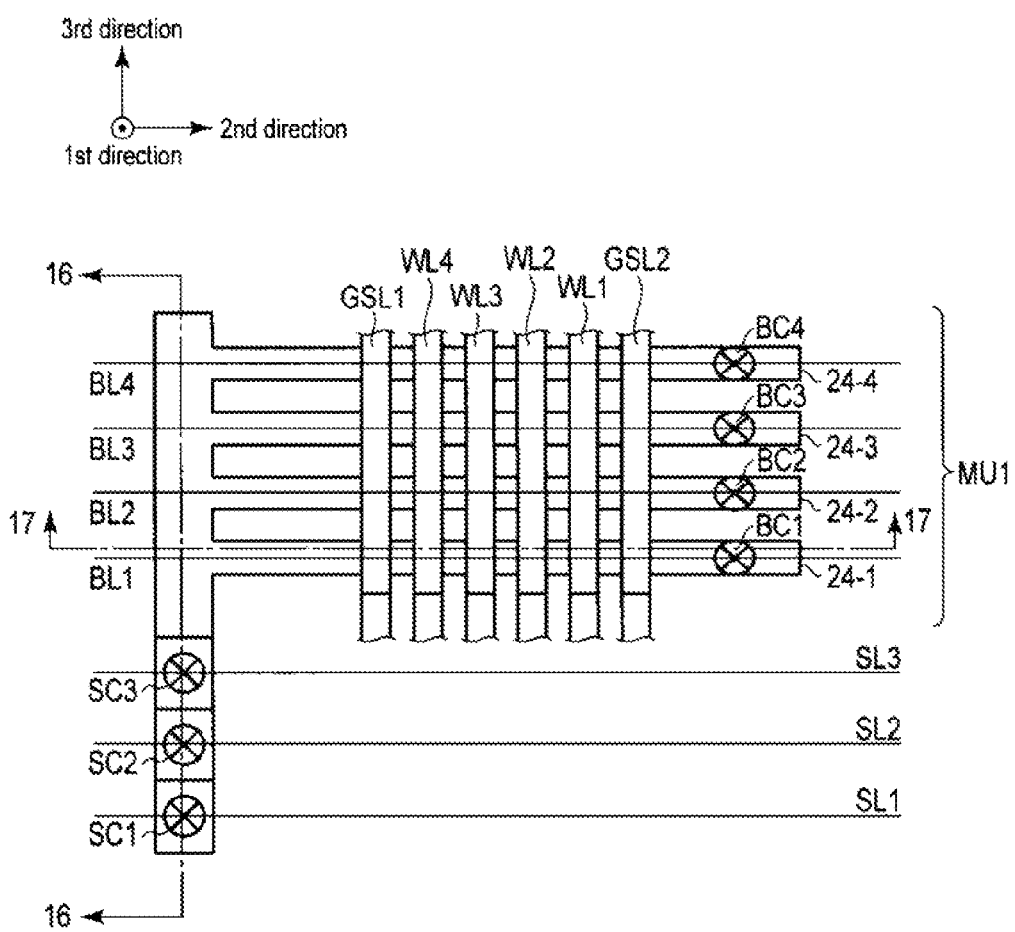
FIG. 15 is a plan view of the memory cell array according to the second embodiment.
Figure 16:
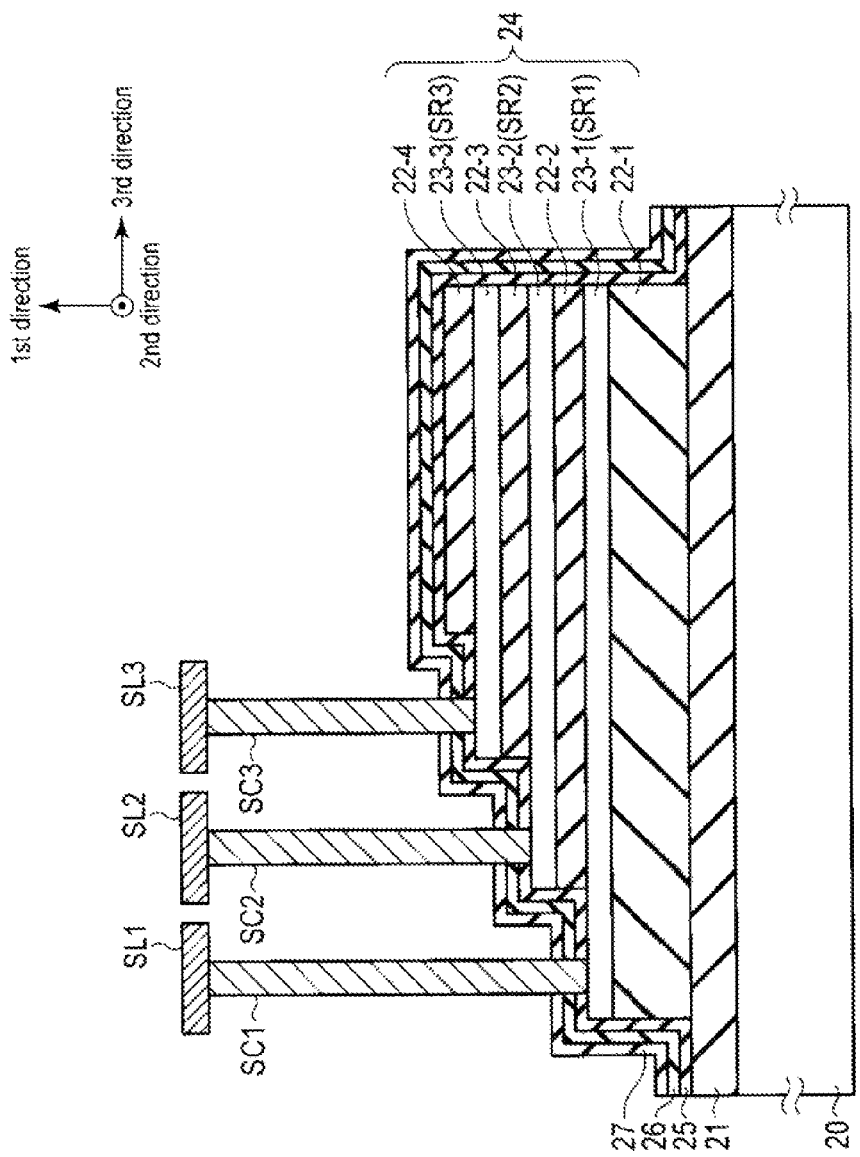
FIG. 16 is a cross-sectional view taken along line 16-16 in FIG. 15.
Figure 17:
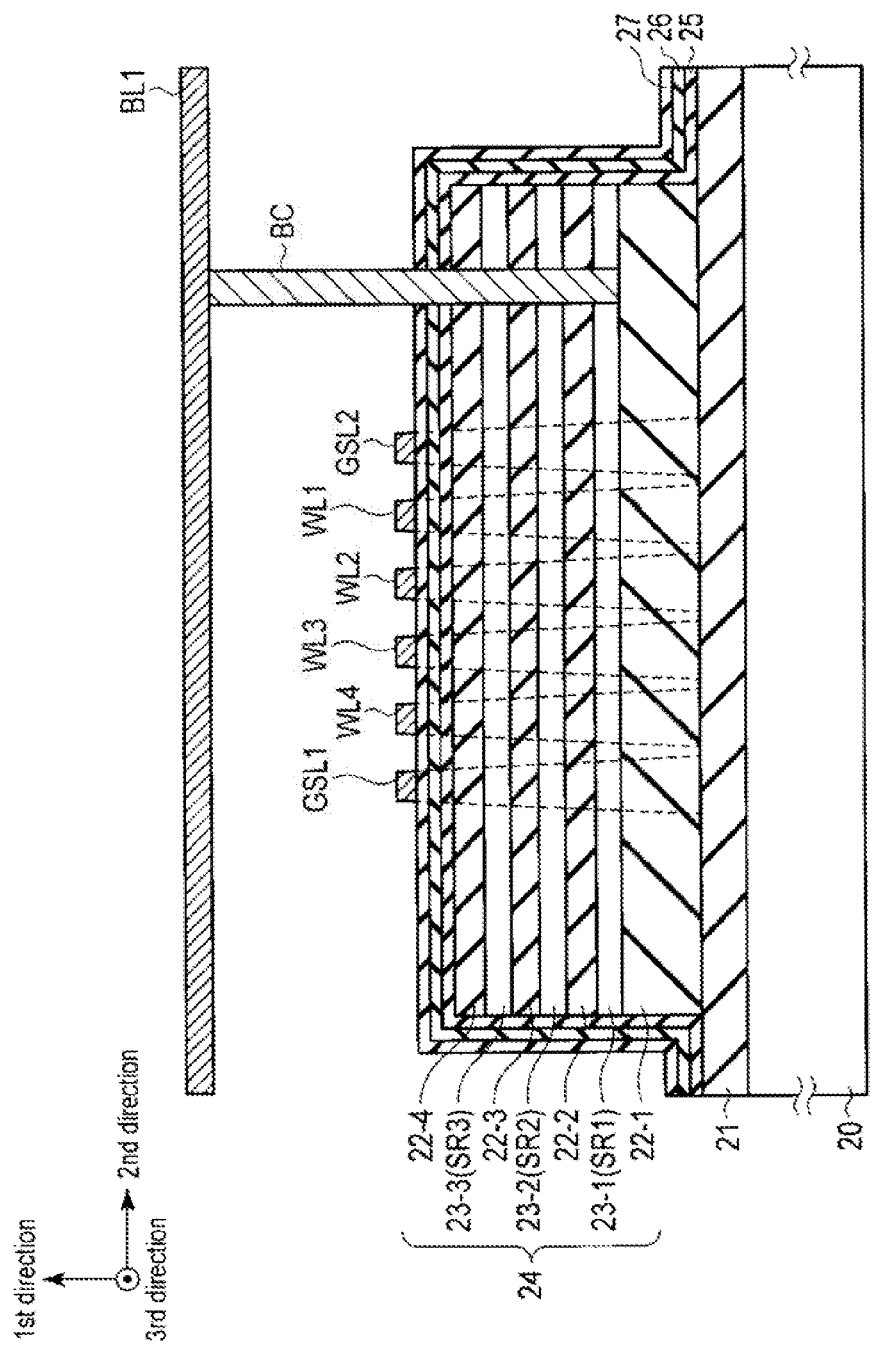
FIG. 17 is a cross-sectional view taken along line 17-17 in FIG. 15.

FIG. 14 is a perspective view of the memory unit MU, FIG. 15 is a plan view of the memory unit MU, FIG. 16 is a cross-sectional view taken along line 16-16 in FIG. 15, and FIG. 17 is a cross-sectional view taken along line 17-17 in FIG. 15.

As shown in FIGS. 14 and 15, this embodiment is configured such that one end of each of the plurality of fin type structures 24 is extracted to an end of the memory cell array 111 in the configuration described in the first embodiment and is connected to each bit line BL in the extracted region and that the other end thereof is commonly connected and is connected to the respective source lines SL.

More specifically, in each of the fin type structures 24-1 to 24-4, each of contact plugs BC1 to BC4 passing through and coming into contact with the respective semiconductor layers 23-1 to 23-3 is formed on one end side thereof. The bit lines BL1 to BL4 are connected to the bit line contact plugs BC1 to BC4, respectively (see FIG. 17).

On the other hand, in each of the fin type structures 24-1 to 24-4, the semiconductor layers 23-1 to 23-3 are extracted stepwise in the other ends thereof. In addition, the respective source line contact plugs SC1 to SC3 are formed on the respective semiconductor layers 23-1 to 23-3 and are connected to the source lines SL1 to SL3, respectively (see FIG. 16).

That is, in the configuration according to this example, the respective layers are connected in common to the bit line BL, and the source line SL is independently provided for each layer. In this example, the control signal line SSL in the first embodiment is removed. However, the control signal line SSL may be provided in this embodiment.

2.2 With Regard to Data Erasing Operation

Next, a data erasing operation according to this embodiment will be described. Hereinafter, only differences from the first embodiment will be described.

2.2.1 With Regard to Overall Flow of Data Erasing Operation

A general flow of an erasing operation according to this embodiment is the same as that in FIG. 9 of the first embodiment. This embodiment is different from the first embodiment in that a layer (NAND string SR) performing a verifying operation is selected using a voltage applied to the source line SL. Accordingly, unlike the first embodiment, the control unit 121 performs erasing verification (step S12 and step S16) in units of layers (NAND strings SR).

Figure 18:
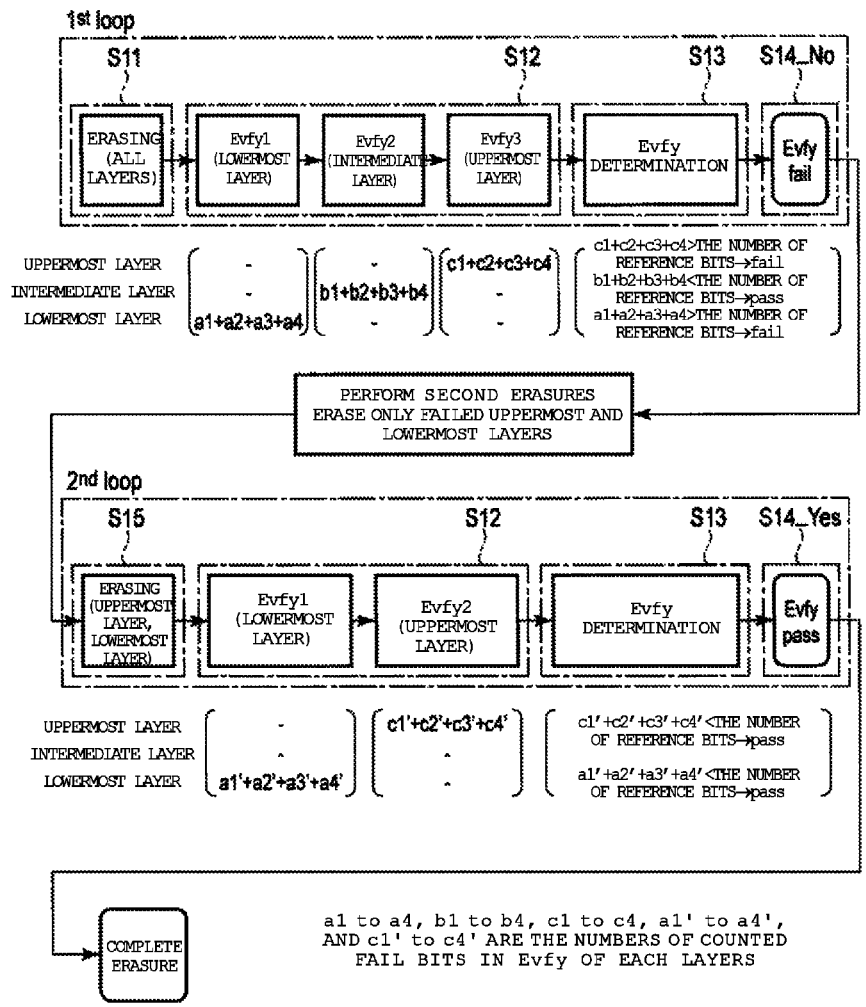
FIG. 18 is a flow chart showing an example of a data erasing operation according to the second embodiment.

FIG. 18 shows a flow in a case where retry determination is passed through two erasing operations as a specific example. As shown in the drawing, first, in the first erasing loop, the NAND strings SR1 to SR3 of all layers (a lowermost layer, an intermediate layer, and an uppermost layer) are set as erasing targets, and data held in the NAND strings SR is erased (step S11).

Next, the control unit 121 performs erasing verification in units of NAND strings SR (layers) (step S12). That is, the control unit 121 performs erasing verification on the NAND strings SR1 to SR3 in each memory unit MU.

First, the control unit 121 performs erasing verification on the NAND string SR1 in each memory unit MU (Evfy1). At this time, all bit lines BL in a block BLK being a target for erasing are selected. However, a source line driver selects the source line SL1 and does not select the source lines SL2 and SL3. Thus, in each string group GR, the NAND string SR1 is set to be in a selection state and the other NAND strings SR2 and SR3 are set to be in a non-selection state. In addition, the counter 125 counts the number of fail bits. Specifically, it is assumed that a1 fail bits are found with respect to bit lines BL1, BL5, BL9, . . . BL (4i+1) corresponding to a string group GR1 (counted number=a1). It is assumed that a2 fail bits are found with respect to bit lines BL2, BL6, BL10, . . . BL (4i+2) corresponding to a string group GR2 (counted number=a2). It is assumed that a3 fail bits are found with respect to bit lines BL3, BL7, BL11, . . . BL (4i+3) corresponding to a string group GR3 (counted number=a3). It is assumed that a4 fail bits are found with respect to bit lines BL4, BL8, BL12, . . . BL (4i+4) corresponding to a string group GR4 (counted number=a4).

Here, when the numbers of fail bits a1 to a4 are summed up, the result thereof is the sum of fail bits of the NAND strings SR1 located at the respective lowermost layers of all of the string groups GR. Accordingly, the counter 125 sums up the counted numbers a1 to a4 and causes the sum (a1+a2+a3+a4) to be held in, for example, any latch circuit.

Subsequently, the control unit 121 performs erasing verification on the NAND string SR2 (Evfy2). At this time, the source line SL2 is selected and the source lines SL1 and SL3 are not selected. In addition, it is assumed that the numbers of fail bits corresponding to the NAND strings SR2 located at the respective intermediate layers of the string groups GR1 to GR4 are b1 to b4. Then, the counter 125 sums up the counted numbers b1 to b4 and causes the sum (b1+b2+b3+b4) to be held in, for example, any latch circuit.

Next, the control unit 121 performs erasing verification on the NAND string SR3 (Evfy3). At this time, the source line SL3 is selected and the source lines SL1 and SL2 are not selected. In addition, it is assumed that the numbers of fail bits corresponding to the NAND strings SR3 located at the respective uppermost layers of the string groups GR1 to GR4 are c1 to c4. Then, the counter 125 sums up the counted numbers c1 to c4 and causes the sum (c1+c2+c3+c4) to be held in, for example, any latch circuit.

Next, the control unit 121 performs retry determination (Evfy determination) (step S13). The control unit 121 compares the sum of the numbers of fail bits of the respective layers with the number of determination reference bits. As a result, it is assumed that the relationship of (a1+a2+a3+a4)>the number of determination reference bits is established, the relationship of (b1+b2+b3+b4)<the number of determination reference bits is established, and the relationship of (c1+c2+c3+c4)>the number of determination reference bits is established. Then, the control unit 121 determines that the NAND string SR2 passes retry determination and that the NAND strings SR1 and SR3 fail in retry determination (step S14, No). Accordingly, the control unit 121 performs the second erasing on the NAND strings SR1 and SR3 failing in the retry determination (step S15). At this time, the NAND string SR2 is set as a non-target for erasing.

Next, the control unit 121 performs the erasing verification (step S12) of the NAND strings SR1 and SR3. In the second erasing loop or the subsequent erasing loops, the erasing verification is performed only on layers failing in the retry determination, and thus the number of times of erasing verification depends on the number of layers failing in the retry determination. Specifically, in the flow chart shown in FIG. 18, the control unit 121 performs three erasing verifications (Evfy1 to Evfy3), and the uppermost layer in the first erasing loop, but performs two erasing verifications (Evfy1 and Evfy2) in the second erasing loop.

Next, the control unit 121 performs the retry determination (step S13) of the NAND strings SR1 and SR3. It is assumed that the numbers of fail bits corresponding to the NAND strings SR1 are a1' to a4' and the numbers of fail bits corresponding to the NAND strings SR3 are c1' to c4' in the second erasing loop. Then, the control unit 121 compares the sum of the numbers of fail bits of the lowermost and uppermost layers with the number of determination reference bits. As a result, it is assumed that the relationship of (a1'+a2'+a3'+a4')<the number of determination reference bits and the relationship of (c1'+c2'+c3'+c4')<the number of determination reference bits are established. Then, the control unit 121 determines that the NAND strings SR1 and SR3 pass the second retry determination and terminates the data erasing operation.

Meanwhile, in this embodiment, the retry determination of each of the layers is performed after the erasing verifications of all of the layers. However, whenever the erasing verification of one layer is terminated, the retry determination of the layer may be performed. That is, the control unit 121 may perform the retry determination of the lowermost layer after the erasing verification of the lowermost layer, may perform the retry determination of the intermediate layer after the erasing verification of the intermediate layer, and may perform the retry determination of the uppermost layer after the erasing verification of the uppermost layer.

2.2.2 with Regard to Erasing Voltage

Figure 19:
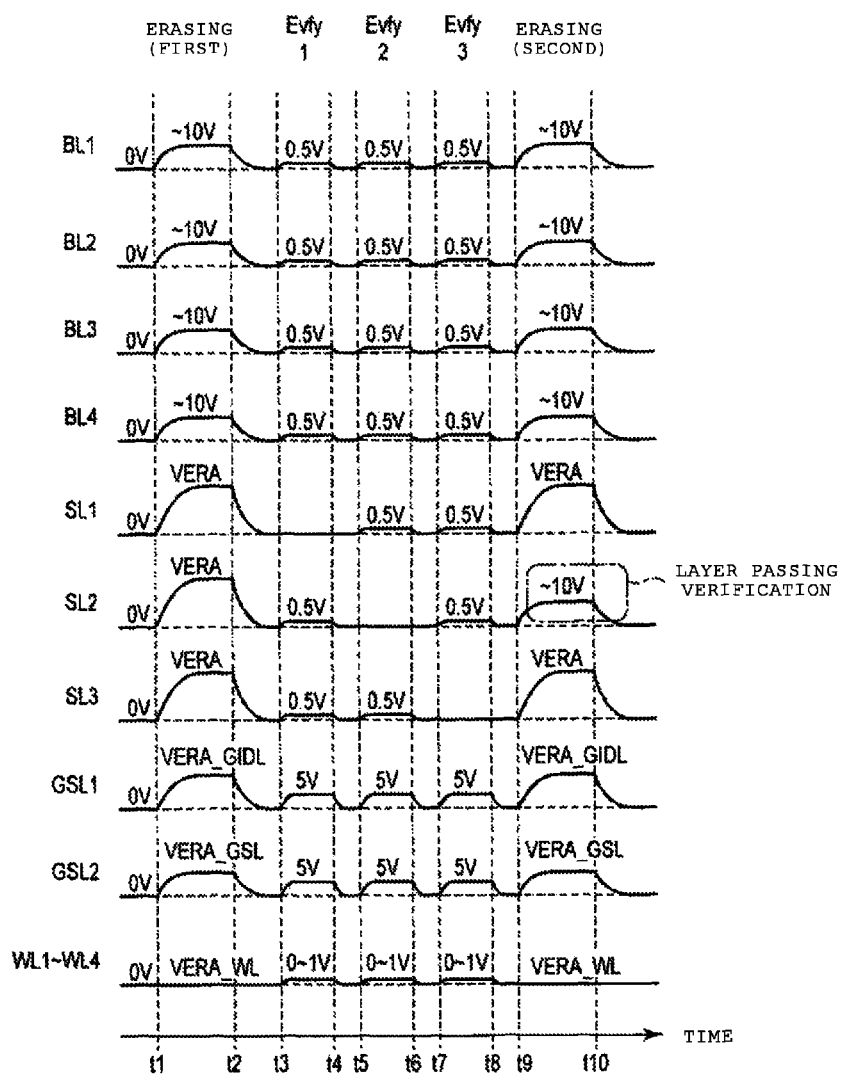
FIG. 19 is a timing chart showing potentials of wirings during the data erasing operation according to the second embodiment.

Next, a voltage relationship between wirings during a data erasing operation will be described. FIG. 19 is a timing chart showing potentials of wirings in the first erasing operation, the erasing verifications (Evfy1 to Evfy3) thereof, and the second erasing in the flow chart shown in FIG. 18. Meanwhile, here, only a wiring regarding the memory unit MU1 is described, but the same description applies to other memory units MU that are erasing targets. For example, with respect to a voltage of a wiring regarding the memory unit MU2, the bit lines BL1 to BL4 may be reread as the bit lines BL5 to BL8 in the following description.

First, in the first erasing (time t1 to t2), a driver 124 applies VERA (for example, 20 V) to the source lines SL1 to SL3. A row decoder 112 applies a voltage VERA_GIDL (for example, 12 V) to the selection gate line GSL1. Thus, in the selection transistor ST2, GIDL occurs in the gate terminal thereof.

In addition, the row decoder 112 applies a voltage VER-A_GSL (for example, approximately 10 V) to the selection gate line GSL2. A sense amplifier 113 applies a voltage that does not cause GIDL, for example, the same potential (for example, approximately 10 V) as that of selection gate line GSL2 to the bit lines BL1 to BL4. Accordingly, in this embodiment, GIDL occurs in the selection transistor ST2 on the source line side and does not occur in the selection transistor ST1 on the bit line side.

Further, the row decoder 112 applies a voltage VER-A_WL (for example, 0 V) to the word lines WL1 to WL4. Thus, holes generated in the selection transistor ST2 due to GIDL are supplied to the memory cell transistors MT1 to MT4 connected to the word lines WL1 to WL4, and thus data is erased.

Meanwhile, in this embodiment, although the driver 124 applies VERA to the source line SL, the source line driver 114 may apply VERA. Although the sense amplifier 113 applies a voltage that does not cause GIDL in the bit lines BL1 to BL4, the driver 124 may apply the voltage. In an unselected memory unit MU, the source line SL is set to have a voltage that does not cause a floating state or GIDL, and thus it is possible to exclude the memory unit MU from a target for erasing.

Next, the control unit 121 performs the erasing verification (Evfy1) of the NAND strings SR1 located at the respective lowermost layers of the string groups GR1-1 to GR4-1 (time t3 to t4). That is, the sense amplifier 113 applies, for example, 0.5 V to the bit lines BL1 to BL4. In addition, the source line driver 114 applies a voltage (for example, 0 V) which is lower than that of the bit line BL to the source line SL1 corresponding to the NAND string SR1 to be subjected to erasing verification (sets a selection state). The row decoder 112 sets the selection transistors ST1 and ST2 to be in an on-state, and thus applies a voltage (for example, 5 V) which is higher than that of the bit line BL to the selection gate lines GSL1 and GSL2. In addition, the source line driver 114 applies the same potential (for example, 0.5 V) as that of the bit line BL to the source lines SL2 and SL3 corresponding to the NAND strings SR2 and SR3 which are not targets for erasing verification (sets a non-selection state).

Further, the row decoder 112 applies a verification voltage (for example, 0 to 1 V) to all of the word lines WL1 to WL4. Thus, for example, in the NAND strings SR1 of the string groups GR1-1 to GR4-1, when all of the memory cell transistors MT1 to MT4 included in each NAND string are in an on-state, a current flows to the source line SL1 through current paths of the respective NAND strings SR1 from the bit lines BL1 to BL4. On the other hand, in the NAND strings SR1, when at least one memory cell transistor MT is in an off-state, a current does not flow. At this time, the source lines SL2 and SL3 in a non-selected state have the same potential as that of the bit line BL, and thus a current does not flow regardless of the on- or off-state of the memory cell transistor MT.

Subsequently, the control unit 121 sequentially performs the erasing verifications (Evfy2 and Evfy3) of the respective NAND strings SR2 and SR3 (time t5 to t6 and time t7 to t8). When the NAND string SR2 is selected, the source line driver 114 applies a voltage (for example, 0 V) which is lower than that of the bit line BL to the source line SL2 and applies the same potential (for example, 0.5 V) as that of the bit line BL to the source lines SL1 and SL3. In addition, when the NAND string SR3 is selected, the source line driver 114 applies a voltage (for example, 0 V) which is lower than that of the bit line BL to the source line SL3 and applies the same potential (for example, 0.5 V) as that of the bit line BL to the source lines SL1 and SL2. In this manner, the NAND string SR is selected using the voltage of the source line SL. Meanwhile, in this embodiment, the erasing verification is performed from the NAND string SR1, but may be performed from any of the NAND strings SR.

After the retry determination, the second erasing is performed (time t9 to t10). The second erasing is different from the first erasing in that, for example, the source line driver 114 applies a voltage (for example, a voltage (for example, approximately 10 V) which has the same potential as that of VERA_GSL) which does not cause GIDL to the source line SL2 corresponding to the intermediate layer passing the retry determination. Thus, GIDL does not occur in the selection transistor ST2 connected to the source line SL2. Meanwhile, here, a voltage having the same potential as that of the bit line BL is applied to the source line SL2, but the voltage applied may be a voltage that does not cause GIDL.

2.3 Effects According to this Embodiment

In the configuration according to this embodiment, it is possible to erase data of the memory cell transistor MT by applying a voltage VERA from the source line SL. In addition, it is possible to select the NAND string SR being a target for erasing for each layer by selecting the source line SL. Accordingly, in the configuration according to this embodiment, the same effects as those in the first embodiment described above are obtained.

Further, in the configuration according to this embodiment, the erasing verification is performed for each layer. However, in the second erasing loop and the subsequent erasing loops, it is possible to omit the erasing verification of a layer that has passed the retry determination. Accordingly, in the second erasing loop and the subsequent erasing loops, it is possible to reduce the number of times of erasing verification in accordance with the number of layers passing the retry determination. Therefore, it is possible to shorten a processing time during an erasing operation.

Further, in the configuration according to this embodiment, the erasing verification is performed for each layer. Thus, when the number of layers is smaller than the number of string groups, it is possible to reduce the number of times of erasing verification as compared with a case where the erasing verification is performed for each string group. Accordingly, it is possible to shorten a processing time during an erasing operation.

Further, in this embodiment, it is possible to count all fail bits in the layers through one erasing verification. Accordingly, since one erasing verification may be processed using one counter, it is possible to reduce the number of required counters.

Further, in the configuration according to this embodiment, it is possible to remove a column selection transistor. Thus, it is possible to reduce the number of circuit elements and to reduce a chip area.

3. Third Embodiment

Next, a semiconductor memory device and a data erasing method according to a third embodiment will be described. In this embodiment, data is erased using a FN tunnel effect instead of GIDL in the second embodiment. Hereinafter, only differences from the second embodiment will be described.

3.1 With Regard to Configuration of Memory Cell Array

Similarly to the second embodiment, a memory cell array according to this embodiment is configured such that a layer is selected using a source line SL. The circuit diagram thereof is as shown in FIG. 13, the perspective view thereof is as shown in FIG. 14, and the plan view thereof is as shown in FIG. 15.

Figure 20:
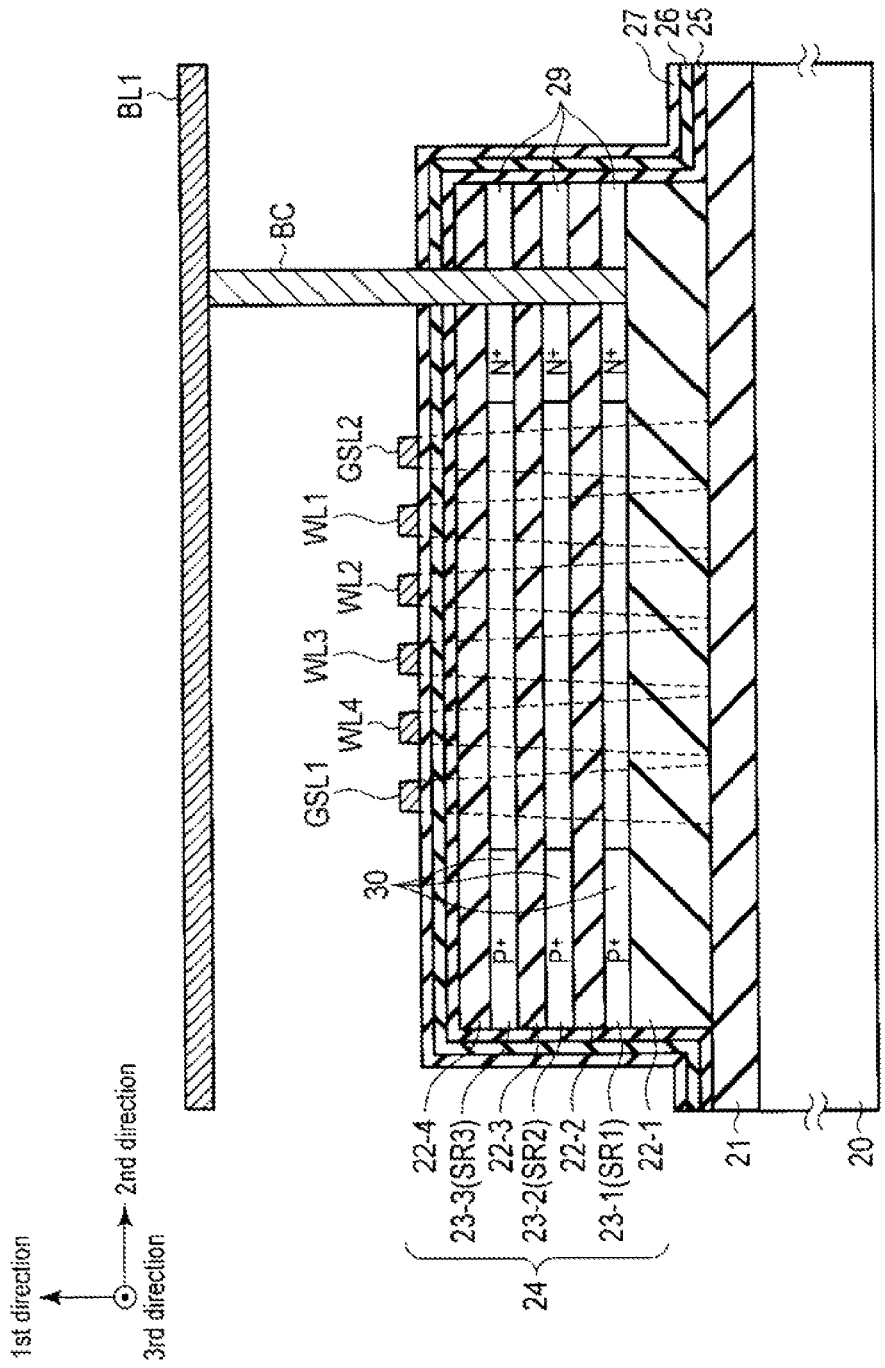
FIG. 20 is a cross-sectional view of a memory cell array according to a third embodiment.

FIG. 20 is a cross-sectional view along a second direction (along 17-17 of FIG. 15) of a memory cell array 111 according to this embodiment. As shown in the drawing, in the configuration of the memory cell array 111 according to this embodiment, an N+-type diffusion layer 29 and a P+-type diffusion layer 30 are formed within the semiconductor layers 23-1 to 23-3 in FIG. 17 described in the second embodiment. More specifically, the N+-type diffusion layer 29 functions as a drain region of a selection transistor ST1. A bit line contact BC is provided to pass through the N+-type diffusion layer 29 and to come into contact with the N+-type diffusion layer 29. On the other hand, the P+-type diffusion layer 30 functions as a source region of the selection transistor ST2. A source line contact SC is provided on each of the P+-type diffusion layers 30 within the semiconductor layers 23-1 to 23-3.

3.2 With Regard to Data Erasing Operation

Next, a data erasing operation according to this embodiment will be described. Hereinafter, only differences from the second embodiment will be described. The overall flow of the erasing operation according to this embodiment is the same as that in the second embodiment, and erasing verification is performed for each layer. The flowchart thereof is as shown in FIGS. 9 and 18.

Figure 21:
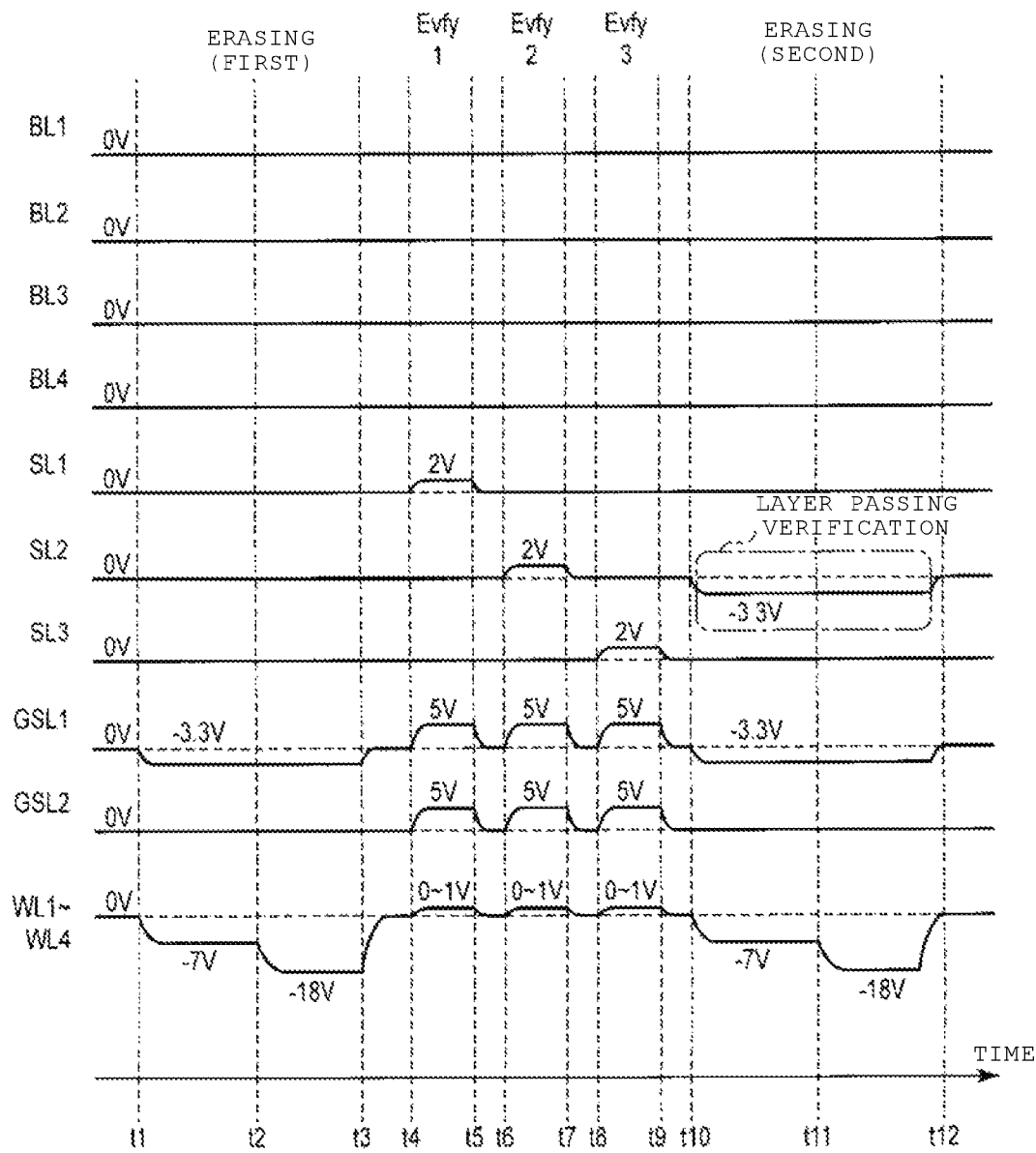
FIG. 21 is a timing chart showing potentials of wirings during a data erasing operation according to the third embodiment.

FIG. 21 is a timing chart showing potentials of wirings in the first erasing operation, the erasing verifications (Evfy1 to Evfy3) thereof, and the second erasing in the flow chart shown in FIG. 18. Meanwhile, similarly to the second embodiment in this embodiment, only a wiring regarding a memory unit MU1 is described, but the same description applies to other memory units MU that are erasing targets.

First, in the first erasing (time t1 to t3), a sense amplifier 113 applies, for example, 0 V to bit lines BL1 to BL4. A source line driver 114 applies, for example, 0 V to the source lines SL1 to SL3. In addition, a row decoder 112 applies a voltage (for example, −3.3 V) which is lower than those of the source lines SL1 to SL3 to a selection gate line GSL1 and applies a voltage (for example, 0 V) which is the same as those of the bit lines BL1 to BL4 to a selection gate line GSL2. Thus, the selection transistors ST1 connected to the bit lines BL1 to BL4 are set to be in an off-state. On the other hand, the selection transistor ST2 connected to the source lines SL1 to SL3 is supplied with holes from the P+-type diffusion layer 30 formed in a region on the source line side and functions as a P-channel transistor, and thus is set to be in an on-state.

In this state, the row decoder 112 applies a voltage (for example, −7 V) which is lower than that of the source line SL to word lines WL1 to WL4 for a period between time t1 and time t2. Since holes are supplied to a semiconductor 23 from the source line side, the voltage is a voltage lower than that of the source line SL. When a voltage of −7 V is applied to the word lines WL1 to WL4, the memory cell transistors MT1 to MT4 attempt to lower the potential of the semiconductor layer 23 located below a gate to −7 V due to capacitive coupling. However, the selection transistor ST2 is in an on-state, the potential of the semiconductor layer 23 is maintained at 0 V which is the same as the potential of the source line SL. In addition, holes are supplied from the P+-type diffusion layer 30, and thus the semiconductor layer 23 acts as a P-type semiconductor. As a result, the memory cell transistors MT1 to MT4 operate as P-channel transistors.

Next, the row decoder 112 applies a lower voltage to the word lines WL1 to WL4 during time t2 to t3. The voltage is a negative voltage (for example, −18 V) for applying a FN tunnel current. As a result, a difference in the potential between the semiconductor layer 23 and the gates of the memory cell transistors MT1 to MT4 is increased, and thus a FN tunnel current flows to the memory cell transistors MT1 to MT4. Thereby, since electrons of a charge storage layer 26 disappear, data is erased. Meanwhile, in unselected memory unit MU, the corresponding source line SL is set to have the same voltage (for example, −3.3 V) as that of the selection gate line GSL1, and thus the selection transistor ST2 is set to be in an off-state and is excluded from a target for erasing.

Next, a control unit 121 performs the erasing verification (Evfy1) of NAND strings SR1 located at the respective lowermost layers of the string groups GR1-1 to GR4-1 (time t4 to t5). That is, the sense amplifier 113 applies, for example, 0 V to the bit lines BL1 to BL4. The source line driver 114 applies a voltage (for example, 2 V) which is higher than that of the bit line BL to the source line SL1 corresponding to the lowermost layer to be subjected to erasing verification. On the other hand, the source line driver 114 applies the same potential (for example, 0 V) as that of the bit line BL to the source lines SL2 and SL3 corresponding to the intermediate layer and the uppermost layer which are not targets for erasing verification.

Thus, for example, in the NAND strings SR1 of the string groups GR1-1 to GR4-1, when all of the memory cell transistors MT1 to MT4 included in each NAND string are in an on-state, a current flows to the bit lines BL1 to BL4 through current paths of the respective NAND strings SR1 from the source line SL1.

In this embodiment, the P+-type diffusion layer 30 is formed in a region on the source line side, and the N+-type diffusion layer 29 is formed in a region on the bit line side.

Subsequently, the control unit 121 sequentially performs the erasing verifications (Evfy2 and Evfy3) of the respective NAND strings SR2 and SR3 (time t6 to t7 and time t8 to t9). When the NAND string SR2 is selected, the source line driver 114 applies a voltage (for example, 2 V) which is higher than that of the bit line BL to the source line SL2 and applies the same potential (for example, 0 V) as that of the bit line BL to the source lines SL1 and SL3. In addition, when the NAND string SR3 is selected, the source line driver 114 applies a voltage (for example, 2 V) which is higher than that of the bit line BL to the source line SL3 and applies the same potential (for example, 0 V) as that of the bit line BL to the source lines SL2 and SL3. In this manner, the NAND strings SR1 to SR3 are selected using voltages of the source lines SL1 to SL3.

Next, after performing retry determination, the control unit 121 performs the second erasing of a layer failing in the retry determination (time t10 to t12). The second erasing is different from the first erasing in that the source line driver 114 applies the same voltage (for example, −3.3 V) as that of the selection gate line GSL1 to the source line SL2 corresponding to the intermediate layer passing the retry determination. Thus, the selection transistors ST2 connected to the source line SL2 are set to be in an off-state. As a result, in the NAND string SR2, both the selection transistors ST1 and ST2 are set to be in an off-state, and thus a current does not flow. That is, the semiconductor layer 23 of the NAND string SR2 is set to be in a floated state. Accordingly, when a voltage of −18 V is applied to the word line WL, the potential of the semiconductor layer 23 is lowered to −18 V due to capacitive coupling, and a difference in the potential does not occur between the semiconductor layer 23 and the gates of the memory cell transistors MT, and thus a FN tunnel current does not flow.

3.3 Effects According to this Embodiment

In the configuration according to this embodiment, it is possible to select between erasing and non-erasing for each layer by selecting the source line SL. Accordingly, in the configuration according to this embodiment, the same effects as those in the first and second embodiments described above are obtained.

Further, in this configuration, holes are supplied to the charge storage layer 26 by an FN tunnel effect, and thus it is possible to erase data of the memory cell transistor MT. Accordingly, it is possible to reduce a voltage applied to the selection transistor ST as compared with a case where data is erased by GIDL.

Further, similarly to the second embodiment described above, in the configuration according to this embodiment, it is possible to reduce the number of times of erasing verification to the number of failed layers in the second erasing and the subsequent erasing operations. Accordingly, it is possible to shorten a processing time during an erasing operation.

Meanwhile, in this embodiment, the erasing verification is performed from the NAND string SR1, but may be performed from any of the NAND strings SR.

Further, in this embodiment, a voltage of the word line WL may be stepped down whenever retry determination fails and erasing is repeated, and a time when a voltage is applied to the word line WL in order to apply an FN tunnel current may be stepped up.

Further, in this embodiment, a description is given of a case where the row decoder 112 applies a voltage (for example, 5 V) which is higher than those of the bit line BL and the source line SL to the selection transistors ST1 and ST2 during the erasing verification and where the selection transistors ST1 and ST2 operate as N-channel transistors (this is referred to as "N channel reading"). However, the row decoder 112 may apply a voltage lower than those of the bit line BL and the source line SL, for example, −5 V to the selection transistors ST1 and ST2, and may cause the selection transistors to operate as P-channel transistors (this is referred to as "P channel reading"). In the case of the N channel reading, when electrons are supplied to the semiconductor layer 23 of the NAND string SR from the N+-type diffusion layer 29 on the bit line side, the semiconductor layer 23 acts as an N+-type diffusion layer. For this reason, the selection transistors ST1 and ST2 may operate as N-channel transistors. On the other hand, in the case of the P channel reading, when holes are supplied to the semiconductor layer 23 of the NAND string SR from the P+-type diffusion layer 30 on the source line side, the semiconductor layer 23 acts as a P+-type diffusion layer. For this reason, the selection transistors ST1 and ST2 may operate as P-channel transistors.

4. Fourth Embodiment

Next, a semiconductor memory device and a data erasing method according to a fourth embodiment will be described. In this embodiment, GIDL occurs on both the bit line side and the source line side in the first and second embodiments described above. Hereinafter, only differences from the first and second embodiments will be described.

4.1 With Regard to Configuration of Memory Cell Array

Figure 22:
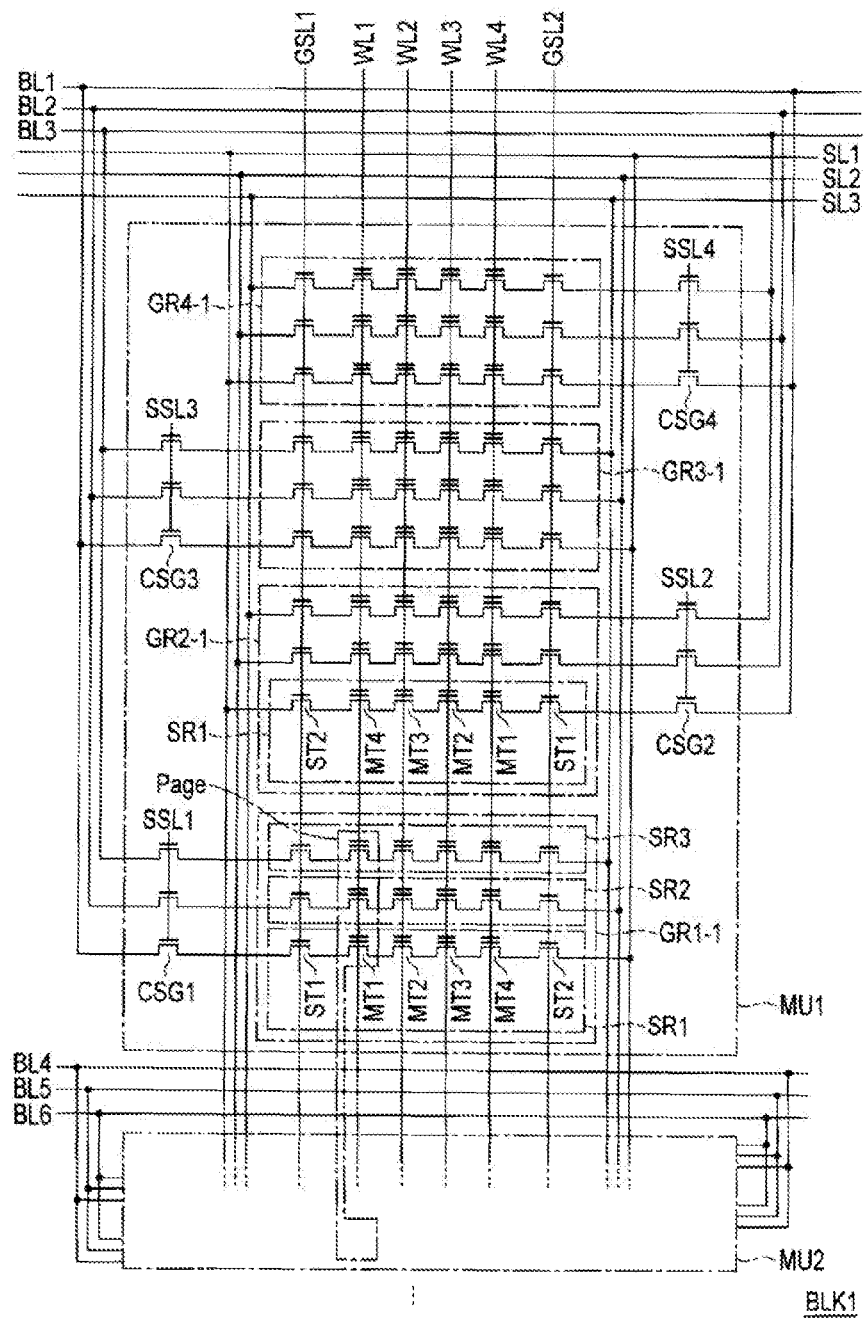
FIG. 22 is a circuit diagram of a memory cell array according to a fourth embodiment.

FIG. 22 is a circuit diagram of any of blocks BLK in a memory cell array 111 according to this embodiment. As shown in the drawing, in the memory cell array 111 according to this embodiment, NAND strings SR1 to SR3 are connected to source lines SL1 to SL3 in FIG. 3 described in the first embodiment.

For example, when focusing on a memory unit MU1, the NAND strings SR1 to SR3 of string groups GR1-1 to GR4-1 are connected in common to different bit lines BL1 to BL3 and source lines SL1 to SL3, respectively. Specifically, in the NAND strings SR1 of the string groups GR1-1 to GR4-1, the drain terminals thereof are connected in common to the bit line BL1 through column selection transistors CSG and the source terminals thereof are connected in common to the source line SL1. In the NAND strings SR2 of the string groups GR1-1 to GR4-1, the drain terminals thereof are connected in common to the bit line BL2 through the column selection transistors CSG and the source terminals thereof are connected in common to the source line SL2. In the NAND strings SR3 of the string groups GR1-1 to GR4-1, the drain terminals thereof are connected in common to the bit line BL3 through the column selection transistors CSG and the source terminals thereof are connected in common to the source line SL3.

Accordingly, in this embodiment, it is possible to select the NAND strings SR1 to SR3 using the bit lines BL1 to BL3 and the source lines SL1 to SL3.

4.2 With Regard to Data Erasing Operation

Next, a data erasing operation according to this embodiment will be described. Hereinafter, only differences from the first and second embodiments will be described. A general flow of an erasing operation according to this embodiment is the same as those in the first and second embodiments. In addition, similarly to the first embodiment, the erasing verification is performed in units of string groups GR (columns), and a specific example of the erasing operation is as shown in FIG. 10.

Figure 23:
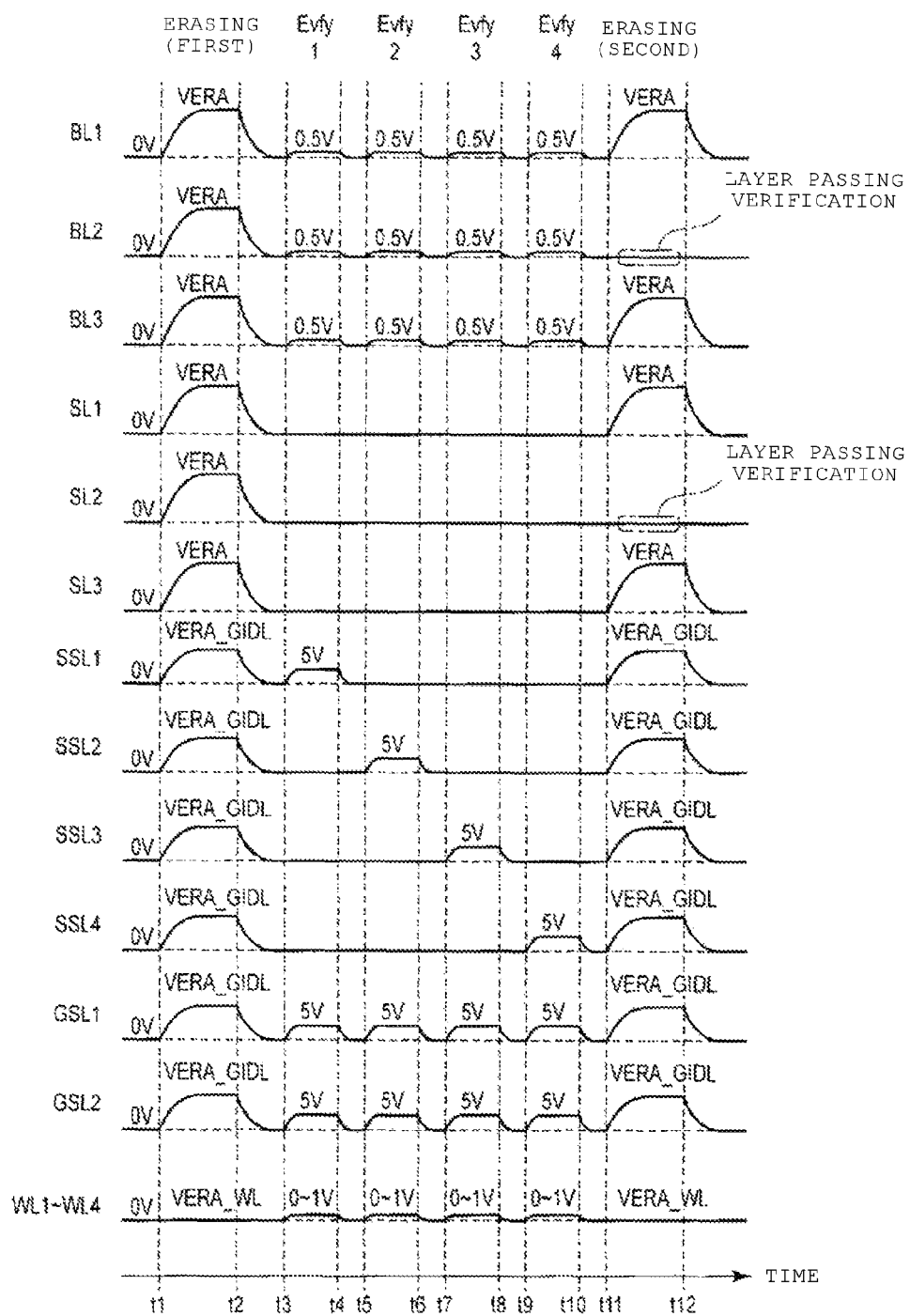
FIG. 23 is a timing chart showing potentials of wirings during a data erasing operation according to the fourth embodiment.

FIG. 23 is a timing chart showing potentials of wirings in the first erasing operation, the erasing verifications (Evfy1 to Evfy4) thereof, and the second erasing in the flow chart shown in FIG. 10.

As shown in the drawing, differences between this embodiment and the first embodiment described in FIG. 11 are as follows. That is, when erasing is performed, a voltage VERA is applied not only to the bit line BL but also to the source line SL, and a voltage VERA_GIDL is applied not only to control signal lines SSL1 to SSL4 but also to selection gate lines GSL1 and GSL2. Thus, GIDL occurs not only in the column selection transistor CSG1 to CSG4 but also in the selection transistors ST1 and ST2.

When the second erasing and the subsequent erasing operations are performed, a voltage (for example, 0 V) which does not cause GIDL is applied to the bit line BL and the source line SL which correspond to a layer that passes erasing verification.

4.3 Effects According to this Embodiment

In the configuration according to this embodiment, it is possible to select between erasing and non-erasing for each layer by selecting the bit line BL and the source line SL. Accordingly, in the configuration according to this embodiment, the same effects as those in the first to third embodiments described above are obtained.

Further, in the configuration according to this embodiment, since GIDL occurs in the column selection transistor CSG and the selection transistors ST1 and ST2, it is possible to supply holes to the NAND string SR from both the bit line side and the source line side. Thus, since a sufficient number of holes is more likely to be supplied to all of the NAND strings SR, it is possible to improve the reliability of the erasing operation.

5. Fifth Embodiment

Next, a semiconductor memory device and a data erasing method according to a fifth embodiment will be described. In this embodiment, an erasing pulse width (erasing time) is given layer dependency in the first to fourth embodiments described above. Hereinafter, only differences from the first to fourth embodiments will be described. Meanwhile, in this embodiment, a case where data of a memory cell transistor MT located at the uppermost layer is least likely to be erased (erasing is slow) and data of a memory cell transistor MT located at the lowermost layer is most likely to be erased (erasing is fast) will be described as an example.

Meanwhile, the application of different erasing pulse widths is described in, for example, U.S. Pat. No. 8,767,466 entitled "non-volatile semiconductor memory device" and filed on Mar. 14, 2012. The entirety of this US patent is incorporated herein by reference.

5.1 First Example

Now, a first example of this embodiment will be described. In this example, an erasing pulse width condition different for each layer is applied when performing erasing in the semiconductor memory device according to the first embodiment. Hereinafter, only differences from the first embodiment will be described.

Figure 24:
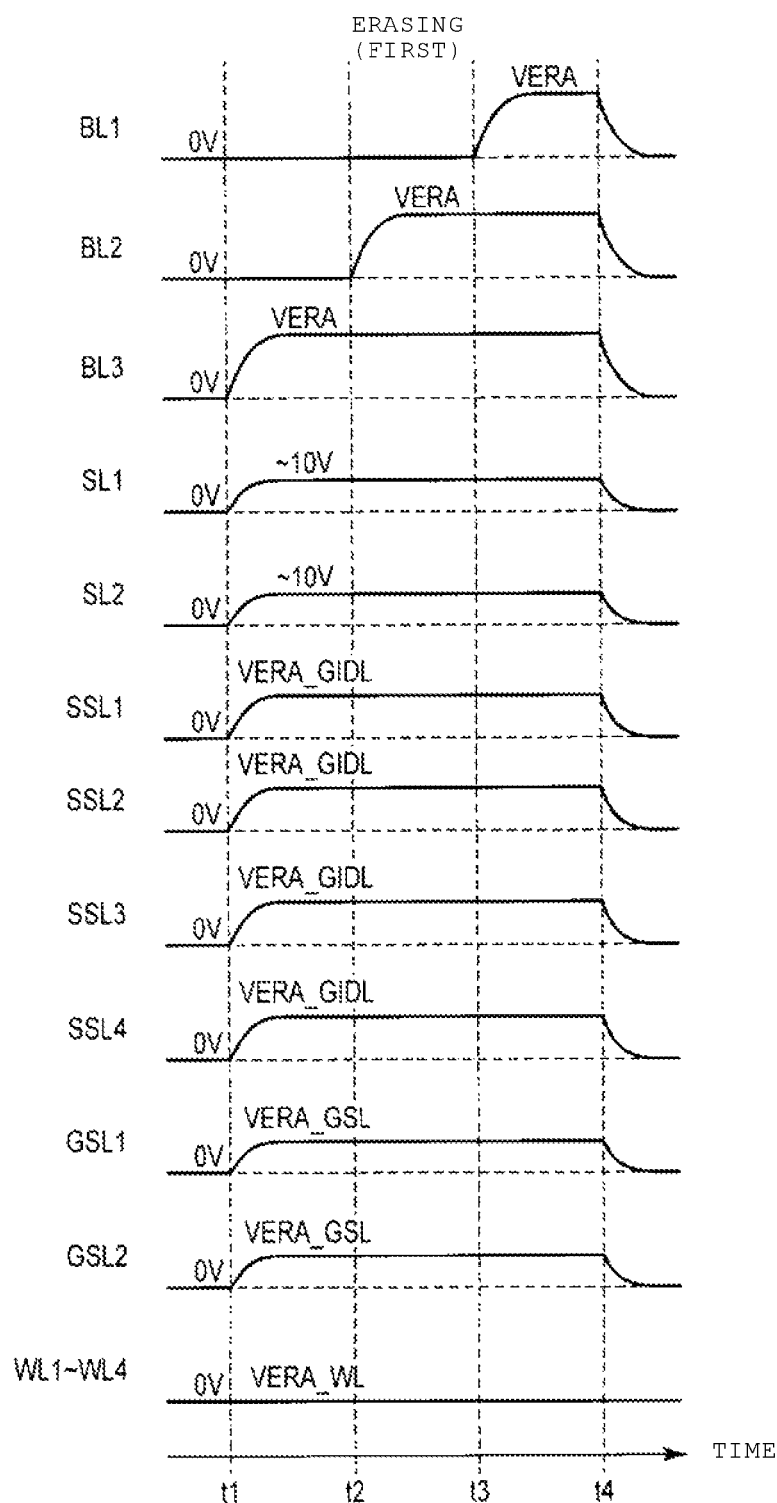
FIG. 24 is a timing chart showing potentials of wirings during data erasing according to a first example of a fifth embodiment.

FIG. 24 is a timing chart showing potentials of wirings when this example is applied to the first erasing in FIG. 11 according to the first embodiment (equivalent to a period between time t1 and time t2 in FIG. 11). As shown in the drawing, in this example, a driver 124 gives layer dependency during a period for which VERA is applied to bit lines BL1 to BL3.

First, the driver 124 applies VERA to the bit line BL3 corresponding to an uppermost layer at time t1. Next, the driver 124 applies VERA to the bit line BL2 corresponding to an intermediate layer at time t2. Next, the driver 124 applies VERA to the bit line BL1 corresponding to a lowermost layer at time t3. Next, the driver 124 applies 0 V to the bit lines BL1 to BL3 at time t4.

Accordingly, GIDL occurs in the uppermost layer for a period between time t1 and time t4, GIDL occurs in the intermediate layer for a period between time t2 and time t4, and GIDL occurs in the lowermost layer for a period between time t3 to time t4. That is, the uppermost layer having data being not likely to be erased has the largest erasing pulse width. The intermediate layer has the next largest erasing pulse width. The lowermost layer having data being more likely to be erased has the smallest erasing pulse width. In addition, the voltages described during time t1 to t2 of FIG. 11 are applied to source lines SL1 and SL2, control signal lines SSL1 to SSL4, selection gate lines GSL1 and GSL2, and word lines WL1 to WL4 for a period between time t1 and time t4.

5.2 Second Example

Now, a second example of this embodiment will be described. In this example, an erasing pulse width condition different for each layer is applied when performing erasing in the semiconductor memory device according to the second embodiment. Hereinafter, only differences from the second embodiment will be described.

Figure 25:
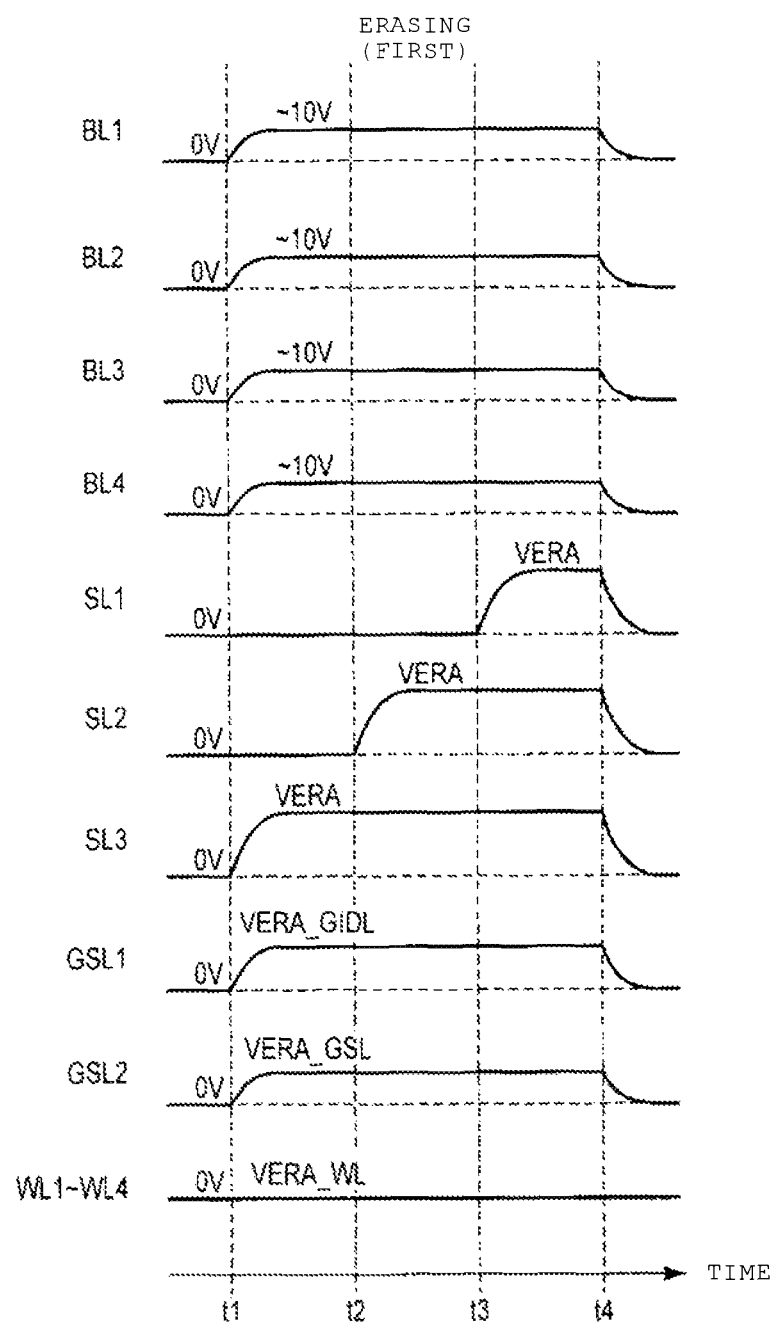
FIG. 25 is a timing chart showing potentials of wirings during data erasing according to a second example of the fifth embodiment.

FIG. 25 is a timing chart showing potentials of wirings when this example is applied to the first erasing in FIG. 19 according to the second embodiment. As shown in the drawing, in this example, VERA described in FIG. 24 is applied to the source lines SL1 to SL3 for different periods. That is, the driver 124 applies VERA to the source line SL3 for a period between time t1 and time t4, applies VERA to the source line SL2 for a period between time t2 and time t4, and applies VERA to the source line SL1 for a period between time t3 and time t4. The voltages described during time t1 to t2 of FIG. 19 are applied to the bit lines BL1 to BL4, the selection gate lines GSL1 and GSL2, and the word lines WL1 to WL4.

5.3 Third Example

Now, a third example of this embodiment will be described. In this example, an erasing pulse width condition different for each layer is applied when performing erasing in the semiconductor memory device according to the third embodiment. Hereinafter, only differences from the third embodiment will be described.

Figure 26:
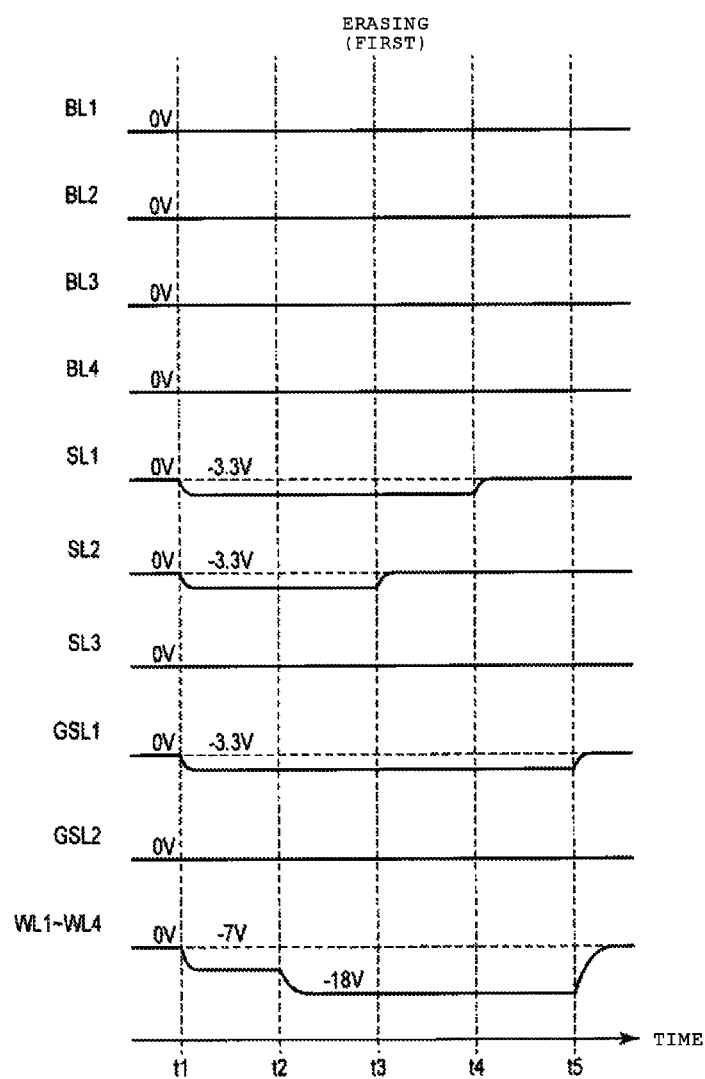
FIG. 26 is a timing chart showing potentials of wirings during data erasing according to a third example of the fifth embodiment.

FIG. 26 is a timing chart showing potentials of wirings when this example is applied to the first erasing in FIG. 21 according to the third embodiment (equivalent to a period between time t1 and time t3 in FIG. 21). As shown in the drawing, in this example, layer dependency is given during a period for which the source line driver 124 applies 0 V to the source lines SL1 to SL3, that is, during a period for which the selection transistor ST2 is set to be in an on-state.

First, a source line driver 114 applies 0 V to the source line SL3 at time t1. In addition, the source line driver 114 applies, for example, −3.3 V to the source line SL1 and the source line SL2. Thus, the selection transistor ST2 formed in the uppermost layer is set to be in an on-state, and the selection transistors ST2 formed in the lowermost layer and the intermediate layer are set to be in an off-state. In addition, the row decoder 112 applies, for example, −7 V to word lines WL1 to WL4.

Next, the row decoder 112 sets a voltage to be applied to the word lines WL1 to WL4 from −7 V to −18 V at time t2. Thus, in the memory cell transistor MT formed in the uppermost layer, since the selection transistor ST2 is in an on-state, an FN tunnel current flows.

Next, the row decoder 112 sets the voltage of the source line SL2 from −3.3 V to 0 V at time t3. Thus, the selection transistor ST2 formed in the intermediate layer is set to be in an on-state. Accordingly, in the memory cell transistor MT formed in the intermediate layer, an FN tunnel current flows.

Next, the row decoder 112 sets the voltage of the source line SL1 from −3.3 V to 0 V at time t4. Thus, the selection transistor ST2 formed in the lowermost layer is set to be in an on-state. Accordingly, in the memory cell transistor MT formed in the lowermost layer, an FN tunnel current flows.

Finally, the row decoder 112 sets the voltages of the selection gate line GSL1 and the word lines WL1 to WL4 to 0 V at time t5. Thus, the erasing is completed.

Therefore, in the uppermost layer, the FN tunnel current flows to the memory transistor MT for a period between time t2 and time t5, and data is erased. In the intermediate layer, the FN tunnel current flows to the memory transistor MT for a period between time t3 and time t5, and data is erased. Further, in the lowermost layer, the FN tunnel current flows to the memory transistor MT for a period between time t4 and time t5, and data is erased. That is, the uppermost layer having data being not likely to be erased has the largest erasing pulse width. The intermediate layer has the next largest erasing pulse width. The lowermost layer having data being more likely to be erased has the smallest erasing pulse width. In the meantime (time t1 to t5), the voltages described during time t1 to t3 of FIG. 21 are applied to selection gate line GSL2, bit lines BL1 to BL4, and selection gate lines GSL1 and GSL2.

5.4 Fourth Example

Now, a fourth example of this embodiment will be described. In this example, an erasing pulse width condition different for each layer is applied when performing erasing in the semiconductor memory device according to the fourth embodiment. Hereinafter, only differences from the fourth embodiment will be described.

Figure 27:
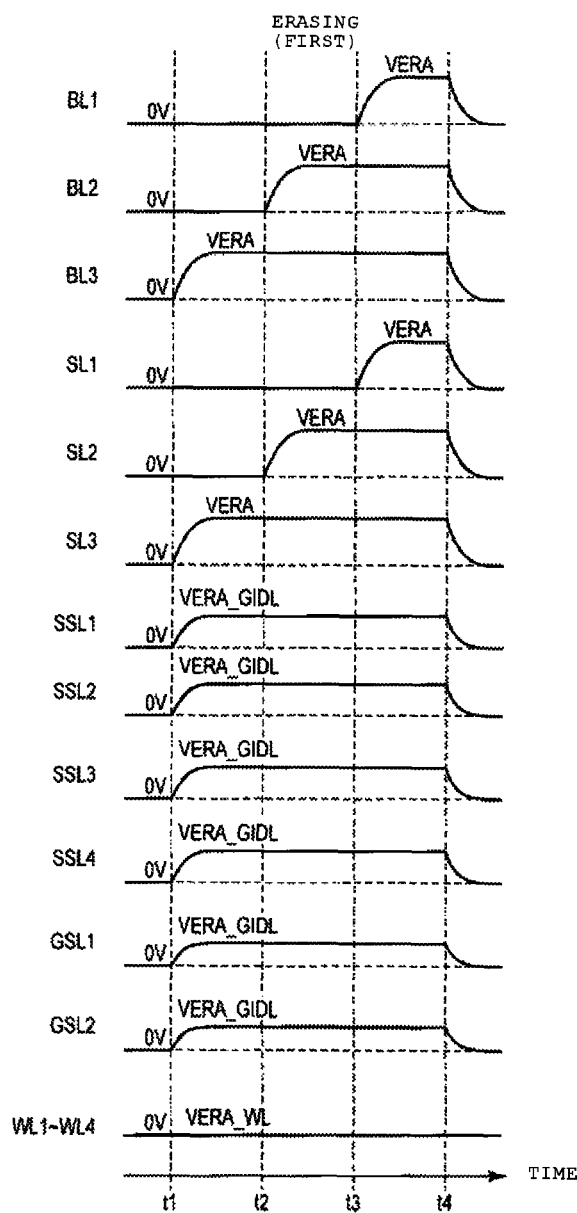
FIG. 27 is a timing chart showing potentials of wirings during data erasing according to a fourth example of the fifth embodiment.

FIG. 27 is a timing chart showing potentials of wirings when this example is applied to the first erasing in FIG. 23 according to the fourth embodiment. As shown in the drawing, in this example, a voltage to be applied to a bit line BL and a source line SL is as shown in FIGS. 24 and 25 described above. The voltages described during time t1 to t2 of FIG. 23 are applied to other control signal lines SSL1 to 4, selection gate lines GSL1 and GSL2, and word lines WL1 to WL4.

5.5 Effects According to this Embodiment

In the configuration according to this embodiment, it is possible to select between erasing and non-erasing for each layer. Accordingly, the same effects as those in the first to fourth embodiments described above are obtained.

Further, in this embodiment, it is possible to shorten a processing time during an erasing operation.

For example, as described in the first embodiment, a memory cell transistor MT has a different shape and erasing characteristics for each layer. For this reason, an optimum erasing pulse width varies depending on layers. Consequently, in this embodiment, data erasing is performed with an optimum erasing pulse width according to each layer by changing an erasing pulse width for each layer. Accordingly, each layer is more likely to pass retry determination, and thus it is possible to reduce the number of erasing loops and to shorten a processing time of the erasing operation.

Meanwhile, here, a case where data of the memory cell transistor MT located at the uppermost layer is least likely to be erased (erasing is slow) and data of the memory cell transistor MT located at the lowermost layer is most likely to be erased (erasing is fast) will be described as an example. However, even when data of the intermediate layer is least likely to be erased or even when data of the lowermost layer is least likely to be erased, it is possible to apply this embodiment. For example, when data of the intermediate layer is least likely to be erased, the erasing pulse width for the intermediate layer may be increased. In addition, when data of the lowermost layer is least likely to be erased, the erasing pulse width for the lowermost layer may be increased.

Further, in the first to fourth examples, an erasing pulse width is changed by changing an erasing voltage application start time depending on layers. However, the same erasing voltage application start time is set, and an erasing voltage application end time may be changed depending on layers. When the erasing pulse width may be changed, application start and end timings may be arbitrarily changed.

6. Sixth Embodiment

Next, a semiconductor memory device and a data erasing method according to a sixth embodiment will be described. In this embodiment, an erasing voltage is given layer dependency in the first to fifth embodiments described above. Hereinafter, only differences from the first to fifth embodiments will be described. In this embodiment, a case where data of a memory cell transistor MT located at the uppermost layer is least likely to be erased (erasing is slow) and data of a memory cell transistor MT located at the lowermost layer is most likely to be erased (erasing is fast) will be described as an example.

6.1 First Example

Figure 28:
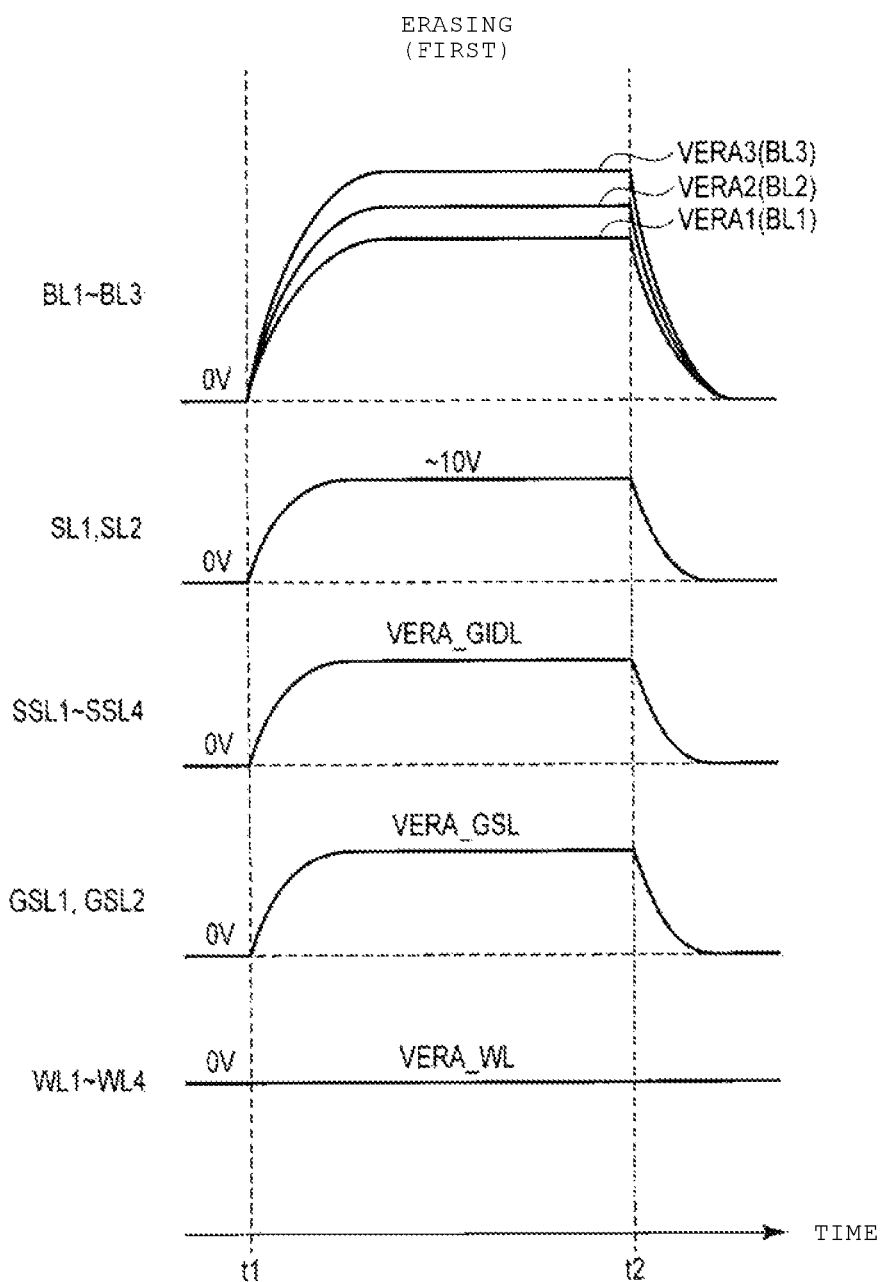
FIG. 28 is a timing chart showing potentials of wirings during data erasing according to a first example of a sixth embodiment.

Now, a first example of this embodiment will be described. FIG. 28 is a timing chart showing potentials of wirings when this example is applied to the first erasing in FIG. 11 according to the first embodiment.

As shown in the drawing, in this example, a driver 124 applies VERA1 to VERA3 having different values to bit lines BL1 to BL3. Specifically, VERA3 applied to the bit line BL3 corresponding to the uppermost layer is largest. In addition, VERA2 applied to the bit line BL2 corresponding to the intermediate layer is second largest. In addition, VERA1 applied to the bit line BL1 corresponding to the lowermost layer is smallest. Accordingly, the magnitudes of the voltage values applied to the bit lines BL1 to BL3 by the driver 124 have a relationship of VERA1<VERA2<VERA3. That is, the value of VERA becomes larger as a bit line BL corresponds to a layer having data being not likely to be erased. In this manner, when the value of VERA is increased, a difference in the potential between a word line WL and a semiconductor layer 23 of a NAND string SR is increased, and thus holes are more likely to be injected into the memory cell transistor MT (data is more likely to be erased). In addition, the voltages described during time t1 to t2 of FIG. 11 are applied to source lines SL1 and SL2, control signal lines SSL1 to SSL4, selection gate lines GSL1 and GSL2, and word lines WL1 to WL4 in the meantime.

6.2 Second Example

Figure 29:
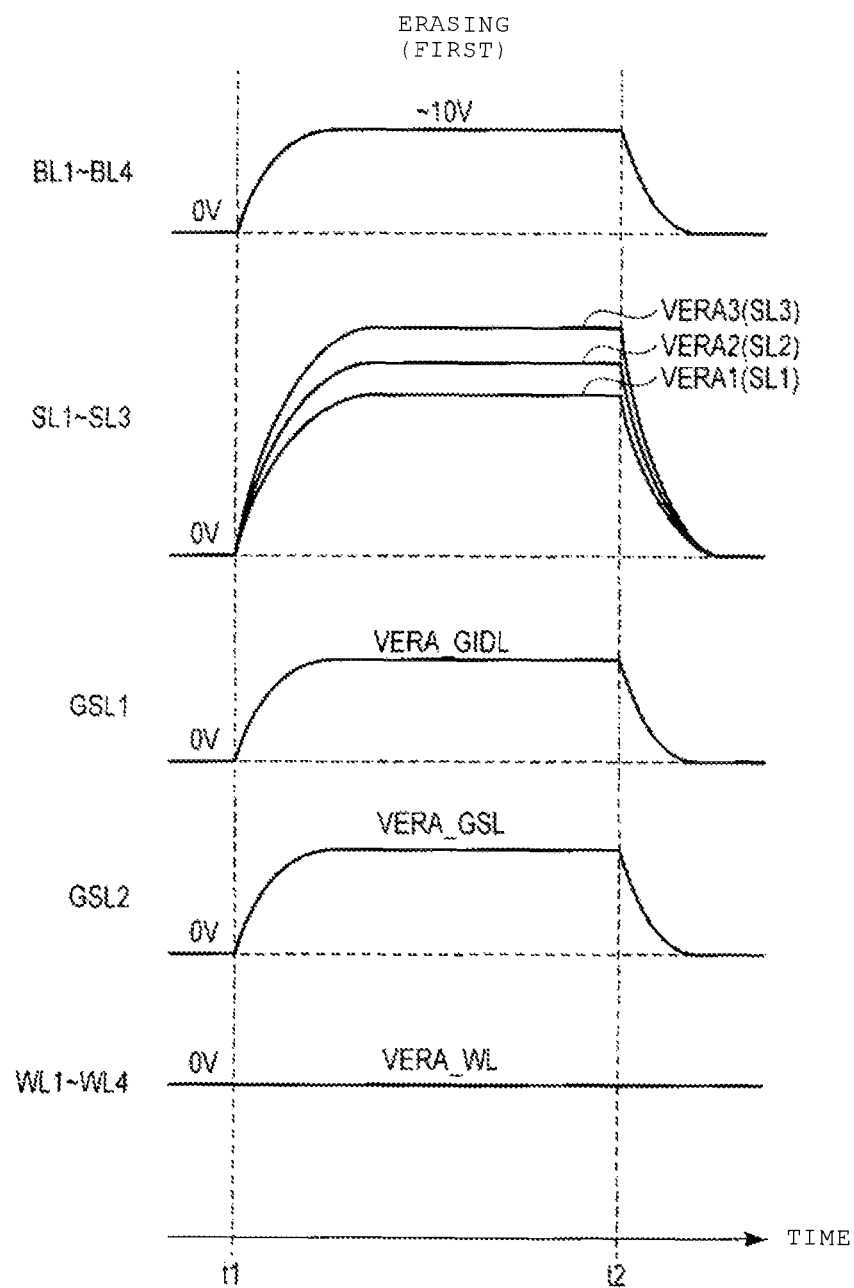
FIG. 29 is a timing chart showing potentials of wirings during data erasing according to a second example of the sixth embodiment.

Now, a second example of this embodiment will be described. FIG. 29 is a timing chart showing potentials of wirings when this example is applied to the first erasing in FIG. 19 according to the second embodiment.

As shown in the drawing, in this example, VERA1 to VERA3 described in FIG. 28 are applied to source lines SL1 to SL3, respectively.

6.3 Third Example

Figure 30:
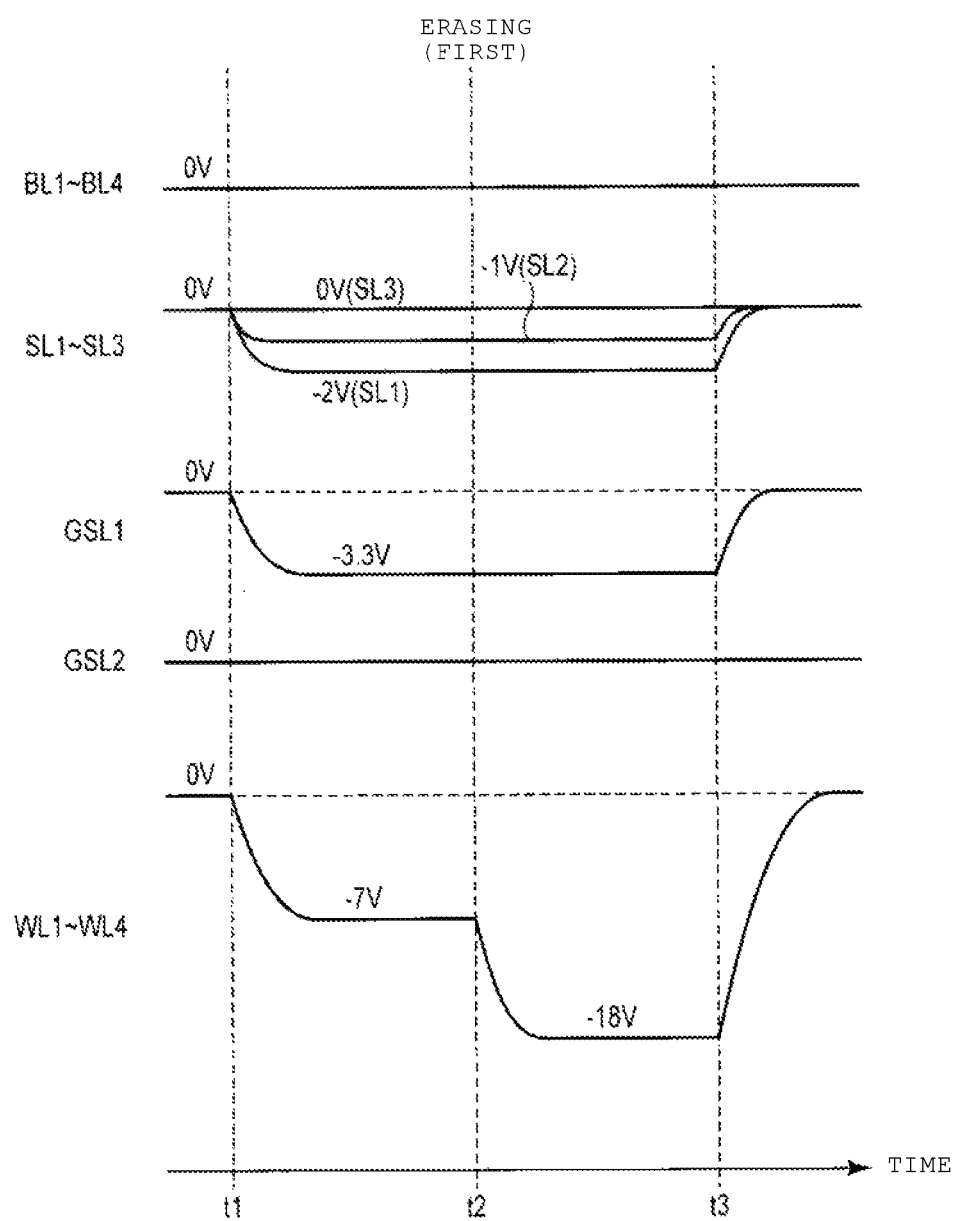
FIG. 30 is a timing chart showing potentials of wirings during data erasing according to a third example of the sixth embodiment.

Now, a third example of this embodiment will be described. FIG. 30 is a timing chart showing potentials of wirings when this example is applied to the first erasing in FIG. 21 according to the third embodiment.

As shown in the drawing, in this example, a source line driver 114 applies a different voltage value for each of the source lines SL1 to SL3. Specifically, a voltage (for example, 0 V) applied to the source line SL3 is largest. In addition, a voltage (for example, −1 V) applied to the source line SL2 is second largest. In addition, a voltage (for example, −2 V) applied to the source line SL1 is smallest. That is, the voltage has a larger value as the source line SL corresponds to a layer having data being not likely to be erased. In this manner, a difference in the potential between a word line WL and a semiconductor layer 23 of a NAND string SR becomes larger as the value of the voltage applied to the source line SL increases, and thus an FN tunnel current is more likely to flow to the memory cell transistor MT (data is more likely to be erased).

Meanwhile, here, since the selection transistor ST2 is set to be in an on-state, the voltage applied to the source line SL3 may be equal to or greater than a value obtained from the relationship of (voltage of selection gate line GSL1)+ (threshold voltage Vt of selection transistor ST2). In addition, the voltages described during time t1 to t3 of FIG. 21 are applied to bit lines BL1 to BL4, selection gate lines GSL1 and GSL2, and word lines WL1 to WL4 in the meantime.

6.4 Fourth Example

Figure 31:
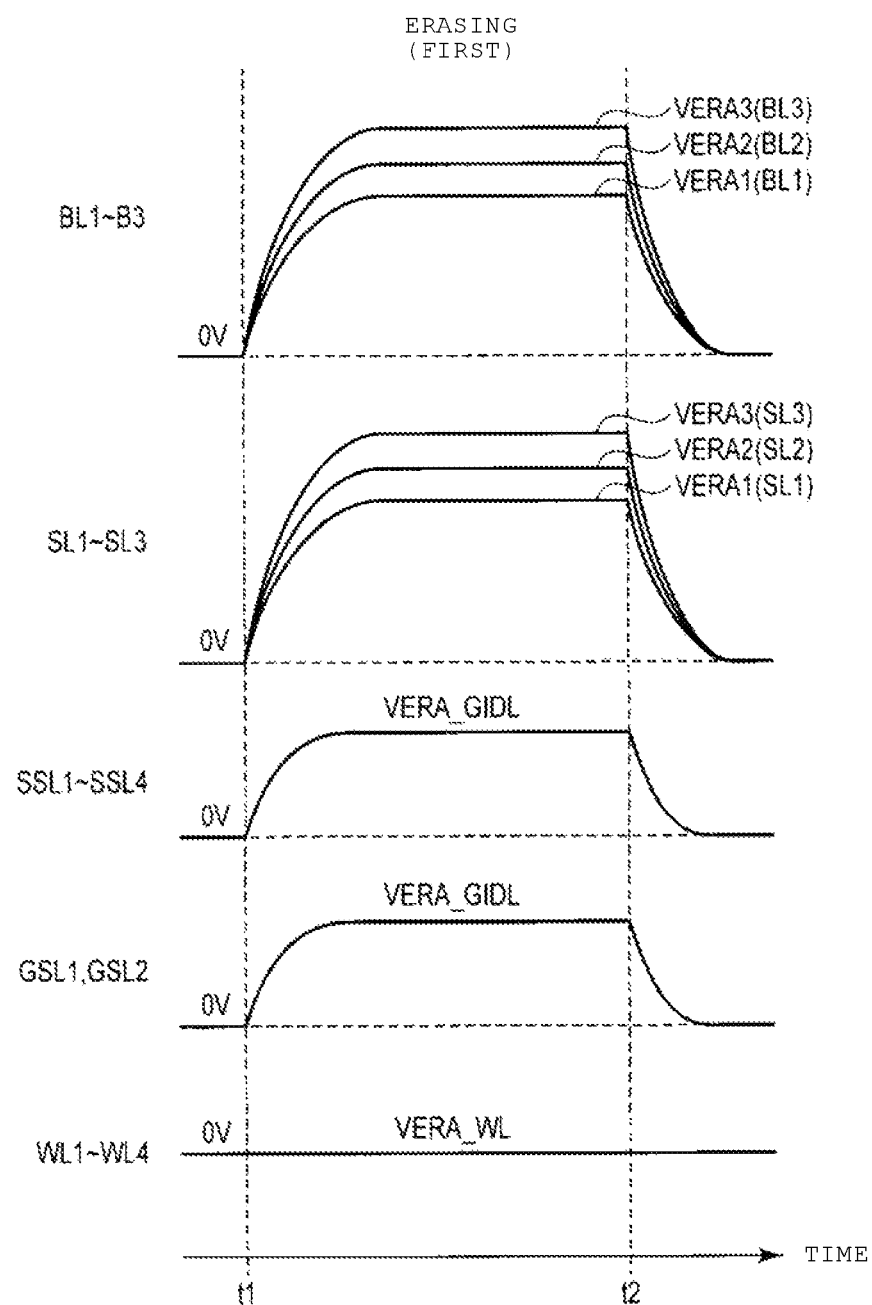
FIG. 31 is a timing chart showing potentials of wirings during data erasing according to a fourth example of the sixth embodiment.

Now, a fourth example of this embodiment will be described. FIG. 31 is a timing chart showing potentials of wirings when this example is applied to the first erasing in FIG. 23 according to the fourth embodiment.

As shown in the drawing, in this example, the above-mentioned first and second examples are combined, and the voltages VERA1 to VERA3 are applied to the respective bit lines BL1 to BL3 and the respective source lines SL1 to SL3.

6.5 Effects According to this Embodiment

In the configuration according to this embodiment, it is possible to select between erasing and non-erasing for each layer. Accordingly, the same effects as those in the first to fifth embodiments described above are obtained.

Further, in this embodiment, it is possible to perform data erasing with an optimum erasing voltage according to each layer by changing an erasing voltage for each layer. Accordingly, similarly to the fifth embodiment, each layer is more likely to pass retry determination, and thus it is possible to reduce the number of erasing loops and to shorten a processing time of the erasing operation.

Meanwhile, here, a case where data of the memory cell transistor MT located at the uppermost layer is least likely to be erased (erasing is slow) and data of the memory cell transistor MT located at the lowermost layer is most likely to be erased (erasing is fast) will be described as an example. However, even when data of the intermediate layer is least likely to be erased or even when data of the lowermost layer is least likely to be erased, it is possible to apply this embodiment. For example, when data of the intermediate layer is least likely to be erased, an erasing voltage to be applied to the intermediate layer may be increased. In addition, when data of the lowermost layer is least likely to be erased, an erasing voltage to be applied to the lowermost layer may be increased.

7. Seventh Embodiment

Next, a semiconductor memory device and a data erasing method according to a seventh embodiment will be described. This embodiment relates to the configuration of a circuit unit that connects a driver 124 outputting VERA and a bit line BL or a source line SL in the semiconductor memory devices according to the first, second, and fourth to sixth embodiments. Here, the circuit unit that connects the driver 124 and the bit line BL is referred to as a "bit line connection portion" and a circuit unit that connects the driver 124 and the source line SL is referred to as a "source line connection portion".

7.1 First Example 7.1.1 With Regard to Configuration of First Example

Figure 32:
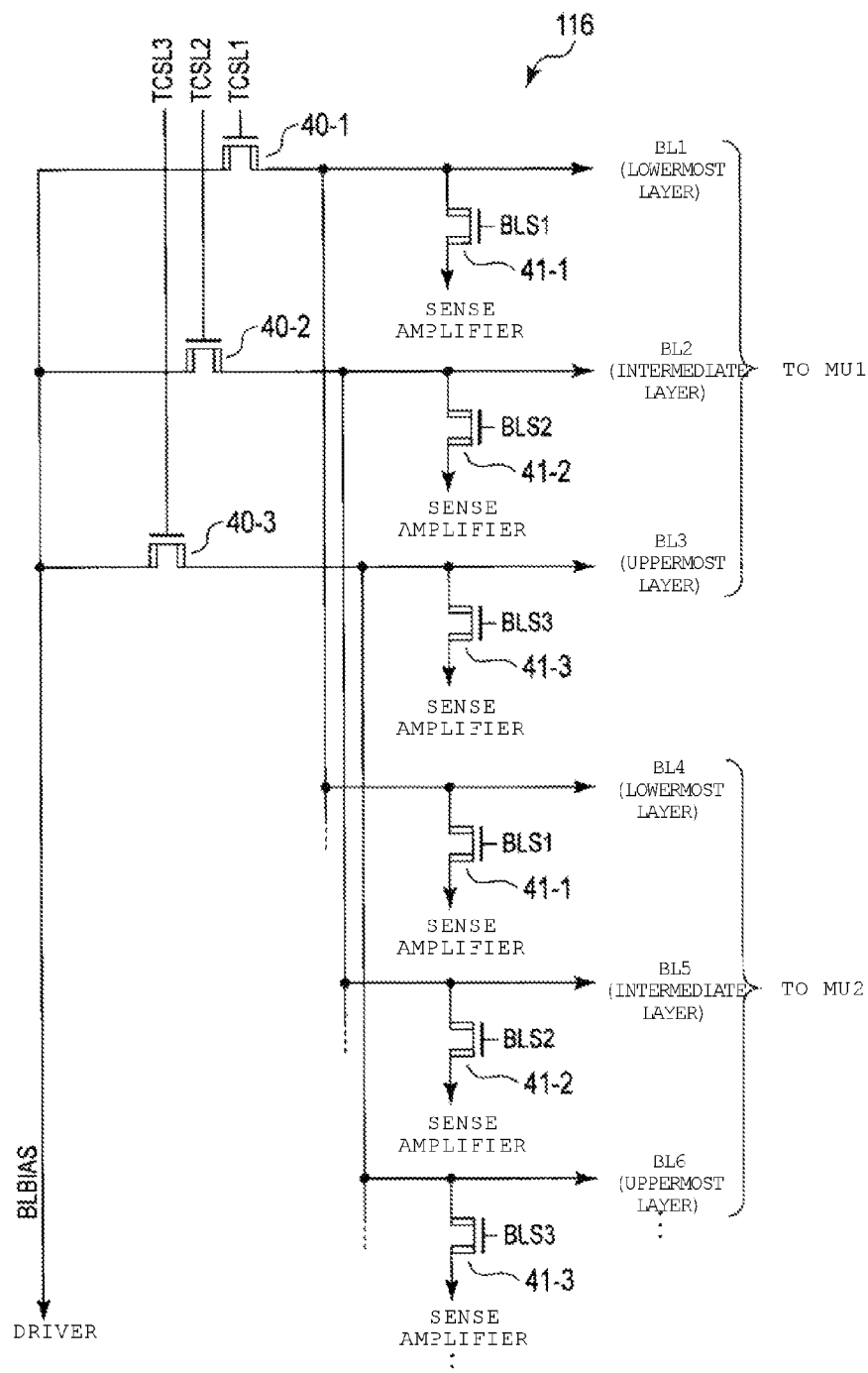
FIG. 32 is a circuit diagram of a bit line connection portion according to a first example of a seventh embodiment.

The configuration of a bit line connection portion according to a first example of this embodiment will be described below. This example relates to a bit line connection portion applicable to the memory cell array 111 described in the first and fourth embodiments. That is, the bit line connection portion may be applied to a configuration in which VERA is applied to the bit line BL during data erasing operation. FIG. 32 is a circuit diagram of the bit line connection portion according to this example.

As shown in the drawing, a bit line connection portion 116 includes N-channel MOS transistors 40-1 to 40-3 and 41-1 to 41-3 having a high breakdown voltage. For example, a MOS transistor having a high breakdown voltage to be described below is a MOS transistor, for example, which has a breakdown voltage higher than that of a memory cell transistor MT and has a gate insulating film, as an example, which is larger than that of the memory cell transistor MT.

One end of a current path of the transistor 40-1 is connected to any of the corresponding bit lines BL1, BL4, BL7, . . . BL (3i+1), and the other end thereof is connected in common to a wiring BLBIAS. The wiring BLBIAS is a wiring that connects the driver 124 and the transistor 40. In addition, the gate of the transistor 40-1 is connected to a signal line TCSL1.

One end of a current path of the transistor 40-2 is connected to any of the corresponding bit lines BL2, BL5, BL8, . . . BL (3i+2), and the other end thereof is connected in common to the wiring BLBIAS. In addition, the gate of the transistor 40-2 is connected to a signal line TCSL2.

One end of a current path of the transistors 40-3 is connected to any of the corresponding bit lines BL3, BL6, BL9, . . . BL (3i+3), and the other end thereof is connected in common to the wiring BLBIAS. In addition, the gate of the transistor 40-3 is connected to a signal line TCSL3.

Here, each of the signal lines TCSL1 to TCSL3 is a signal line that transfers a signal from a control unit 121 to the transistor 40 to thereby control an on/off state of the transistor 40.

In the transistor 41-1, the gate thereof is connected in common to a signal line BLS1, one end of the current path thereof is connected to any of the corresponding bit lines BL1, BL4, BL7, . . . BL (3i+1), and the other end thereof is connected to a sense amplifier 113.

In the transistor 41-2, the gate thereof is connected in common to a signal line BLS2, one end of the current path thereof is connected to any of the corresponding bit lines BL2, BL5, BL8, . . . , BL (3i+2), and the other end thereof is connected to the sense amplifier 113.

In the transistor 41-3, the gate thereof is connected in common to a signal line BLS3, one end of the current path thereof is connected to any of the corresponding bit lines BL3, BL6, BL9, . . . BL (3i+3), and the other end thereof is connected to the sense amplifier 113.

Here, the signal lines BLS1 to BLS3 are signal lines that transfer a signal from the control unit 121 to the transistors 41 to thereby control on- and off-states of the transistors 41, that is, the electrical connection with the sense amplifier 113. Meanwhile, here, the signal lines BLS1 to BLS3 are common to each memory unit MU.

7.1.2 With Regard to Operation During Erasing Operation

Next, an operation of the bit line connection portion 116 according to this example during erasing will be described.

First, the driver 124 applies VERA to the wiring BLBIAS. The control unit 121 applies VERAH to a signal line TCSL corresponding to a layer being a target for erasing and sets the corresponding transistor 40 to be in an on-state. Thus, the transistor 40 in an on-state transfers VERA to the corresponding bit line BL. Here, VERAH is a voltage larger than VERA and is a voltage for setting the transistor 40 to be in an on-state to thereby allow VERA to be transferred. In addition, the voltage value of VERAH may be a value satisfying the relationship of VERAH>VERA+(a threshold voltage Vt of the transistor 40).

In addition, the control unit 121 applies, for example, 0 V to the signal line TCSL corresponding to a layer which is not a target for erasing to thereby set the transistor 40 to be in an off-state.

Further, the control unit 121 applies, for example, 0 V to the signal line BLS corresponding to a layer being a target for erasing to thereby set the transistor 41 to be in an off-state.

Further, the control unit 121 applies a voltage for setting the transistor 41 to be in an on-state to the signal line BLS corresponding to a layer which is not a target for erasing. The sense amplifier 113 applies a voltage (for example, approximately 10 V) which does not cause GIDL to the bit line BL through the transistor 41 in an on-state. Meanwhile, the voltage for setting the transistor 41 to be in an on-state may have a value equal to or greater than a value obtained by adding a threshold voltage Vt of the transistor 41 to the voltage transferred from the sense amplifier 113.

As a result, VERA is transferred to the bit line BL corresponding to a layer being a target for erasing from the transistor 40, and a voltage (for example, approximately 10 V) which does not cause GIDL is transferred to the bit line BL corresponding to a layer which is not a target for erasing from the transistor 41.

Meanwhile, in this example, the control unit 121 sets the transistor 41 corresponding to a layer, which is not a target for erasing, to be in an on-state to thereby apply a voltage transferred from the sense amplifier 113 to the bit line BL, but may set the transistor 41 to be in an off-state. In this case, VERA is not transferred to the bit line BL corresponding to a layer which is not a target for erasing, and is set to be in an electrically floated state. Accordingly, a NAND string corresponding to the bit line BL is not erased. Meanwhile, the signal line TCSL is shared between the memory units MU.

7.1.3 With Regard to Change of Erasing Pulse Width for Each Layer

Next, a description will be given of a method of applying different periods and VERA to the bit lines BL corresponding to the respective layers by using the circuit configuration according to this example. That is, an operation when the fifth embodiment is realized by the configuration shown in FIG. 32 will be described.

Figure 33:
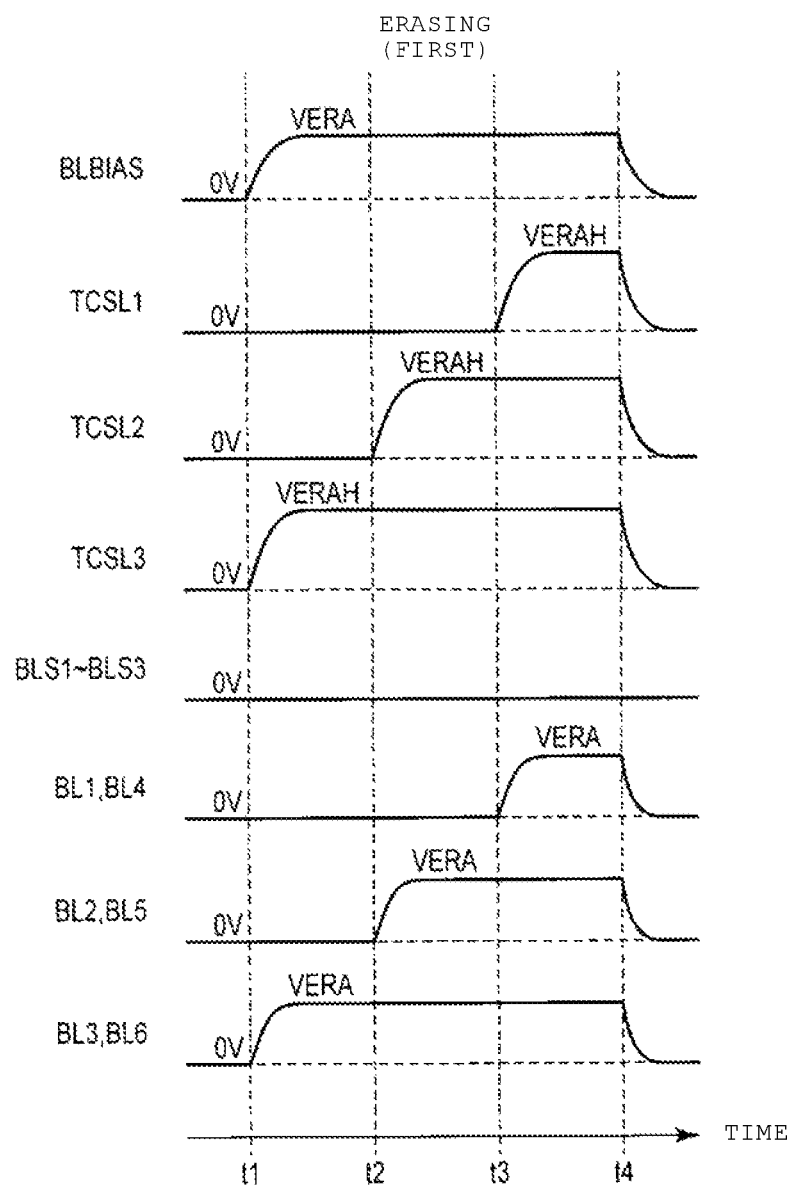
FIG. 33 is a timing chart showing potentials of wirings during data erasing according to the first example of the seventh embodiment.

FIG. 33 is a timing chart showing potentials of wirings of the bit line connection portion 116 according to this example. As shown in the drawing, first, the driver 124 applies VERA to the wiring BLBIAS at time t1. In addition, the control unit 121 applies VERAH to the signal line TCSL3 corresponding to the uppermost layer and sets the transistor 40-3 to be in an on-state. Thus, the transistor 40-3 transfers VERA to the bit lines BL3 and BL6 corresponding to the uppermost layer.

Next, the control unit 121 applies VERAH to the signal line TCSL2 corresponding to the intermediate layer at time t2 and sets the transistor 40-2 to be in an on-state. Thus, the transistor 40-2 transfers VERA to the bit lines BL2 and BL5 corresponding to the intermediate layer.

Next, the control unit 121 applies VERAH to the signal line TCSL1 corresponding to the lowermost layer at time t3 and sets the transistor 40-1 to be in an on-state. Thus, the transistor 40-1 transfers VERA to the bit lines BL1 and BL4 connected to the lowermost layer.

Finally, the control unit 121 applies, for example, 0 V to the signal lines TCSL1 to TCSL3 at time t4 and sets the transistor 40 to be in an off-state. Then, the driver 124 applies, for example, 0 V to the wiring BLBIAS. Thus, the transfer of VERA to the bit lines BL is terminated.

In addition, the control unit 121 applies, for example, 0 V to the signal lines BLS1 to BLS3 in the meantime (time t1 to t4) and sets all of the transistors 41 to be in an off-state.

Accordingly, the transistor 40-3 transfers VERA to the bit lines BL3 and BL6 for a period between time t1 and time t4. In addition, the transistor 40-2 transfers VERA to the bit lines BL2 and BL5 for a period between time t2 and time t4. Then, the transistor 40-1 transfers VERA to the bit lines BL1 and BL4 for a period between time t3 and time t4.

As described above, in this example, voltages VERA having different erasing pulse widths are applied to the bit lines BL corresponding to the respective layers by changing a period for which VERAH is applied to the signal lines TCSL1 to TCSL3.

7.1.4 With Regard to Change of Erasing Voltage for Each Layer

Next, a description will be given of a method of applying VERA1 to VERA3 having different values to the bit lines BL corresponding to the respective layers by using the circuit configuration according to this example. That is, a case where the sixth embodiment is realized by the configuration shown in FIG. 32 will be described.

Figure 34:
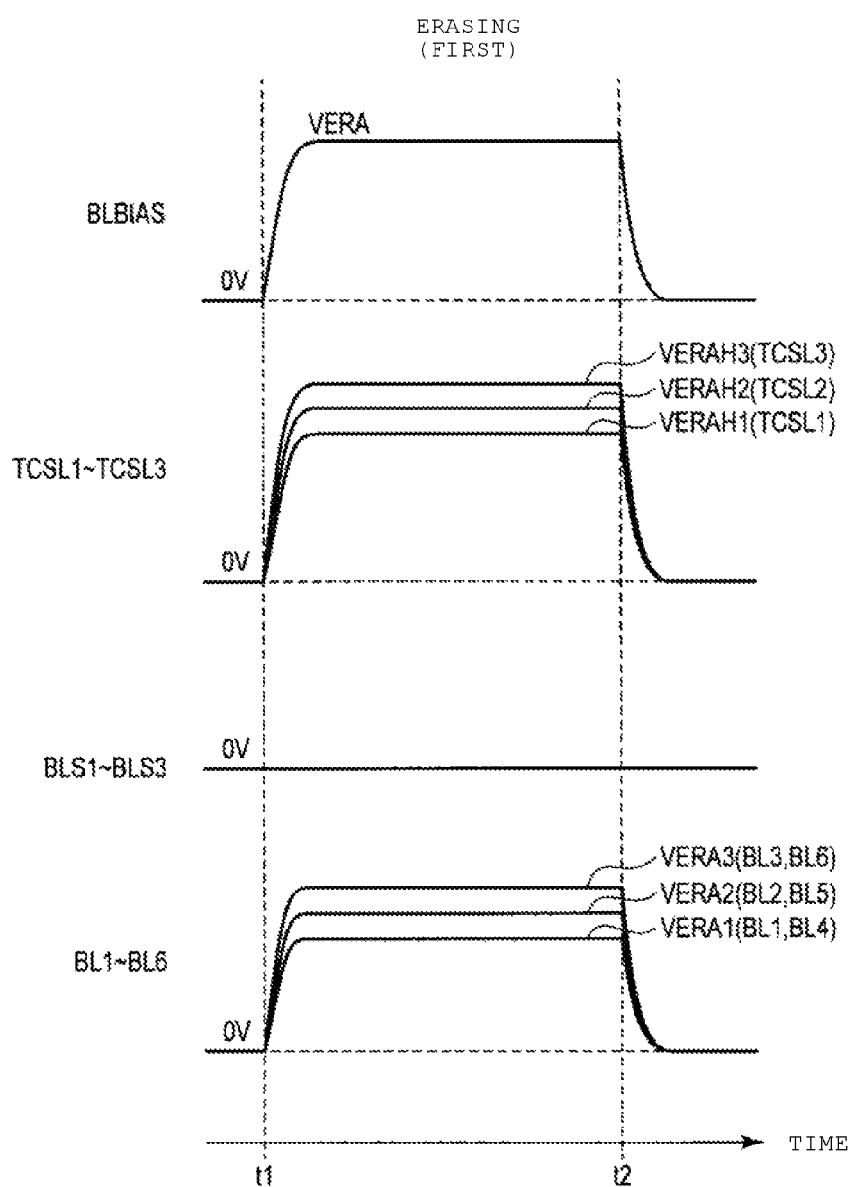
FIG. 34 is a timing chart showing potentials of wirings during data erasing according to the first example of the seventh embodiment.

FIG. 34 is a timing chart showing potentials of wirings of the bit line connection portion 116 according to this example. As shown in the drawing, the driver 124 applies VERA to the wiring BLBIAS. Then, the control unit 121 applies, for example, 0 V to the signal lines BLS1 to BLS3 and sets all of the transistors 41 to be in an off-state. In addition, the control unit 121 applies VERAH1 to the signal line TCSL1 corresponding to the lowermost layer, applies VERAH2 to the signal line TCSL2 corresponding to the intermediate layer, and applies VERAH3 to the signal line TCSL3 corresponding to the uppermost layer. Here, the magnitudes of the voltage values of VERAH1 to VERAH3 increase as the signal line corresponds to a layer having data being less likely to be erased, and the magnitudes thereof have a relationship of VERAH1<VERAH2<VERAH3.

Here, a maximum voltage that may be transferred to the bit line BL by the transistor 40 is set to a value obtained by subtracting the threshold voltage Vt of the transistor 40 from a gate voltage. Accordingly, a maximum voltage of VERA1 transferred to the bit lines BL1 and BL4 corresponding to the lowermost layer is set to VERAH1−Vt. Similarly, a maximum voltage of VERA2 transferred to the bit lines BL2 and BL5 corresponding to the intermediate layer is set to VERAH2−Vt, and a maximum voltage of VERA3 transferred to the bit lines BL3 and BL6 corresponding to the uppermost layer is set to VERAH3−Vt. Accordingly, the magnitudes of the maximum voltage values of VERA1 to VERA3 transferred to the bit lines BL have a relationship of VERA1<VERA2<VERA3.

As described above, in this example, VERA1 to VERA3 having different voltage values are applied to the bit lines BL corresponding to the respective layers by changing the voltages of the signal lines TCSL1 to TCSL3.

Figure 35:
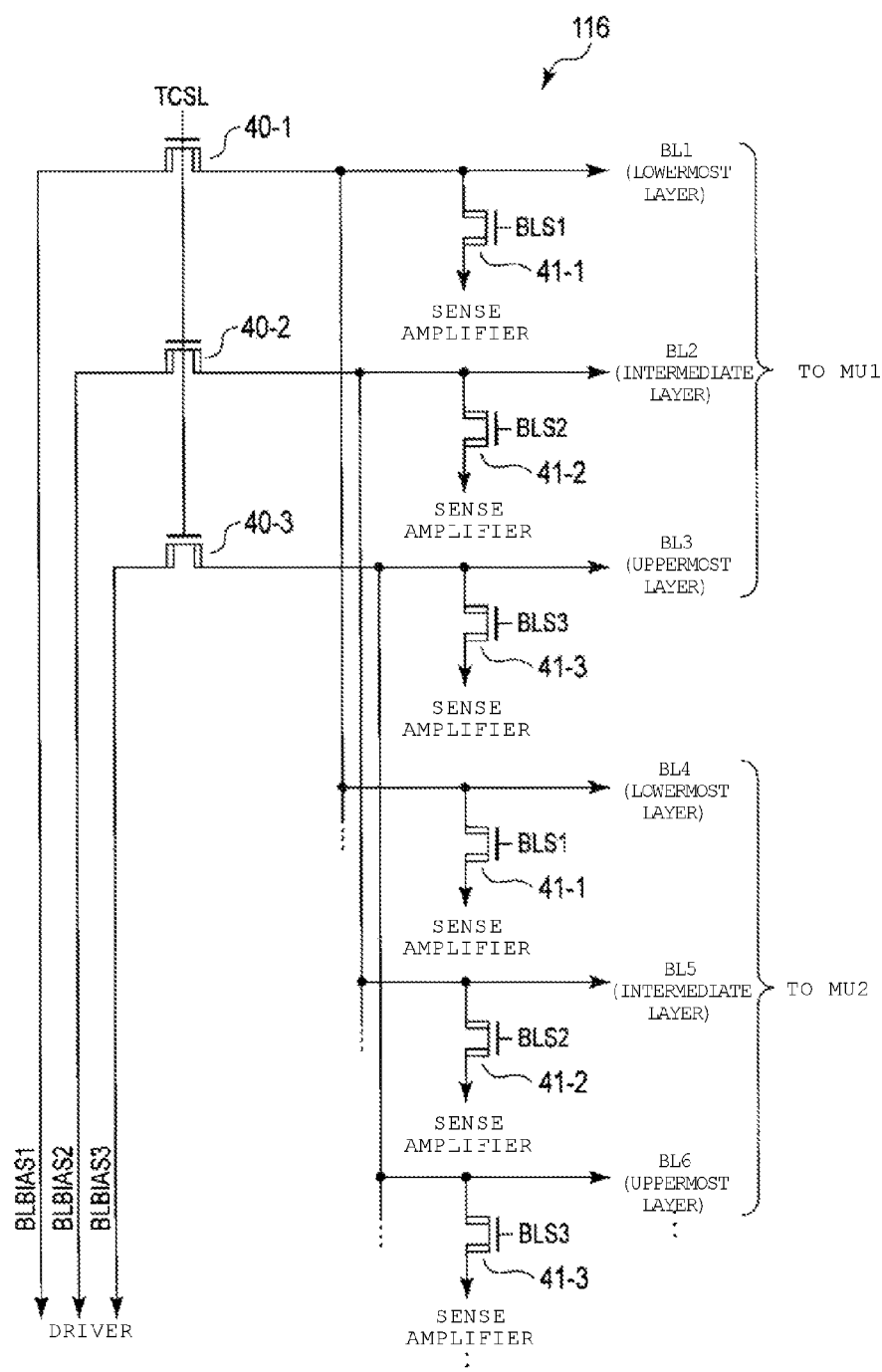
FIG. 35 is a circuit diagram of a bit line connection portion according to a second example of the seventh embodiment.

7.2 Second Example 7.2.1 With Regard to Configuration According to Second Example Next, the configuration of the bit line connection portion 116 according to a second example of this embodiment will be described. Unlike the first example, in this example, the gate of each of the transistors 40-1 to 40-3 is connected in common to the signal line TCSL, and one end of the current path of the transistor is connected to each of the wirings BLBIAS1 to BLBIAS3 which is different for each layer. Accordingly, the configuration according to this example has a structure in which a voltage may be supplied to the transistors 40-1 to 40-3 under different conditions by the control of the driver 124. FIG. 35 is a circuit diagram of the bit line connection portion 116 according to this example. Meanwhile, here, only differences from the first example will be described.

As shown in the drawing, in the transistors 40-1 to 40-3, the gates thereof are connected in common to the signal line TCSL. In the transistor 40-1, one end of the current path thereof is connected to the wiring BLBIAS1, and the other end thereof is connected to any of the corresponding bit lines BL1, BL4, BL7, . . . BL (3i+1). In the transistor 40-2, one end of the current path thereof is connected to the wiring BLBIAS2, and the other end thereof is connected to any of the corresponding bit lines BL2, BL5, BL8, . . . BL (3i+2). In the transistor 40-3, one end of the current path thereof is connected to the wiring BLBIAS3, and the other end thereof is connected to any of the corresponding bit lines BL3, BL6, BL9, . . . BL (3i+3).

7.2.2 With Regard to Operation During Erasing Operation

Next, an operation of the bit line connection portion 116 according to this example during erasing will be described.

First, the control unit 121 applies VERAH to the signal line TCSL and sets all of the transistors 40-1 to 40-3 to be in an on-state. In addition, the control unit 121 applies, for example, 0 V to the signal lines BLS1 to BLS3 and sets all of the transistors 41-1 to 41-3 in an off-state. Then, the driver 124 applies VERA to the wiring BLBIAS corresponding to a layer being a target for erasing and applies a voltage (for example, 10 V) which does not cause GIDL to the wiring BLBIAS which is not a target for erasing. Thus, the transistor 40 transfers VERA to the bit line BL corresponding to a layer being a target for erasing and transfers a voltage that does not cause GIDL to the bit line BL corresponding to a layer which is not a target for erasing. Meanwhile, the voltage that does not cause GIDL may be supplied by the sense amplifier 113 through the transistor 41. In this case, the control unit 121 electrically disconnects the driver 124 from the wiring BLBIAS corresponding to the layer which is not a target for erasing. Further, the control unit 121 sets the transistor 41 corresponding to a layer which is not a target for erasing to be in an on-state. In this state, the sense amplifier 113 applies a voltage (for example, approximately 10 V) which does not cause GIDL to the bit line BL corresponding to a layer which is not a target for erasing, through the transistor 41.

In this example, a voltage that does not cause GIDL is applied to the bit line BL corresponding to a layer which is not a target for erasing. However, the driver 124 and the sense amplifier 113 may be electrically separated from the bit line, and the bit line BL may be set to be in a floated state. In addition, the wirings BLBIAS1 to BLBIAS3 are shared between the memory units MU.

7.2.3 With Regard to Change of Erasing Pulse Width for Each Layer

Next, a description will be given of a method of applying different periods and VERA to the bit lines BL corresponding to the respective layers by using the circuit configuration according to this example. That is, an operation when the fifth embodiment is realized by the configuration shown in FIG. 35 will be described.

Figure 36:
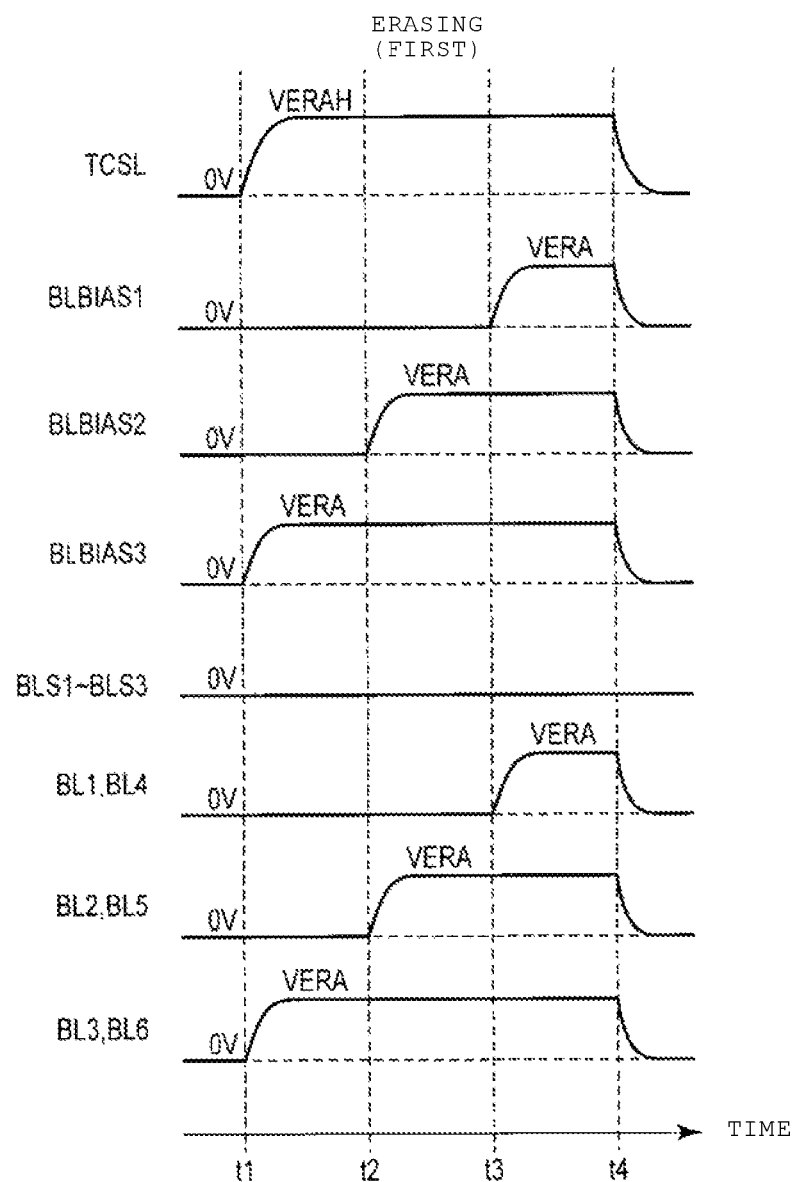
FIG. 36 is a timing chart showing potentials of wirings during data erasing according to the second example of the seventh embodiment.

FIG. 36 is a timing chart showing potentials of wirings of the bit line connection portion 116 according to this example. As shown in the drawing, first, the control unit 121 applies VERAH to the signal line TCSL at time t1 and sets all of the transistors 40 to be in an on-state. In addition, the driver 124 applies VERA to the wiring BLBIAS3 corresponding to the uppermost layer. Thus, the transistor 40-3 transfers VERA to the bit lines BL3 and BL6 corresponding to the uppermost layer.

Next, the driver 124 applies VERA to the wiring BLBIAS2 corresponding to the intermediate layer at time t2. Thus, the transistor 40-2 transfers VERA to the bit lines BL2 and BL5 corresponding to the intermediate layer.

Next, the driver 124 applies VERA to the wiring BLBIAS1 corresponding to the lowermost layer at time t3. Thus, the transistor 40-1 transfers a voltage VERA to the bit lines BL1 and BL4 corresponding to the lowermost layer.

Finally, the control unit 121 applies, for example, 0 V to the signal line TCSL at time t4 and sets the transistor 40 to be in an off-state. In addition, the driver 124 applies, for example, 0 V to the wirings BLBIAS1 to BLBIAS3. Thus, the transfer of VERA to the bit line BL is terminated.

In addition, the control unit 121 applies, for example, 0 V to the signal lines BLS1 to BLS3 in the meantime (time t1 to t4), and sets all of the transistors 41 to be in an off-state.

Accordingly, the transistor 40-3 transfers VERA to the bit lines BL3 and BL6 for a period between time t1 and time t4. The transistor 40-2 transfers VERA to the bit lines BL2 and BL5 for a period between time t2 and time t4. The transistor 40-1 transfers VERA to the bit lines BL1 and BL4 for a period between time t3 and time t4.

As described above, in this example, voltages VERA having different erasing pulse widths are applied to the bit lines BL corresponding to the respective layers by changing a period for which VERA is applied to the wirings BLBIAS1 to BLBIAS3.

7.2.4 With Regard to Change of Erasing Voltage for Each Layer

Next, a description will be given of a method of applying VERA1 to VERA3 having different values to the bit lines BL corresponding to the respective layers by using the circuit configuration according to this example. That is, a case where the sixth embodiment is realized by the configuration shown in FIG. 35 will be described.

Figure 37:
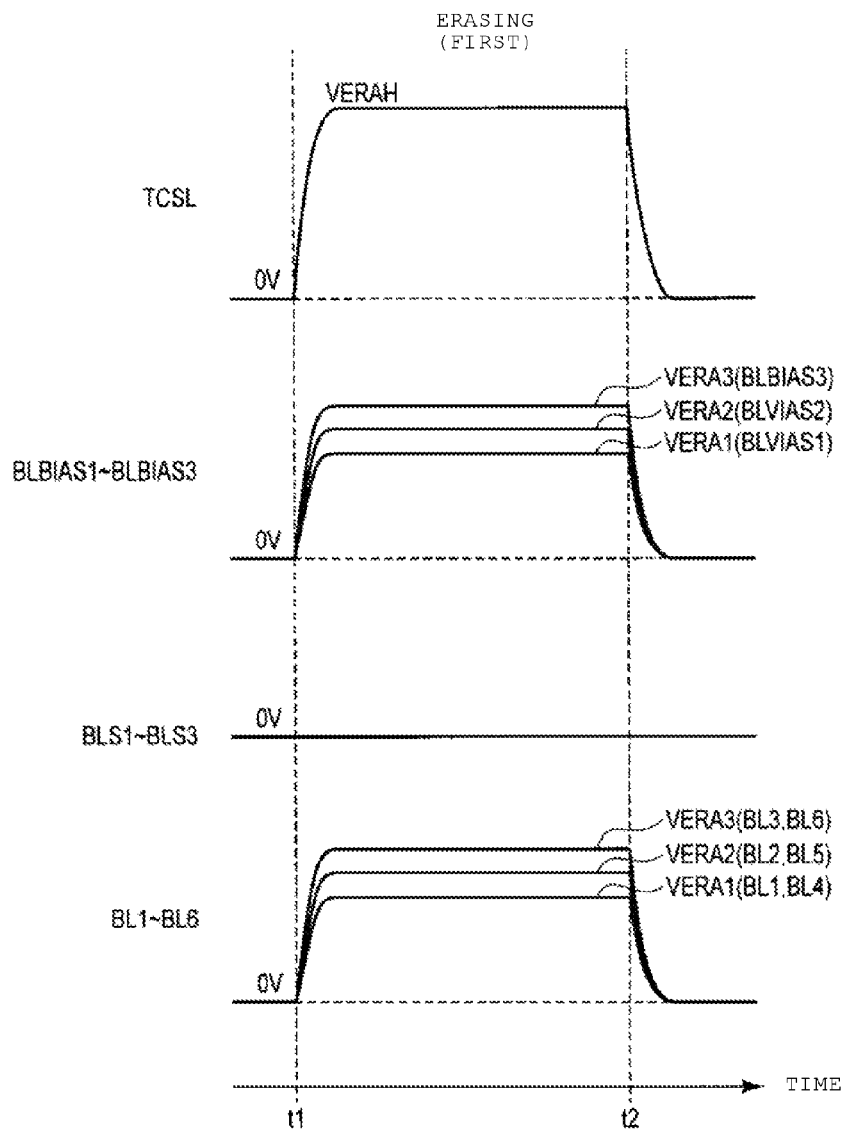
FIG. 37 is a timing chart showing potentials of wirings during data erasing according to the second example of the seventh embodiment.

FIG. 37 is a timing chart showing potentials of wirings of the bit line connection portion 116 according to this example. As shown in the drawing, the control unit 121 applies VERAH to the signal line TCSL to set all of the transistors 40 to be in an on-state, and applies, for example, 0 V to the signal lines BLS1 to BLS3 to set all of the transistors 41 to be in an off-state. In this state, the driver 124 applies VERA1 to the wiring BLBIAS1 corresponding to the lowermost layer, applies VERA2 to the wiring BLBIAS2 corresponding to the intermediate layer, and applies VERA3 to the wiring BLBIAS3 corresponding to the uppermost layer. Here, the magnitudes of the voltage values of VERA1 to VERA3 increase as the wiring corresponds to a layer having data being less likely to be erased, and the magnitudes thereof have a relationship of VERA1<VERA2<VERA3. In addition, VERAH is set to a value satisfying the relationship of VERAH>VERA3+Vt so that the transistor 40 may transfer VERA3 having the largest voltage value.

Thus, the transistor 40-1 transfers VERA1 to the bit lines BL1 and BL4. The transistor 40-2 transfers VERA2 to the bit lines BL2 and BL5. The transistor 40-3 transfers VERA3 to the bit lines BL3 and BL6.

As described above, in this example, VERA1 to VERA3 having different values are applied to the bit lines BL corresponding to the respective layers by changing a voltage value to be applied to the wirings BLBIAS1 to BLBIAS3.

7.3 Third Example 7.3.1 With Regard to Configuration According to Third Example

Figure 38:
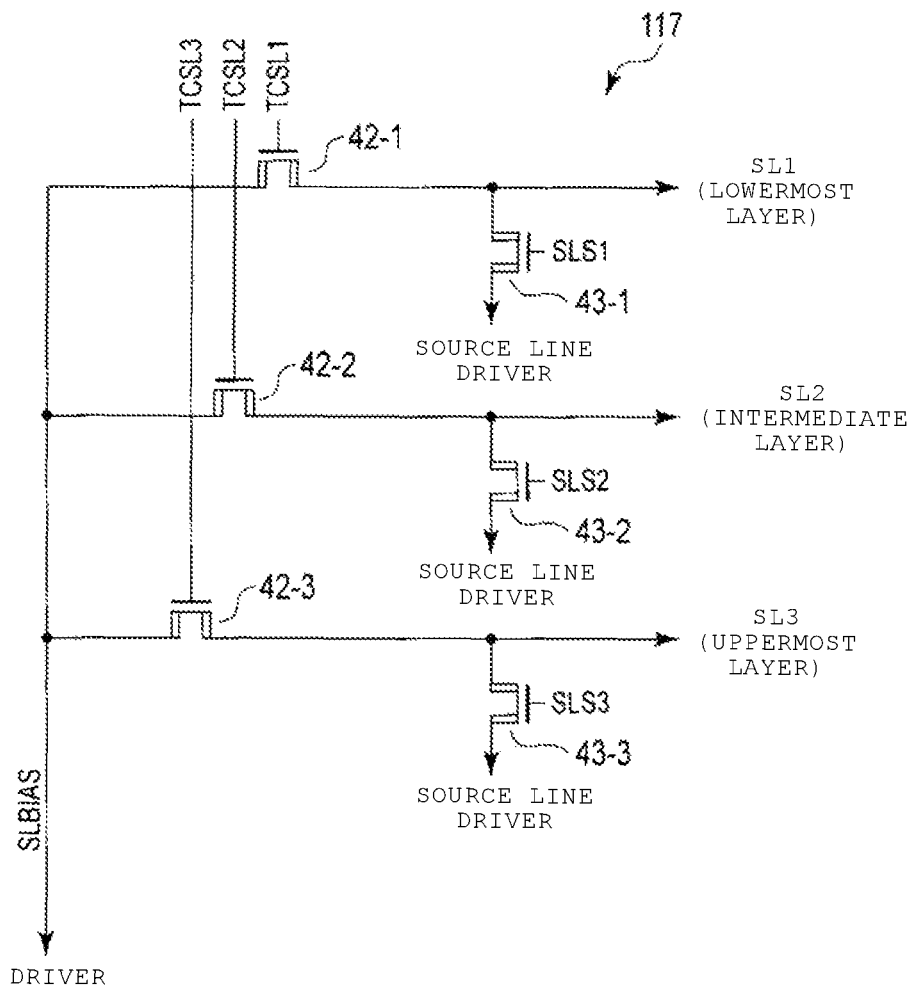
FIG. 38 is a circuit diagram of a source line connection portion according to a third example of the seventh embodiment.

Next, a source line connection portion 117 according to a third example of this embodiment will be described. This example relates to the source line connection portion 117 applicable to the memory cell array 111 described in the second and fourth embodiments. That is, this example may be applied to a configuration in which VERA is applied to the source line SL during data erasing operation. FIG. 38 is a circuit diagram of the source line connection portion 117 according to this example.

As shown in the drawing, the source line connection portion 117 includes N-channel MOS transistors 42-1 to 42-3 and 43-1 to 43-3 having a high breakdown voltage.

In each of the transistors 42-1 to 42-3, one end of the current path thereof is connected to each of the corresponding source lines SL1 to SL3, and the other end thereof is connected in common to a wiring SLBIAS. The wiring SLBIAS is a wiring that connects the driver 124 and the transistor 42. In the transistors 42-1 to 42-3, the gates thereof are connected to the signal lines TCSL1 to TCSL3, respectively.

In each of transistors 43-1 to 43-3, the gate thereof is connected to signal lines SLS1 to SLS3, one end of the current path thereof is connected to each of the corresponding source lines SL1 to SL3, and the other end thereof is connected to the source line driver 114. Here, the signal line SLS is a signal line that transfers a signal from the control unit 121 to the transistor 43 to thereby control on- and off-states of the transistor 43, that is, the electrical connection with the source line driver 114.

7.3.2 With Regard to Operation During Erasing Operation

Next, an operation of the source line connection portion 117 according to this example during erasing will be described.

First, the driver 124 applies VERA to the wiring SLBIAS. The control unit 121 applies VERAH to the signal line TCSL corresponding to a layer being a target for erasing and sets the corresponding transistor 42 to be in an on-state. Further, the control unit 121 applies a voltage (for example, 0 V) for setting the transistor 43 to be in an off-state to the signal line SLS corresponding to a layer being a target for erasing. Thus, the transistor 42 corresponding to a layer being a target for erasing transfers VERA to the corresponding source line SL.

In addition, the control unit 121 applies, for example, 0 V to the signal line TCSL corresponding to a layer which is not a target for erasing and sets the corresponding transistor 42 to be in an off-state. Further, the control unit 121 applies a voltage for setting the transistor 43 to be in an on-state to the signal line SLS corresponding to a layer which is not a target for erasing. Thus, the source line driver 114 applies a voltage that does not cause GIDL to the source line SL corresponding to a layer which is not a target for erasing through the transistor 43 in an on-state.

Meanwhile, it is also possible to apply different periods and VERA to the source lines SL corresponding to the respective layers by using the circuit configuration according to this example. In this case, similarly to the first example, the control unit 121 applies the voltages VERA having different erasing pulse widths to the source lines SL corresponding to the respective layers by changing a period for which VERAH is applied to the signal lines TCSL1 to TCSL3.

In addition, it is also possible to apply VERA1 to VERA3 having different values to the source lines SL corresponding to the respective layers by using the circuit configuration according to this example. In this case, similarly to the first example, the control unit 121 applies VERA1 to VERA3 having different values to the source lines SL corresponding to the respective layers by changing the values of VERAH1 to VERAH3 applied to the signal lines TCSL1 to TCSL3.

Figure 39:
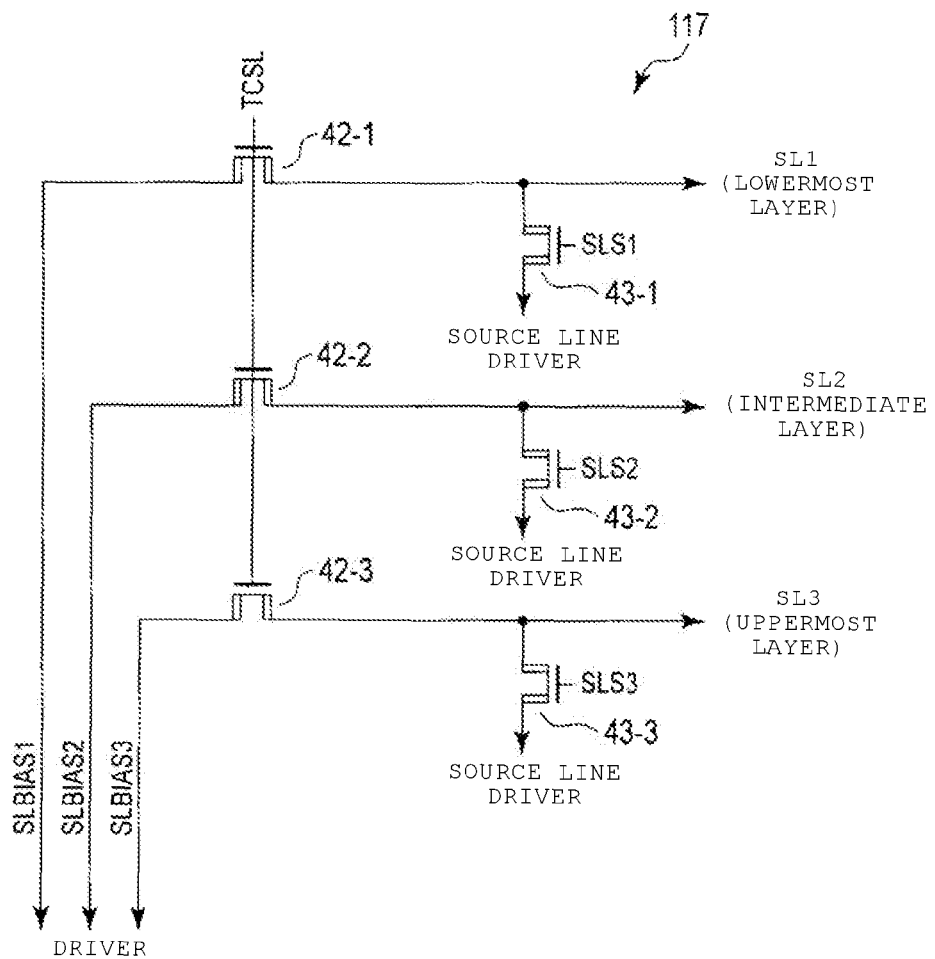
FIG. 39 is a circuit diagram of a source line connection portion according to a fourth example of the seventh embodiment.

7.4 Fourth Example 7.4.1 With Regard to Configuration According to Fourth Example Next, the source line connection portion 117 according to a fourth example of this embodiment will be described. Unlike the third example, in this example, the gate of each of the transistors 42-1 to 42-3 is connected in common to the signal line TCSL, and one end of the current path of the transistor is connected to each of the wirings SLBIAS1 to SLBIAS3 which is different for each layer. Accordingly, similarly to the second example the configuration according to this example has a structure in which a voltage may be supplied to the transistors 42-1 to 42-3 under different conditions by the control of the driver 124. FIG. 39 is a circuit diagram of the source line connection portion 117 according to this example. Meanwhile, here, only differences from the third example will be described.

As shown in the drawing, in the transistors 42-1 to 42-3, the gates thereof are connected in common to the signal line TCSL. In the transistor 42-1, one end of the current path thereof is connected to the wiring SLBIAS1. In the transistor 42-2, one end of the current path thereof is connected to the wiring SLBIAS2. In the transistor 42-3, one end of the current path thereof is connected to the wiring SLBIAS3. In the transistors 42-1 to 42-3, the other ends of the current paths thereof are connected to the corresponding source lines SL1 to SL3, respectively.

7.4.2 With Regard to Operation During Erasing Operation

Next, an operation of the source line connection portion 117 according to this example during erasing will be described.

First, the control unit 121 applies VERAH to the signal line TCSL and sets all of the transistors 42-1 to 42-3 to be in an on-state. In addition, the control unit 121 applies, for example, 0 V to the signal lines SLS1 to SLS3 and sets the transistors 43-1 to 43-3 to be in an off-state. In this state, the driver 124 applies VERA to the wiring SLBIAS corresponding to a layer being a target for erasing and applies a voltage (for example, approximately 10 V) which does not cause GIDL to the wiring SLBIAS corresponding to a layer which is not a target for erasing. The transistors 42 transfer these voltages to the source lines SL1 to SL3, respectively.

Meanwhile, it is also possible to apply different periods and VERA to the source lines SL corresponding to the respective layers by using the circuit configuration according to this example. In this case, similarly to the second example, the driver 124 changes a period for which VERA is applied to the wirings SLBIAS1 to SLBIAS3, and thus the voltages VERA having different erasing pulse widths are applied to the source lines SL corresponding to the respective layers.

In addition, it is also possible to apply VERA1 to VERA3 having different values to the source lines SL corresponding to the respective layers by using the circuit configuration according to this example. In this case, similarly to the second example, the driver 124 applies VERA1 to VERA3 to the wirings SLBIAS1 to SLBIAS3, respectively, and thus VERA1 to VERA3 are applied to the source lines SL corresponding to the respective layers. In addition, as described in the second example, a voltage that does not causing GIDL may be supplied by the sense amplifier through the transistor 41.

7.5 Effects According to this Embodiment

As described above, it is possible to apply, for example, the configuration according to this embodiment in order to realize the erasing operations described in the first, second, and fourth to sixth embodiments.

8. Eighth Embodiment

Next, a semiconductor memory device and a data erasing method according to an eighth embodiment will be described. In this embodiment, a plurality of layers are managed in units of zones, that is, a plurality of layers are collected in one zone and retry determination is performed for each zone in the first to seventh embodiments. Hereinafter, when this embodiment is applied to the semiconductor memory device according to the first embodiment as an example, only differences from the first embodiment will be described.

8.1 With Regard to Data Erasing Operation

Figure 40:
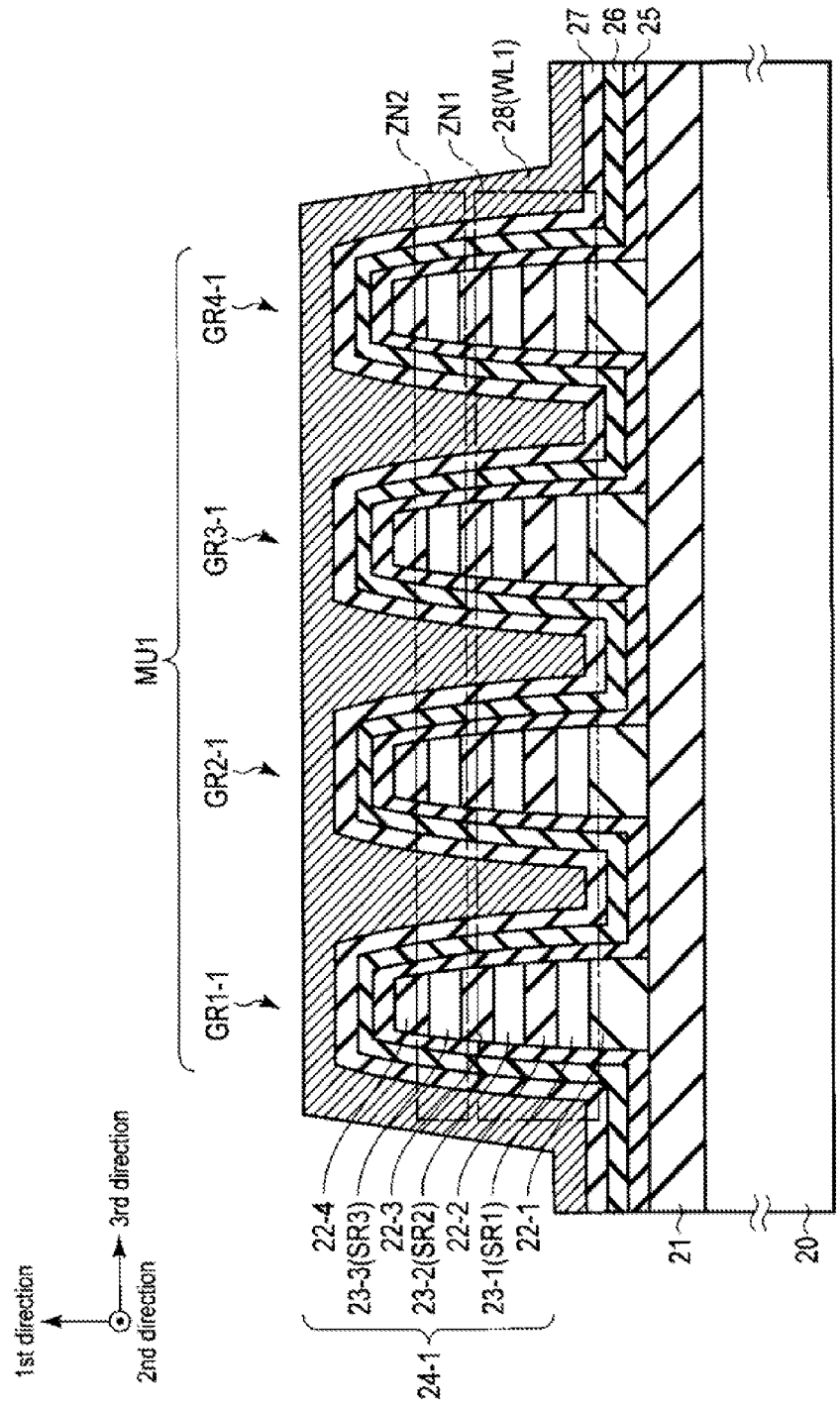
FIG. 40 is a cross-sectional view of a memory cell array according to an eighth embodiment.

First, a zone according to this embodiment will be described. FIG. 40 is a cross-sectional view of string groups GR1-1 to GR4-1 and shows a cross-section formed in a first direction and a third direction. In the example shown in the drawing, NAND strings SR1 and SR2 are set to be a zone ZN1, and a NAND string SR3 is set to be a zone ZN2.

Meanwhile, here, the lowermost layer and the intermediate layer are set to be the zone ZN1, and the uppermost layer is set to be the zone ZN2. However, the lowermost layer may be set to be the zone ZN1, and the intermediate layer and the uppermost layer may be set to be the zone ZN2. In addition, three or more zones ZN may be provided according to the number of stacked NAND strings SR, and the zone ZN may be arbitrarily set.

Figure 41:
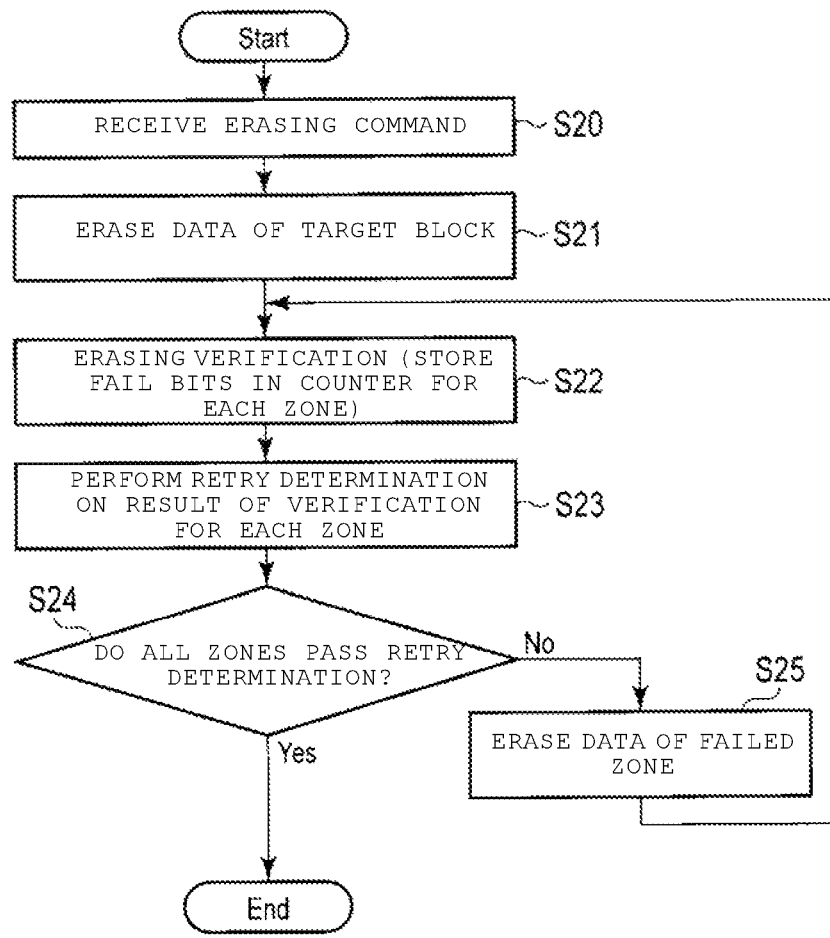
FIG. 41 is a flow chart showing a data erasing operation according to the eighth embodiment.

Next, an erasing operation according to this embodiment will be described. FIG. 41 is a flowchart showing the erasing operation according to this embodiment. As shown in the drawing, a general flow of the configuration according to this embodiment is the same as that of FIG. 9 described in the first embodiment. This embodiment is different from FIG. 9 in that erasing, erasing verification, and retry determination are performed in units of zones ZN.

Figure 42:
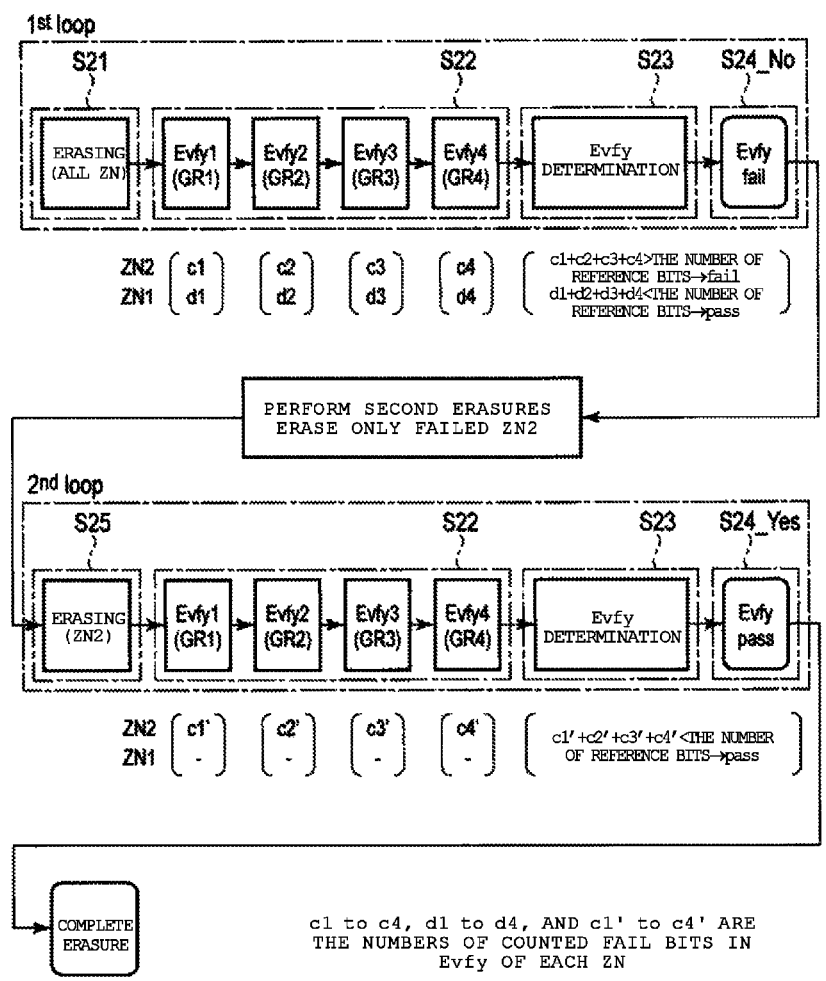
FIG. 42 is a flow chart showing an example of the data erasing operation according to the eighth embodiment.

Next, the erasing operation according to this embodiment will be described with reference to a case where retry determination is passed through two erasing operations, as a specific example. FIG. 42 shows a processing flow in this embodiment.

As shown in the drawing, first, a control unit 121 receives an erasing command from a controller 200 (step S20).

Next, the control unit 121 erases data of all memory cell transistors MT of the zones ZN1 and ZN2 (step S21).

Next, the control unit 121 performs erasing verification (step S22) in units of string groups GR. That is, first, the control unit 121 performs erasing verification on the zones ZN1 and ZN2 in the string group GR1 (Evfy1). Then, a counter 125 counts the number of fail bits. Specifically, the counter counts the number of fail bits that are present in bit lines BL1, BL2, BL4, BL5, BL7, BL8, . . . BL (3i+1), and BL (3i+2) corresponding to the zone ZN1 of the string group GR1. At this time, in this example, it is assumed that d1 fail bits are found (counted number=d1). Here, d1 is equivalent to a1+b1 in FIG. 10 described in the first embodiment. In addition, the counter 125 counts the number of fail bits that are present in bit lines BL3, BL6, BL9, . . . BL (3i+3) corresponding to the zone ZN2. At this time, in this example, it is assumed that c1 fail bits are found (counted number=c1). Then, the counter 125 causes the counted numbers d1 and c1 to be held in any latch circuit.

Thereafter, similarly, the control unit 121 performs the erasing verifications of the string groups GR2 to GR4 (Evfy2 to Evfy4). In the erasing verifications, it is assumed that the number of fail bits found in the zone ZN1 is d2 to d4 and the number of fail bits found in the zone ZN2 is c2 to c4.

Next, the control unit 121 performs retry determination (Evfy determination) (step S23). That is, the control unit 121 sums up the number of fail bits for each zone ZN and compares the summed-up number with the number of determination reference bits. As a result, it is assumed that the relationship of the sum of the numbers of fail bits of the zone ZN1 (d1+d2+d3+d4)<the number of determination reference bits and the relationship of the sum of the numbers of fail bits of the zone ZN2 (c1+c2+c3+c4)>the number of determination reference bits are established. Then, the control unit 121 determines that the zone ZN1 passes the retry determination and the zone ZN2 fails in the retry determination (step S24, No).

Next, the control unit 121 performs two erasing operations of the zone ZN2 failing in the retry determination (step S25).

Next, the control unit 121 performs the erasing verification (step S22) and the retry determination (step S23) of the zone ZN2. At this time, it is assumed that the number of fail bits of the zone ZN2 is $c1'$ to $c4'$. In addition, it is assumed that the relationship of $(c1'+c2'+c3'+c4')<$the number of determination reference bits is established. Then, the control unit 121 determines that the zone ZN2 passes the retry determination (step S24, Yes), and terminates the data erasing operation.

Meanwhile, in this example, the number of corresponding layers is different for each of the zones ZN1 and ZN2, and thus the number of determination reference bits may be set differently depending on the zones ZN.

Here, a case where this embodiment is applied to the first embodiment is described, but it is possible to apply this embodiment by managing a plurality of layers in units of zones also in the second to seventh embodiments.

8.3 Effects According to this Embodiment

In the configuration according to this embodiment, the same effects as those in the first to seventh embodiments described above are obtained.

In the configuration according to this embodiment, a plurality of layers is collectively managed. For this reason, it is possible to reduce the number of counters that count the number of fail bits and the number of latch circuits that store the counted number. In addition, for example, in the bit line connection portion of FIG. 32, the same number of transistors 40 as the number of layers are required, but it is possible to reduce the number of transistors 40 to the same number of transistors as the number of zones through zone management. In this manner, it is possible to reduce the number of circuit elements through zone management.

9. Ninth Embodiment

Next, a semiconductor memory device and a data erasing method according to a ninth embodiment will be described. In this embodiment, data of memory cell transistors MT adjacent to each other are alternately erased (hereinafter, referred to as "stripe erase") in the first to eighth embodiments described above. Hereinafter, only differences from the first to eighth embodiments will be described.

9.1 With Regard to General Flow of Data Erasing Operation

First, a general flow of a data erasing operation of this embodiment will be described.

In this embodiment, a case where stripe erasing is performed with a structure in which the layers of each of the string groups GR1-1 to GR4-1 of the memory unit MU1 are stacked in four layers, that is, the NAND strings SR1 to SR4 are stacked in the first to eighth embodiments described above will be described as an example. However, the configuration of the string group GR is not limited thereto, and the number of layers may be three or less or may be five or more.

Figure 43:
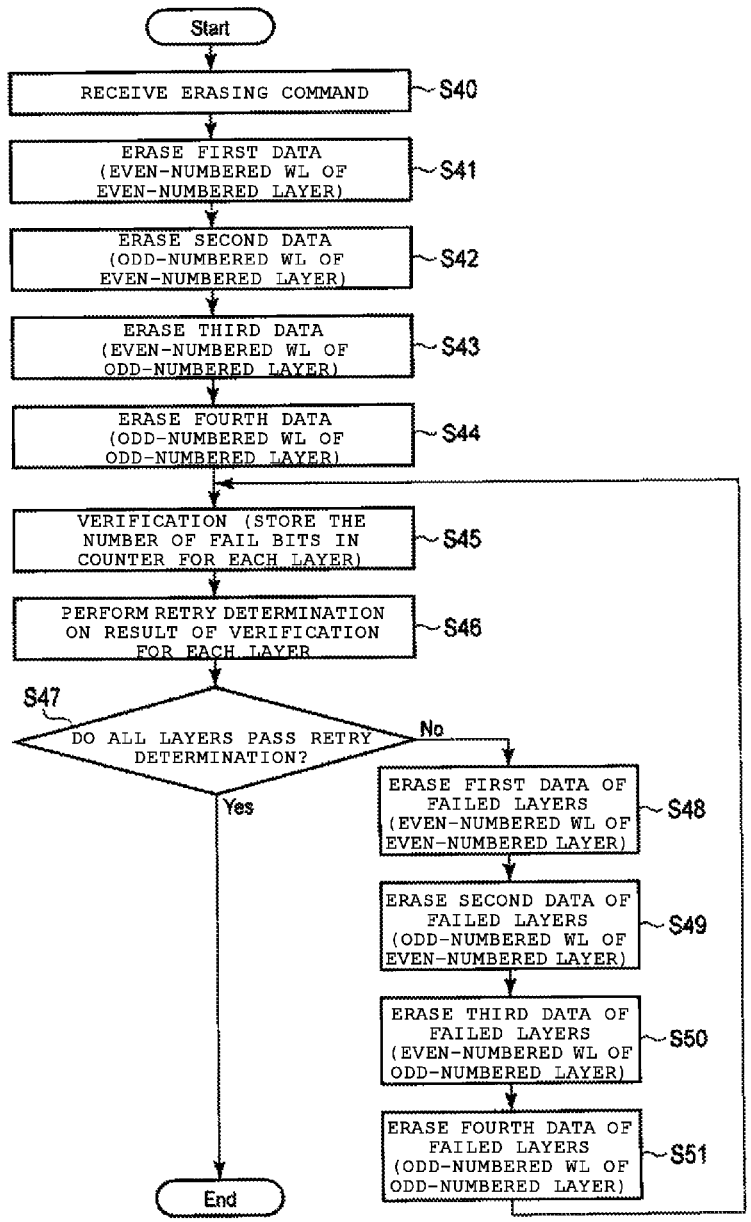
FIG. 43 is a flow chart showing a data erasing operation according to a ninth embodiment.

FIG. 43 is a flow chart showing a flow of a data erasing operation.

As shown in the drawing, first, a control unit 121 receives an erasing command from a controller 200 (step S40).

Next, the control unit 121 performs first to fourth data erasing operations in response to the erasing command.

Figure 44:
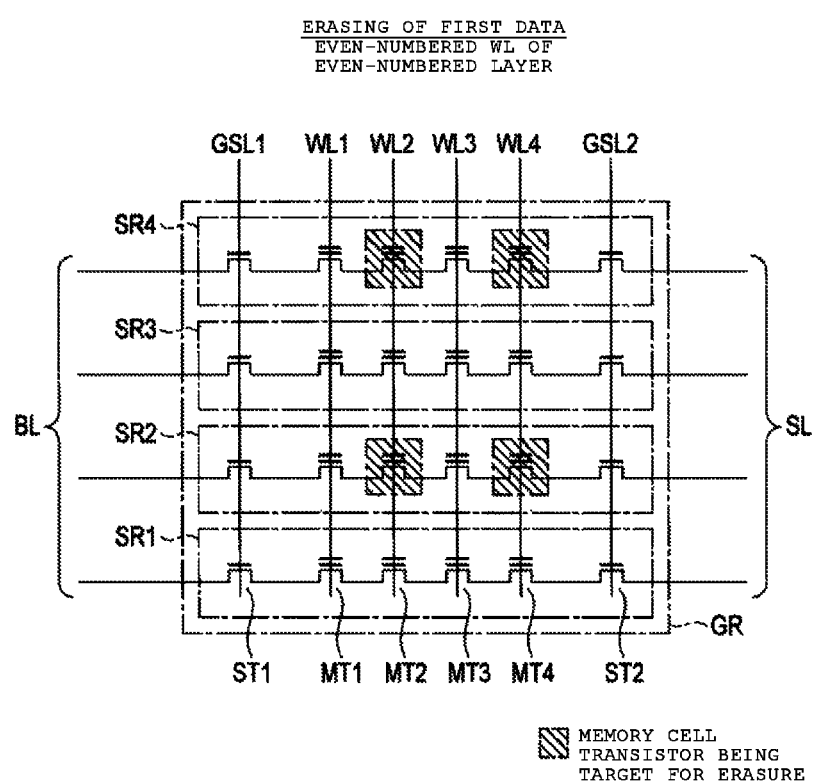
FIG. 44 is a circuit diagram of a string group, showing memory cell transistors that are erasing targets, which has a first pattern of data erasing according to the ninth embodiment.

First, in the first data erasing operation, the control unit 121 erases data of the memory cell transistors MT connected to even-numbered word lines WL of even-numbered layers (step S41). FIG. 44 shows memory cell transistors MT that are erasing targets of a certain memory cell group GR in the first data erasing operation. As shown in the drawing, the control unit 121 erases data of the memory cell transistors MT2 and MT4 that are formed in the NAND strings SR2 and SR4 and are connected to the even-numbered word lines WL2 and WL4.

Figure 45:
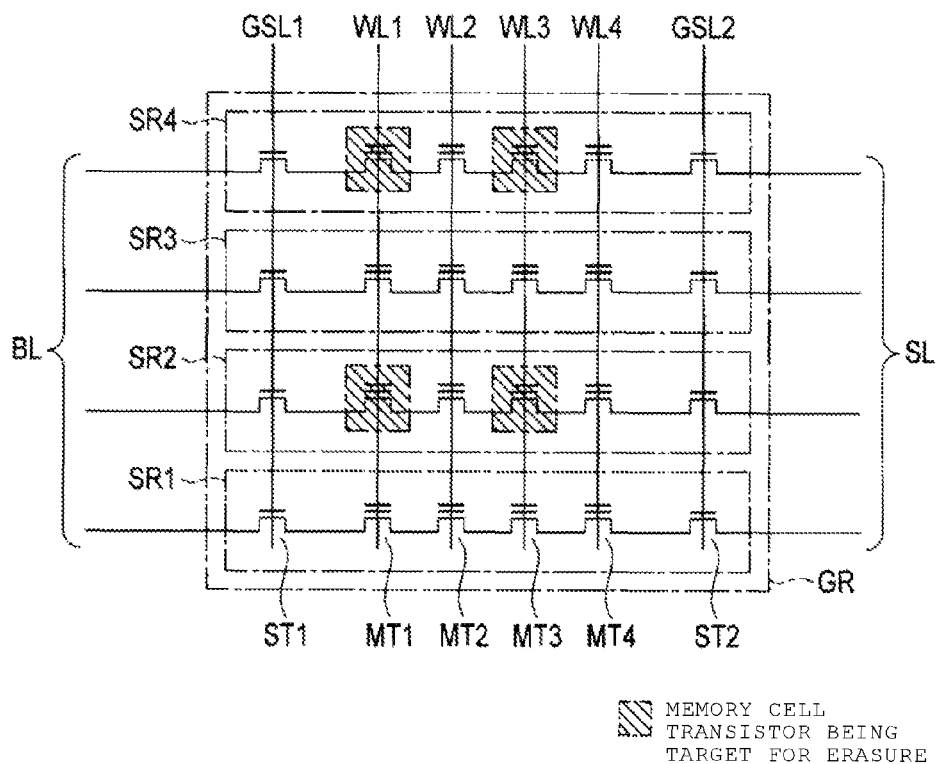
FIG. 45 is a circuit diagram of a string group, showing memory cell transistors that are erasing targets, which has a second pattern of data erasing according to the ninth embodiment.

Next, in the second data erasing operation, the control unit 121 erases data of the memory cell transistors MT connected to the odd-numbered word lines WL of the even-numbered layers (step S42). FIG. 45 shows memory cell transistors MT that are erasing targets of a certain memory cell group GR in the second data erasing operation. As shown in the drawing, the control unit 121 erases data of the memory cell transistors MT1 and MT3 that are formed in the NAND strings SR2 and SR4 and are connected to the odd-numbered word lines WL1 and WL3.

Figure 46:
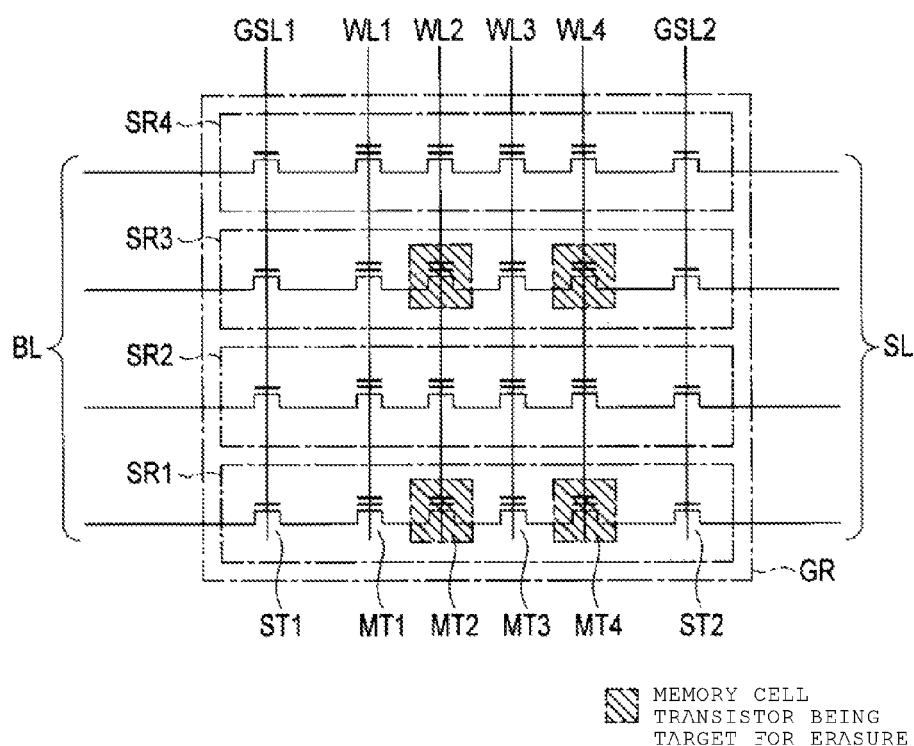
FIG. 46 is a circuit diagram of a string group, showing memory cell transistors that are erasing targets, which has a third pattern of data erasing according to the ninth embodiment.

Next, in the third data erasing operation, the control unit 121 erases data of the memory cell transistors MT connected to the even-numbered word lines WL of the odd-numbered layers (step S43). FIG. 46 shows memory cell transistors MT that are erasing targets of a certain memory cell group GR in the third data erasing operation. As shown in the drawing, the control unit 121 erases data of the memory cell transistors MT2 and MT4 that are formed in the NAND strings SR1 and SR3 and are connected to the even-numbered word lines WL2 and WL4.

Figure 47:
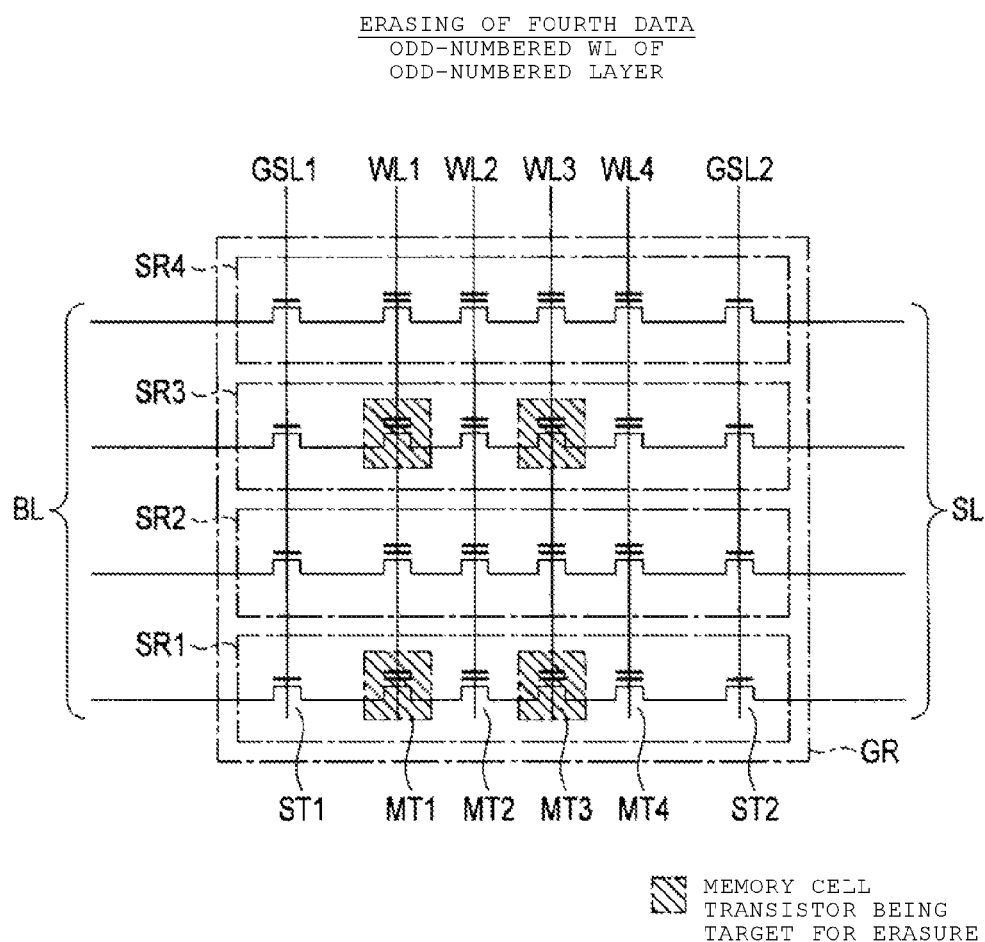
FIG. 47 is a circuit diagram of a string group, showing memory cell transistors that are erasing targets, which has a fourth pattern of data erasing according to the ninth embodiment.

Next, in the fourth data erasing operation, the control unit 121 erases data of the memory cell transistors MT connected to the odd-numbered word lines WL of the odd-numbered layers (step S44). FIG. 47 shows memory cell transistors MT that are erasing targets of a certain memory cell group GR in the fourth data erasing operation. As shown in the drawing, the control unit 121 erases data of the memory cell transistors MT1 and MT3 that are formed in the NAND strings SR1 and SR3 and are connected to the odd-numbered word lines WL1 and WL3.

The data of all of the memory cell transistors MT are erased in a block BLK that is an erasing target through the above-mentioned first to fourth data erasing operations.

Next, the control unit 121 performs erasing verification (step S45), and then performs retry determination (step S46).

When passing the retry determination (step S47, Yes), the data erasing operation is terminated.

When failing in the retry determination (step S47, No), the operation proceeds to step S48 to perform the stripe erasing of a layer failing in the retry determination (step S48 to step S51).

Then, the erasing is repeatedly performed until all of the layers pass the retry determination (step S47 Yes) or until the number of erasing loops which is set in advance reaches an upper limit.

Meanwhile, here, the order of the first to fourth data erasing operations may be changed.

Some methods may be adopted as a specific method of performing the above-mentioned erasing operation. Hereinafter, two examples thereof will be described.

9.2 First Example

In this example, data is erased using GIDL. That is, this example may correspond to the semiconductor memory device according to the first, second, and fourth to eighth embodiments using GIDL erasing operation.

Figure 48:
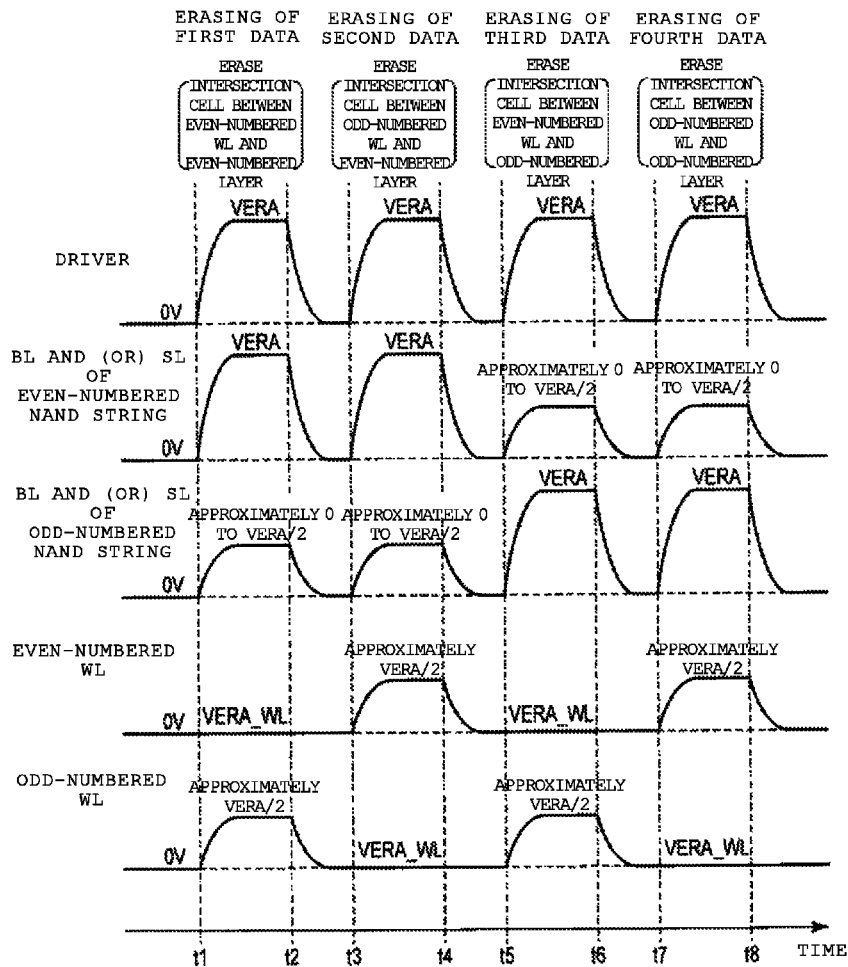
FIG. 48 is a timing chart showing potentials of wirings during data erasing according to a first example of the ninth embodiment.

FIG. 48 is a timing chart showing an output potential from the driver 124, the potentials of the bit lines BL and/or the source lines SL, and the potentials of the word lines WL which correspond to the first to fourth data erasing operations (step S41 to step S44) of FIG. 43. Meanwhile, the potentials of the other wirings which are not described herein are as described in the first, second, and fourth to eighth embodiments. In addition, here, only wirings regarding the memory unit MU1 are described, but the same description applies to other memory units MU that are erasing targets.

First, in the first data erasing (time t1 to t2), the driver 124 applies VERA to the bit lines BL2 and BL4 and/or the source lines SL2 and SL4 corresponding to the even-numbered NAND strings SR2 and SR4 that are erasing targets.

For example, the sense amplifier 113 or the source line driver 114 applies a voltage (for example, approximately a half voltage of 0 V to VERA) which does not cause GIDL to the bit lines BL1 and BL3 and/or the source lines SL1 and SL3.

In this state, the row decoder 112 applies VERA_WL (for example, 0 V) to the even-numbered word lines WL2 and WL4 that are targets, and applies a voltage (for example, approximately a half voltage of VERA) at which holes generated due to GIDL are not injected into the memory cell transistor MT, to the odd-numbered word lines WL1 and WL3 which are not erasing targets. Thus, GIDL occurs in the even-numbered NAND strings SR2 and SR4, and the data of the memory cell transistors MT2 and MT4 connected to the even-numbered word lines WL2 and WL4 are erased.

For example, when this embodiment is applied to the first embodiment, the driver 124 applies VERA to the bit lines BL2 and BL4, and the sense amplifier 113 applies a voltage that does not cause GIDL to the bit lines BL1 and BL3. In addition, when this embodiment is applied to the second embodiment, the driver 124 applies VERA to the source lines SL2 and SL4, and the source line driver 114 applies a voltage that does not cause GIDL to the source lines SL1 and SL3. In addition, when this embodiment is applied to the fourth embodiment, the driver 124 applies VERA to the bit lines BL2 and BL4 and the source lines SL2 and SL4.

Next, similarly to the first data erasing operation, in the second data erasing (time t3 to t4), the control unit 121 causes GIDL in the even-numbered NAND strings SR2 and SR4 that are erasing targets. In this state, the row decoder 112 applies VERA_WL (for example, 0 V) to the odd-numbered word lines WL1 and WL3 that are erasing targets and applies a voltage (for example, approximately a half voltage of VERA), to the even-numbered word lines WL2 and WL4 which are not erasing targets. Thus, in the second data erasing operation, GIDL occurs in the even-numbered NAND strings SR2 and SR4, and the data of the memory cell transistors MT1 and MT3 connected to the odd-numbered word lines WL1 and WL3 are erased.

Next, in the third data erasing (time t5 to t6), the driver 124 applies VERA to the bit lines BL1 and BL3 and/or the source lines SL1 and SL3. For example, the sense amplifier 113 or the source line driver 114 applies a voltage (for example, approximately a half voltage of 0 V to VERA) which does not cause GIDL to the bit lines BL2 and BL4 and/or the source lines SL2 and SL4. In this state, the row decoder 112 applies VERA_WL (for example, 0 V) to the even-numbered word lines WL2 and WL4 that are erasing targets, and applies a voltage (for example, approximately a half voltage of VERA), to the odd-numbered word lines WL1 and WL3 which are not erasing targets. Thus, in the third data erasing operation, GIDL occurs in the odd-numbered NAND strings SR1 and SR3, and the data of the memory cell transistors MT2 and MT4 connected to the even-numbered word lines WL2 and WL4 are erased.

Next, similarly to the third data erasing operation, in the fourth data erasing (time t7 to t8), the control unit 121 causes GIDL in the odd-numbered NAND strings SR1 and SR3 that are erasing targets. In this state, the row decoder 112 applies VERA_WL (for example, 0 V) to the odd-numbered word lines WL1 and WL3 that are erasing targets and applies a voltage (for example, approximately a half voltage of VERA) to the even-numbered word lines WL2 and WL4 which are not erasing targets. Thus, in the fourth data erasing operation, GIDL occurs in the odd-numbered NAND strings SR1 and SR3, and the data of the memory cell transistors MT1 and MT3 connected to the odd-numbered word lines WL1 and WL3 are erased.

The data erasing of a block BLK being a target for erasing is completed by the above-mentioned four steps.

9.3 Second Example

In this example, data is erased using an FN tunnel effect. That is, this example may be applied to the third, fifth, sixth, and eighth embodiments using an FN tunnel effect.

Figure 49:
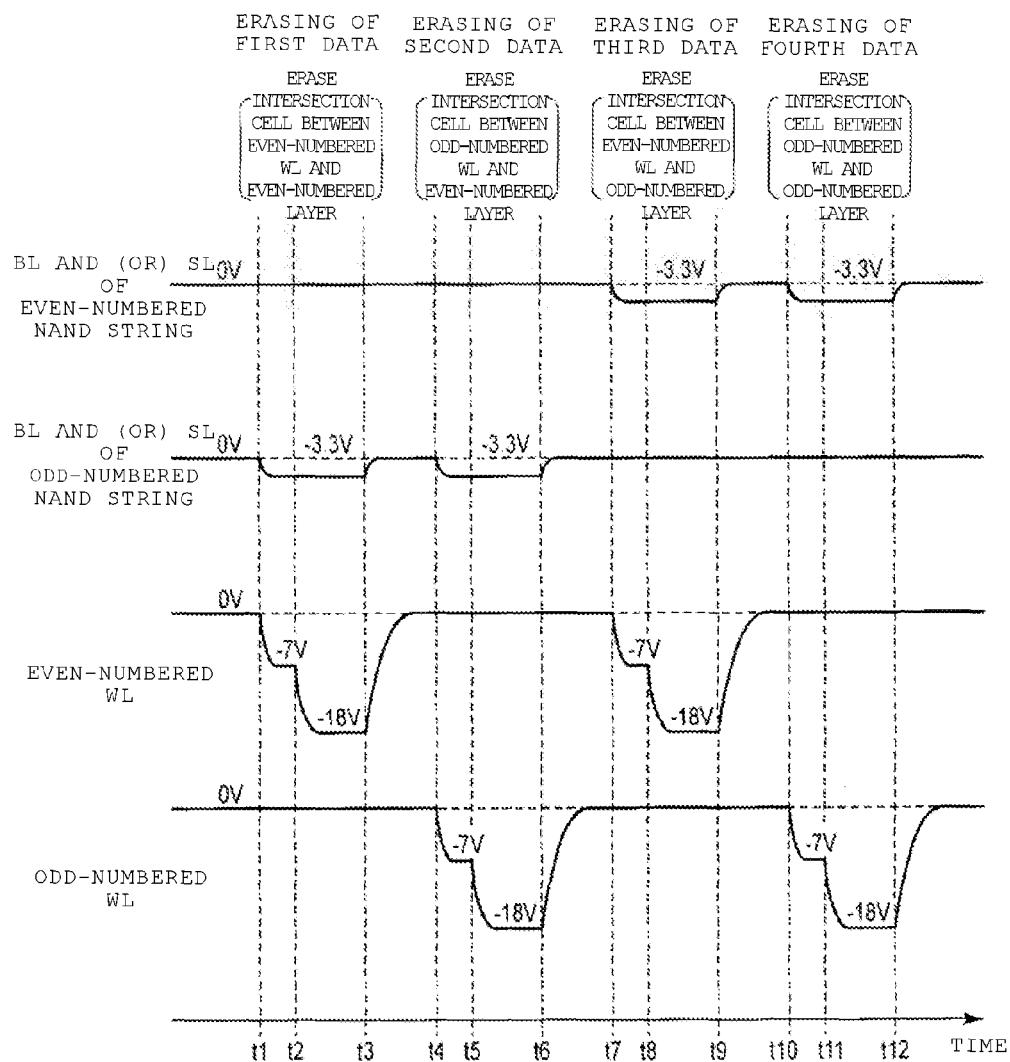
FIG. 49 is a timing chart showing potentials of wirings during data erasing according to a second example of the ninth embodiment.

FIG. 49 is timing chart showing the potentials of the bit lines BL and/or the source lines SL and the potentials of the word lines WL which correspond to the first to fourth data erasing operations (step S41 to S44) of FIG. 43. Meanwhile, the potentials of the other wirings which are not described herein are as described in the third, fifth, sixth, and eighth embodiments. In addition, here, only wirings regarding the memory unit MU1 are described, but the same description applies to other memory units MU that are erasing targets.

First, in the first data erasing (time t1 to t3), the source line driver 114 applies a voltage (for example, 0 V) at which the selection transistor ST2 is set to be in an on-state, to the source lines SL2 and SL4. In addition, the source line driver 114 applies a voltage (for example, −3.3 V) at which the selection transistor ST2 is set to be in an off-state, to the source lines SL1 and SL3. Thus, the selection transistors ST2 within the even-numbered NAND strings SR2 and SR4 are set to be in an on-state, and the selection transistors ST2 within the odd-numbered NAND strings SR1 and SR3 are set to be in an off-state.

In this state, the row decoder 112 applies, for example, −7 V to the even-numbered word lines WL2 and WL4 that are erasing targets for a period between time t1 and time t2, and applies a voltage (for example, −18 V) for applying an FN tunnel current for a period between time t2 and time t3. In addition, the row decoder 112 applies a voltage (for example, 0 V) at which an FN tunnel current is not applied, to the odd-numbered word lines WL1 and WL3 which are not erasing targets for a period between time t1 and time t3. Thus, in the first data erasing operation, an FN tunnel current flows to the memory cell transistors MT2 and MT4 connected to the even-numbered word lines WL2 and WL4 in the even-numbered NAND strings SR2 and SR4, and the data of the memory cell transistors MT2 and MT4 are erased. Meanwhile, the row decoder 112 can apply a negative voltage (for example, −7V) at which an FN tunnel current is not applied to the odd-numbered word lines WL1 and WL3 for a period between time t1 and time t3.

Next, similarly to the first data erasing operation, in the second data erasing (time t4 to t6), the source line driver 114 sets the selection transistors ST2 formed in the even-numbered NAND strings SR2 and SR4 to be in an on-state and sets the selection transistors ST2 formed in the odd-numbered NAND strings SR1 and SR3 to be in an off-state. In this state, the row decoder 112 applies, for example, −7 V to the odd-numbered word lines WL1 and WL3 that are erasing targets for a period between time t4 and time t5 and applies a voltage (for example, −18 V) for applying an FN tunnel current for a period between time t5 and time t6. Further, the row decoder 112 applies a voltage (for example, 0 V) at which an FN tunnel current does not flow, to the even-numbered word lines WL2 and WL4 which are not erasing targets for a period between time t4 and time t6. Thus, in the second data erasing operation, the data of the memory cell transistors MT1 and MT3 connected to the odd-numbered word lines WL1 and WL3 in the even-numbered NAND strings SR2 and SR4 are erased. Meanwhile, the row decoder 112 can apply a negative voltage (for example, −7V) at which an FN tunnel current is not applied to the even-numbered word lines WL2 and WL4 for a period between time t4 and time t6.

Next, in the third data erasing (time t7 to t9), the source line driver 114 applies a voltage (for example, 0 V) at which the selection transistor ST2 is set to be in an on-state, to the source lines SL1 and SL3. In addition, the source line driver 114 applies a voltage (for example, −3.3 V) at which the selection transistor ST2 is set to be in an on-state, to the source lines SL2 and SL4. Thus, the selection transistors ST2 within the odd-numbered NAND strings SR1 and SR3 are set to be in an on-state, and the selection transistors ST2 within the even-numbered NAND strings SR2 and SR4 are set to be in an off-state. In this state, the row decoder 112 applies, for example, −7 V to the even-numbered word lines WL2 and WL4 that are erasing targets for a period between time t7 and time t8, and applies a voltage (for example, −18 V) for applying an FN tunnel current for a period between time t8 and time t9. Further, the row decoder 112 applies a voltage (for example, 0 V) at which an FN tunnel current does not flow, to the odd-numbered word lines WL1 and WL3 which are not erasing targets for a period between time t7 and time t9. Thus, in the third data erasing operation, the data of the memory cell transistors MT2 and MT4 connected to the even-numbered word lines WL2 and WL4 in the odd-numbered NAND strings SR1 and SR3 are erased. Meanwhile, the row decoder 112 can apply a negative voltage (for example, −7V) at which an FN tunnel current is not applied to the odd-numbered word lines WL1 and WL3 for a period between time t7 and time t9.

Next, similarly to the third data erasing operation, in the fourth data erasing (time t10 to t12), the source line driver 114 sets the selection transistors ST2 formed in the odd-numbered NAND strings SR1 and SR3 to be in an on-state and sets the selection transistors ST2 formed in the even-numbered NAND strings SR2 and SR4 to be in an off-state. In this state, the row decoder 112 applies, for example, −7 V to the odd-numbered word lines WL1 and WL3 that are erasing targets for a period between time t10 and time t11 and applies a voltage (for example, −18 V) for applying an FN tunnel current for a period between time t11 and time t12. Further, the row decoder 112 applies a voltage (for example, 0 V) at which an FN tunnel current does not flow, to the even-numbered word lines WL2 and WL4 which are not erasing targets for a period between time t10 and time t12. Thus, in the fourth data erasing operation, the data of the memory cell transistors MT1 and MT3 connected to the odd-numbered word lines WL1 and WL3 in the odd-numbered NAND strings SR1 and SR3 are erased. Meanwhile, the row decoder 112 can apply a negative voltage (for example, −7V) at which an FN tunnel current is not applied to the even-numbered word lines WL2 and WL4 for a period between time t10 and time t12.

The data erasing of a block BLK being a target for erasing is completed by the above-mentioned four steps.

9.4 Effects According to this Embodiment

In the configuration according to this embodiment, the same effects as those in the first to eighth embodiments are obtained.

In the configuration according to this embodiment, it is possible to suppress the destruction of data due to holes trapped in a charge storage layer 26 which is located at a region between the memory cell transistors. This effect will be described below in detail.

Figure 50:
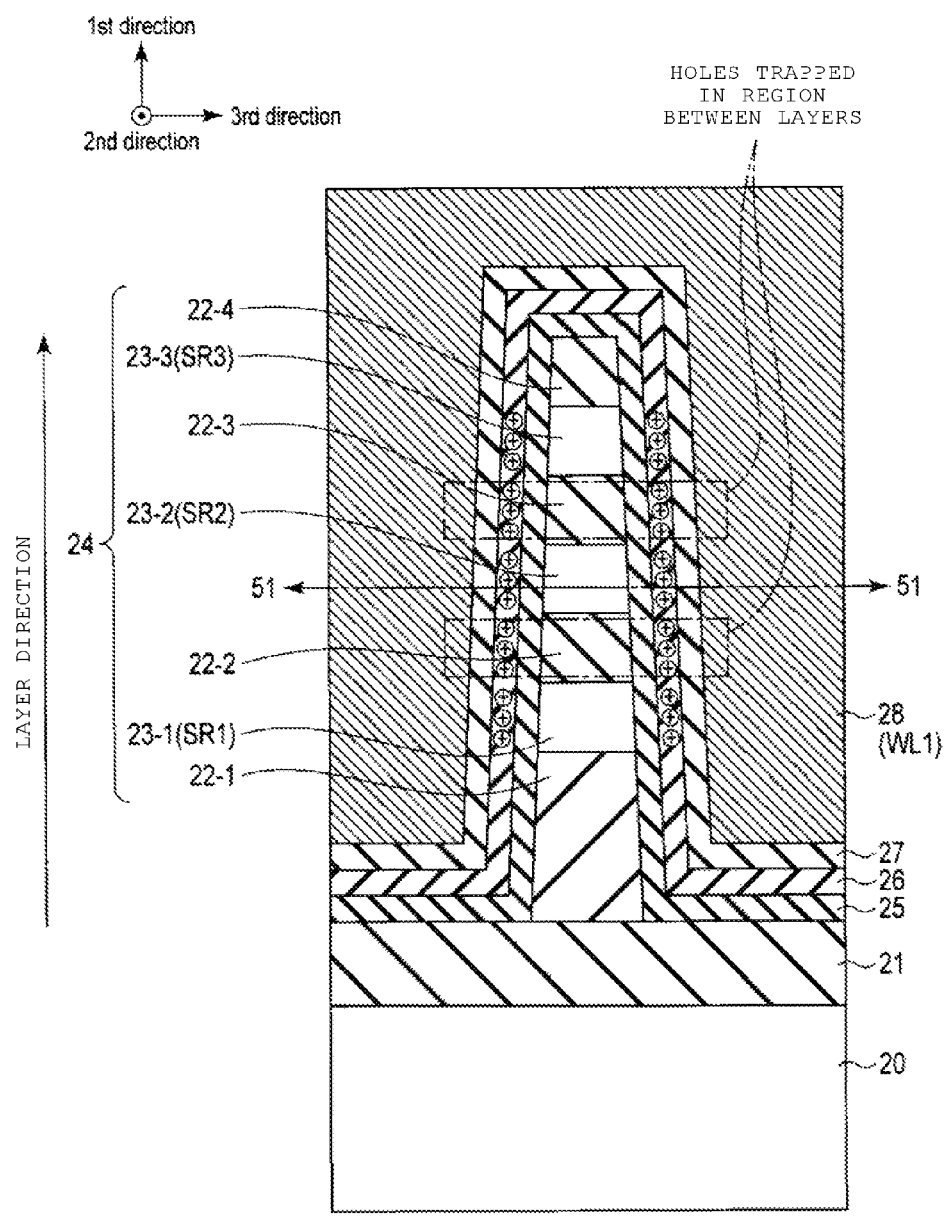
FIG. 50 is a cross-sectional view of a string group showing holes trapped in a charge storage layer.
Figure 51:
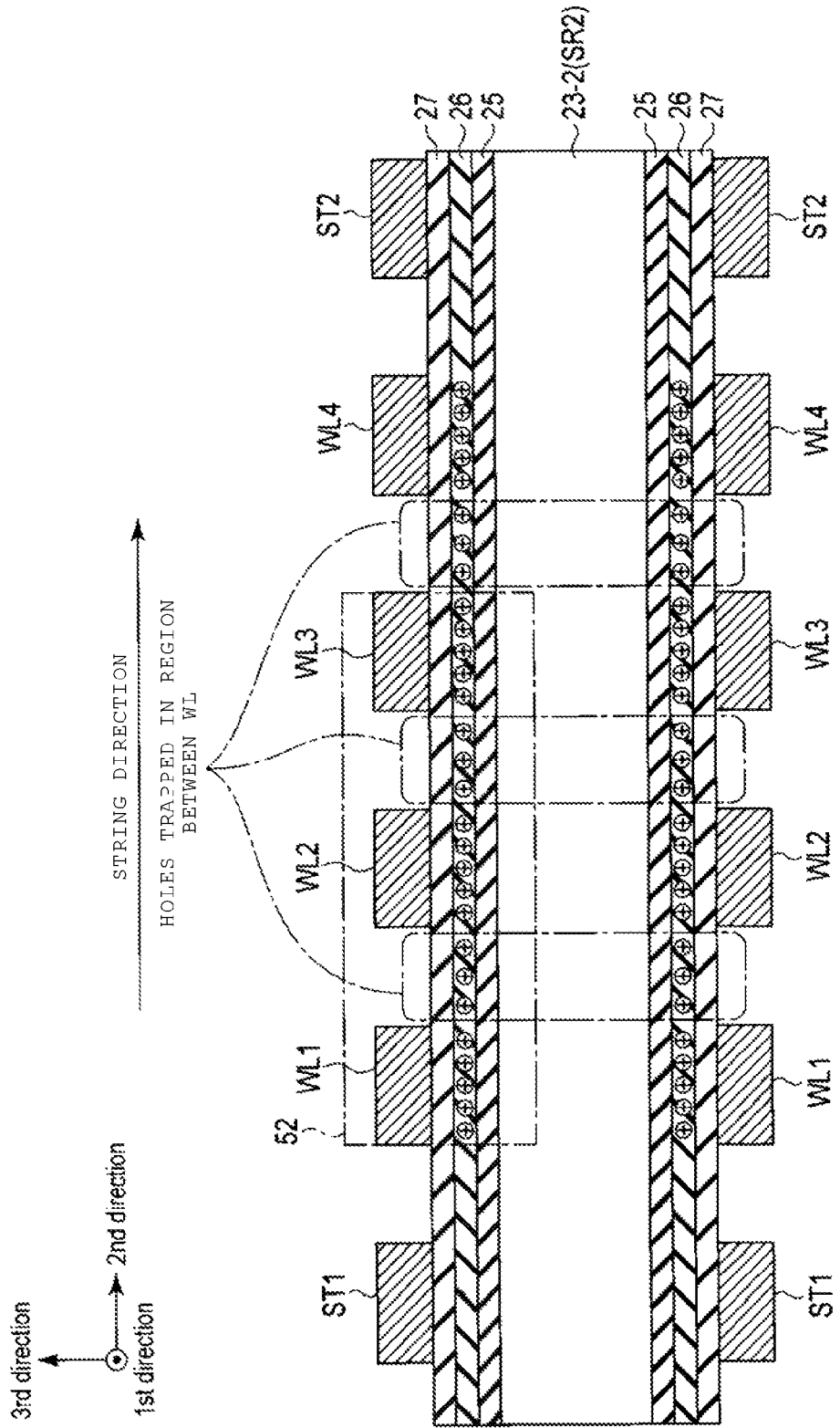
FIG. 51 is a cross-sectional view of a NAND string showing holes trapped in a charge storage layer.
Figure 52:
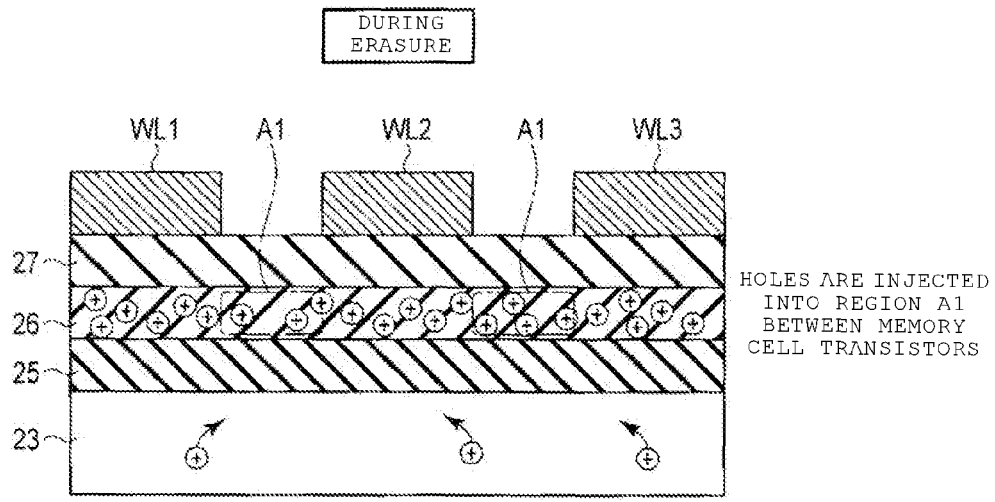
FIG. 52 is a cross-sectional view of a NAND string showing the movement of holes in a charge storage layer during data erasing.
Figure 53:
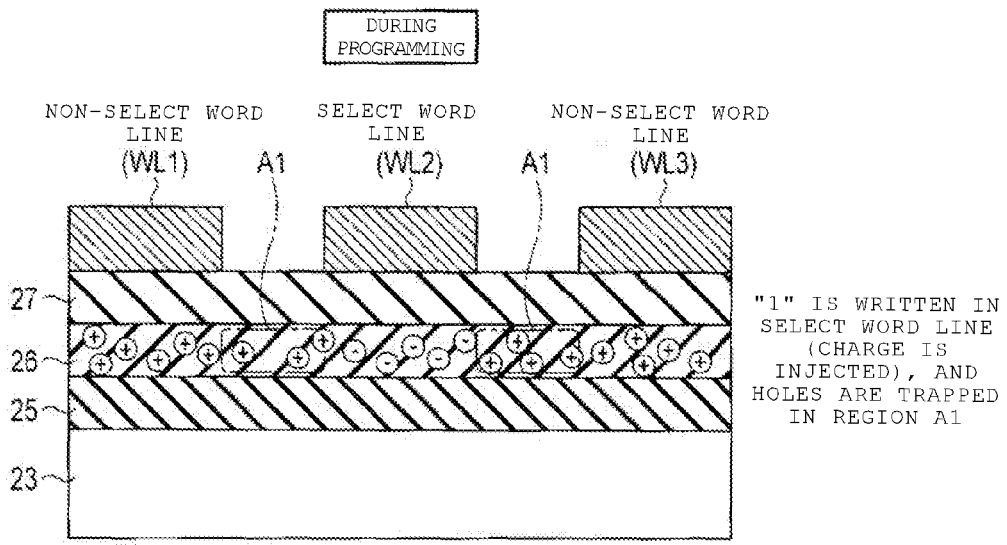
FIG. 53 is a cross-sectional view of a NAND string showing the movement of holes and charge in a charge storage layer during programming.
Figure 54:
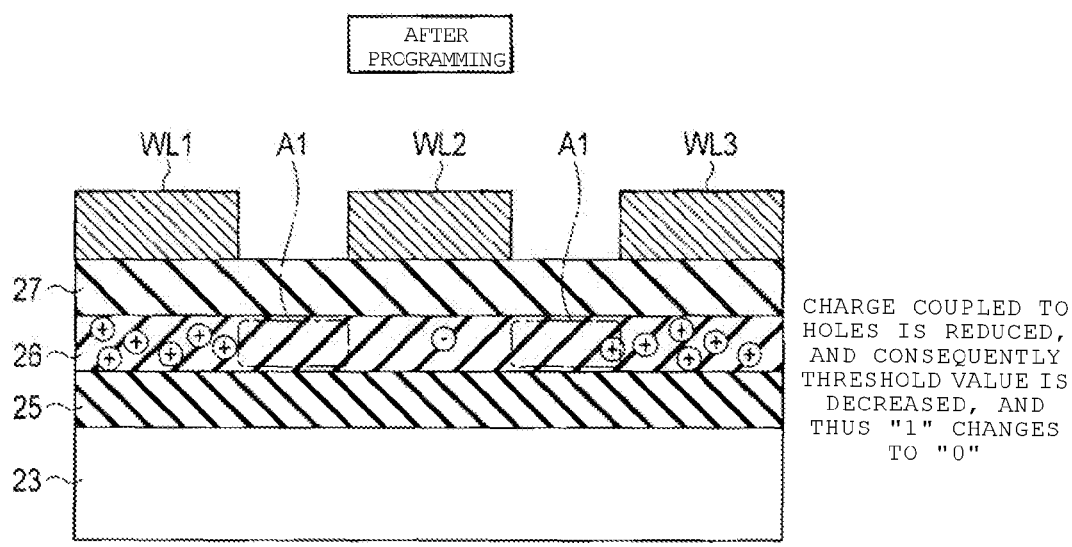
FIG. 54 is a cross-sectional view of a NAND string showing the movement of holes and charge in a charge storage layer after programming.

FIG. 50 is a cross-sectional view of a certain string group GR including the NAND strings SR1 to SR3 and shows a cross-section formed in a first direction and a third direction. FIG. 51 is a cross-sectional view of the NAND string SR2 taken along line 51-51 of FIG. 50 and shows a cross-section of the NAND string SR2 which is formed in a second direction and the third direction. FIGS. 52 to 54 are enlarged views of a region 52 of FIG. 51.

As shown in FIGS. 50 and 51, the charge storage layer 26 covers substantially the entirety of the side surface and top surface of a fin type structure 24. For this reason, when focusing on one memory cell transistor MT, the charge storage layer 26 of the memory cell transistor MT is continuously formed in common with a charge storage layer 26 of a memory cell transistor MT adjacent in the vertical direction (herein, referred to as a "layer direction" and corresponding to the first direction) and the horizontal direction (herein, referred to as a "string direction" and corresponding to the second direction). In other words, the charge storage layer 26 is also present in a region between the memory cell transistors adjacent to each other. When the charge storage layer 26 is also present in the region between the memory cell transistors, holes may also be trapped in the charge storage layer 26 in the region due to an electrical field generated between the memory cell transistors during the erasing operation. Specifically, holes may be trapped in a region between layers as shown in FIG. 50, and holes may be trapped in a region between word lines WL as shown in FIG. 51.

Next, the influence of holes trapped in the region between the memory cell transistors will be described with reference to FIGS. 52 to 54. FIG. 52 shows a state immediately after data is erased. As shown in the drawing, holes are injected into a region A1 between memory cell transistors. FIG. 52 shows the region A1 in a string direction, but holes are also injected into the region A1 in a layer direction.

Thereafter, as shown in FIG. 53, it is assumed that data is programmed in the memory cell transistor MT2 connected to the selected word line WL2. Meanwhile, in this embodiment, it is assumed that a state where data is erased is "0" and that a state where charge is injected and data is programmed is "1". Accordingly, charge is injected into the charge storage layer 26 of the memory cell transistor MT2, and data "1" is programmed. Meanwhile, in this programming step, holes remain trapped in the region A1.

Then, after the programming is completed as shown in FIG. 54, the charge injected into the charge storage layer 26 of the memory cell transistor MT2 are coupled to the holes trapped in the region A1, and the charge may disappear. As a result, a threshold value of the memory cell transistor MT is decreased, and the written data "1" may change to data "0".

On the other hand, according to this embodiment, the following effects are obtained. The effects will be described below in detail.

Figure 55:
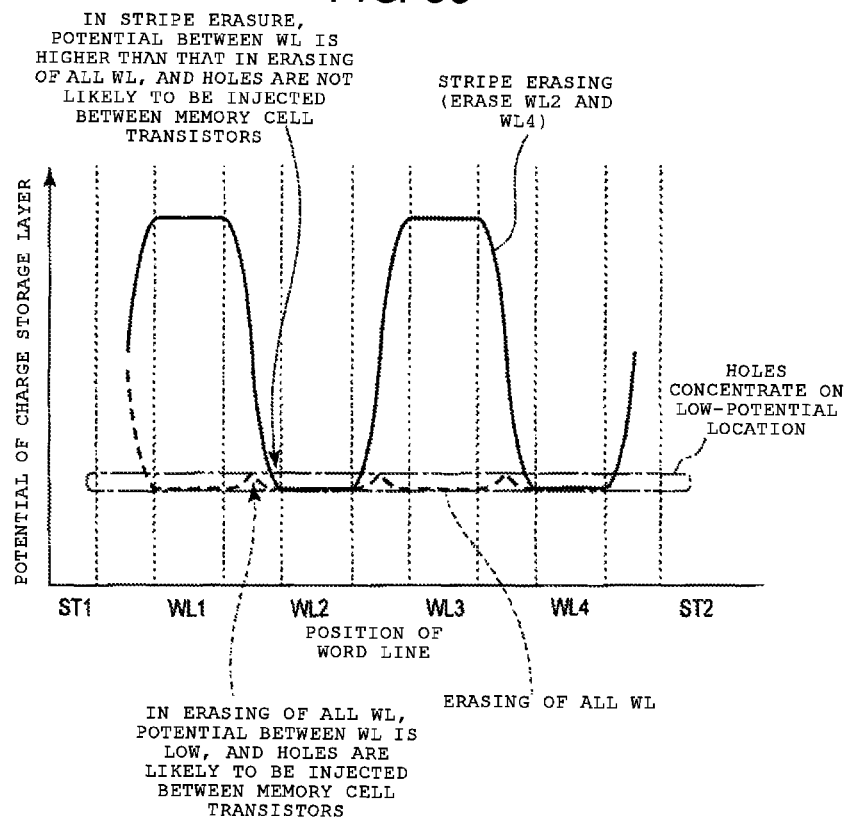
FIG. 55 is a graph showing a relationship between the position of a word line and a potential of a charge storage layer during data erasing according to the ninth embodiment.

FIG. 55 is a graph showing the potential of the charge storage layer 26 during the erasing operation. In FIG. 55, a horizontal axis represents the position of a word line (position along the second direction) and a vertical axis represents the potential of the charge storage layer. In FIG. 55, potential distribution in a case where all of the word lines WL are collectively selected is shown by a dashed line (graph shown by "all WL erase" in FIG. 55), and a case where the even-numbered word lines WL2 and WL4 are selected using the stripe erasing according to this embodiment is shown by a solid line.

As shown in the drawing, when all of the word lines WL are erasing targets, the potentials of all of the word lines WL are decreased. Accordingly, the potential between the word lines adjacent to each other is also decreased. As a result, holes are more likely to be injected into the charge storage layer 26 in a region between memory cell transistors.

On the other hand, in the case of the stripe erase, a word line WL adjacent to a certain selected word line WL is not necessarily selected. That is, in the case of this example, word lines WL1 and WL3 which are not erasing targets are set to have a high potential (for example, approximately a half voltage of VERA) so that holes are not injected. For this reason, a difference in the potential between word lines WL adjacent to each other is large. Thus, for example, the potential rises steeply toward the word lines WL1 and WL3 from both ends of the word line WL2 that is an erasing target. Accordingly, holes are not likely to be injected into a region between memory cell transistors.

In the stripe erase, when a certain NAND string SR is selected, the NAND string SR adjacent thereto is not necessarily selected. In the unselected NAND string SR, a voltage that does not cause GIDL is applied to the bit line BL and/or the source line SL. Accordingly, since holes are not generated in the unselected NAND string SR, holes are not likely to be injected into a region between memory cell transistors from the unselected NAND string.

As described above, in the configuration according to this embodiment, it is possible to suppress the injection of holes into a region between memory cell transistors by performing stripe erase. Accordingly, it is possible to suppress the change of data after the programming and to improve the reliability of the erasing operation and the programming operation.

Meanwhile, in this example, since the erasing operations are alternately performed on the memory cell memory cell transistors MT adjacent to each other in the string direction and the layer direction, the first to fourth erasing operations are performed. However, only the memory cell transistors MT adjacent to each other in the string direction or the layer direction may be alternately erased. For example, when the memory cell transistors MT adjacent to each other in the string direction are alternately erased, the even-numbered word lines WL2 and WL4 and the odd-numbered word lines WL1 and WL3 are alternately selected and erased in a state where all of the NAND strings SR1 to SR4 are selected. Alternatively, when the memory cell transistors MT adjacent to each other in the layer direction are alternately erased, the even-numbered NAND strings SR2 and SR4 and the odd-numbered NAND strings SR1 and SR3 are alternately selected and erased in a state where all of the word lines WL are selected.

10. Tenth Embodiment

Next, a semiconductor memory device and a data erasing method according to a tenth embodiment will be described. In this embodiment, a unit smaller than a block BLK (for example, a unit smaller than a memory unit MU) is selected and erased in the first to ninth embodiments described above (this unit is referred to as a sub-block, and erasing in units of sub-blocks is referred to as sub-block erasing operation). Hereinafter, some examples of the sub-block erasing operation will be described.

10.1 First Example of Sub-Block Erasing Operation

In this example, erasing is performed in units of NAND strings SR. In this example, data of a plurality of NAND strings SR located at the same layer are collectively erased.

Figure 56:
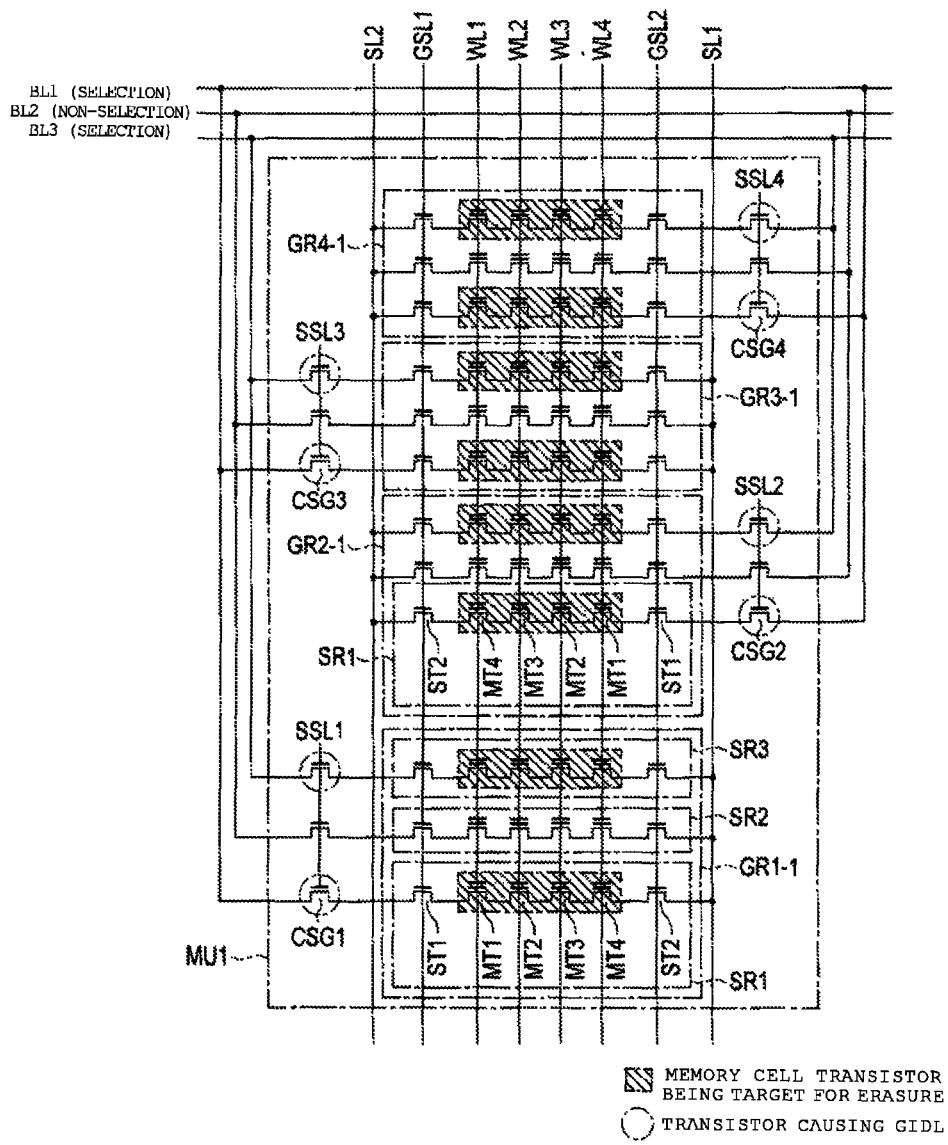
FIG. 56 is a circuit diagram of a memory cell array according to a first example of a tenth embodiment.

FIG. 56 is a circuit diagram of the memory cell array 111 according to this example and shows a memory unit MU1 when this example is applied to the first embodiment. Meanwhile, here, the memory unit MU1 will be described, but the same description applies to the other memory units MU.

In the example shown in the drawing, NAND strings SR1 and SR3 are set as erasing targets. Accordingly, GIDL occurs in column selection transistors CSG within the NAND strings SR1 and SR3. Meanwhile, here, the NAND strings SR1 and SR3 are set as erasing targets. However, for example, only the NAND string SR1 may be set as an erasing target, and a NAND string SR that is an erasing target may be arbitrarily selected.

Figure 57:
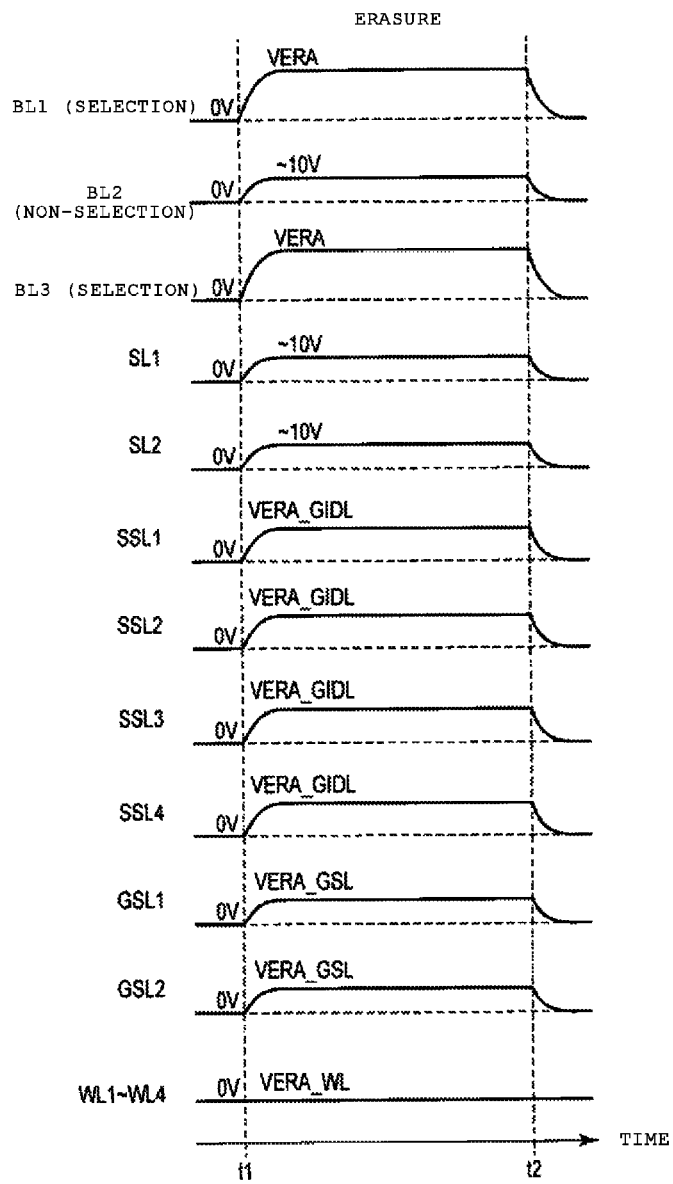
FIG. 57 is a timing chart showing potentials of wirings during data erasing according to the first example of the tenth embodiment.

FIG. 57 is a timing chart of a potential of a wiring according to this example during the erasing operation. As shown in the drawing, the driver 124 selects bit lines BL1 and BL3 and applies VERA to the bit lines BL1 and BL3. In addition, for example, the sense amplifier 113 applies a voltage (for example, approximately 10 V) which does not cause GIDL to an unselected bit line BL2. During this time, the potentials of source lines SL1 and SL2, control signal lines SSL1 to SSL4, selection gate lines GSL1 and GSL2, and word lines WL1 to WL4 are set to potentials which are the same as those described during time t1 to t2 of FIG. 9. Thus, GIDL occurs in a column selection transistor CSG connected to the bit lines BL1 and BL3. As a result, the data of the memory cell transistors MT of the NAND strings SR1 and SR3 are erased, and data of the memory cell transistor MT of the NAND string SR2 is not erased.

Meanwhile, this example may also be applied to the second to ninth embodiments.

When this example is applied to the second embodiment, the source line driver 114 applies a voltage that does not cause GIDL to the source line SL2 corresponding to the NAND string SR2 which is not an erasing target. In addition, the potentials of the other wirings are set to potentials which are the same as those described during time t1 to t2 of FIG. 19. Accordingly, GIDL does not occur in the NAND string SR2 which is not an erasing target, and thus data is not erased.

In addition, when this example is applied to the third embodiment, the source line driver 114 applies a voltage (for example, −3.3 V) for setting the selection transistor ST2 to be in an off-state to the source line SL2 corresponding to the NAND string SR2 which is not an erasing target. The potentials of the other wirings are set to potentials which are the same as those described during time t1 to t3 of FIG. 21. Accordingly, the selection transistor ST2 is set to be in an off-state in the memory cell transistor MT of the NAND string SR2 which is not an erasing target, and thus data is not erased.

In addition, when this example is applied to the fourth embodiment, for example, the sense amplifier 113 and the source line driver 114 apply a voltage that does not cause GIDL to the bit line BL2 and the source line SL2, respectively, which correspond to the NAND string SR2 which is not an erasing target. The potentials of the other wirings are set to potentials which are the same as those described during time t1 to t2 of FIG. 23.

10.2 Second Example of Sub-Block Erasing Operation

In this example, erasing is performed in units of even-numbered or odd-numbered string groups GR. In this example, the data of the memory cell transistors MT of the even-numbered or odd-numbered string groups GR are collectively erased.

Figure 58:
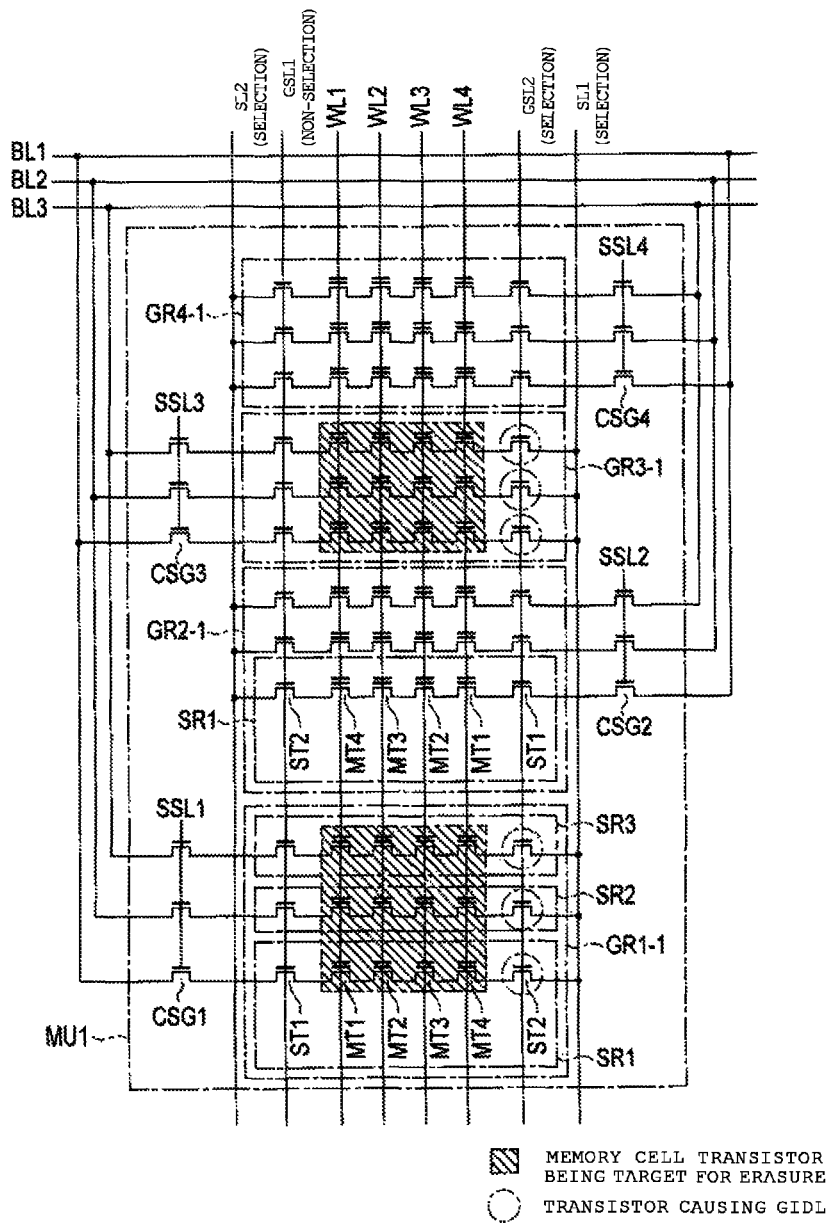
FIG. 58 is a circuit diagram of a memory cell array according to a second example of the tenth embodiment.

FIG. 58 is a circuit diagram of the memory cell array 111 according to this example and shows a memory unit MU1 when this example is applied to the first embodiment.

In the example shown in the drawing, odd-numbered string groups GR1-1 and GR3-1 connected to a source line SL1 are set as erasing targets. Unlike the first embodiment, in this example, GIDL occurs in selection transistors ST2 of the string groups GR1-1 and GR3-1 that are erasing targets. Meanwhile, here, the odd-numbered string groups GR1-1 and GR3-1 are set as erasing targets, but even-numbered string groups GR2-1 and GR4-1 may be set as erasing targets.

Figure 59:
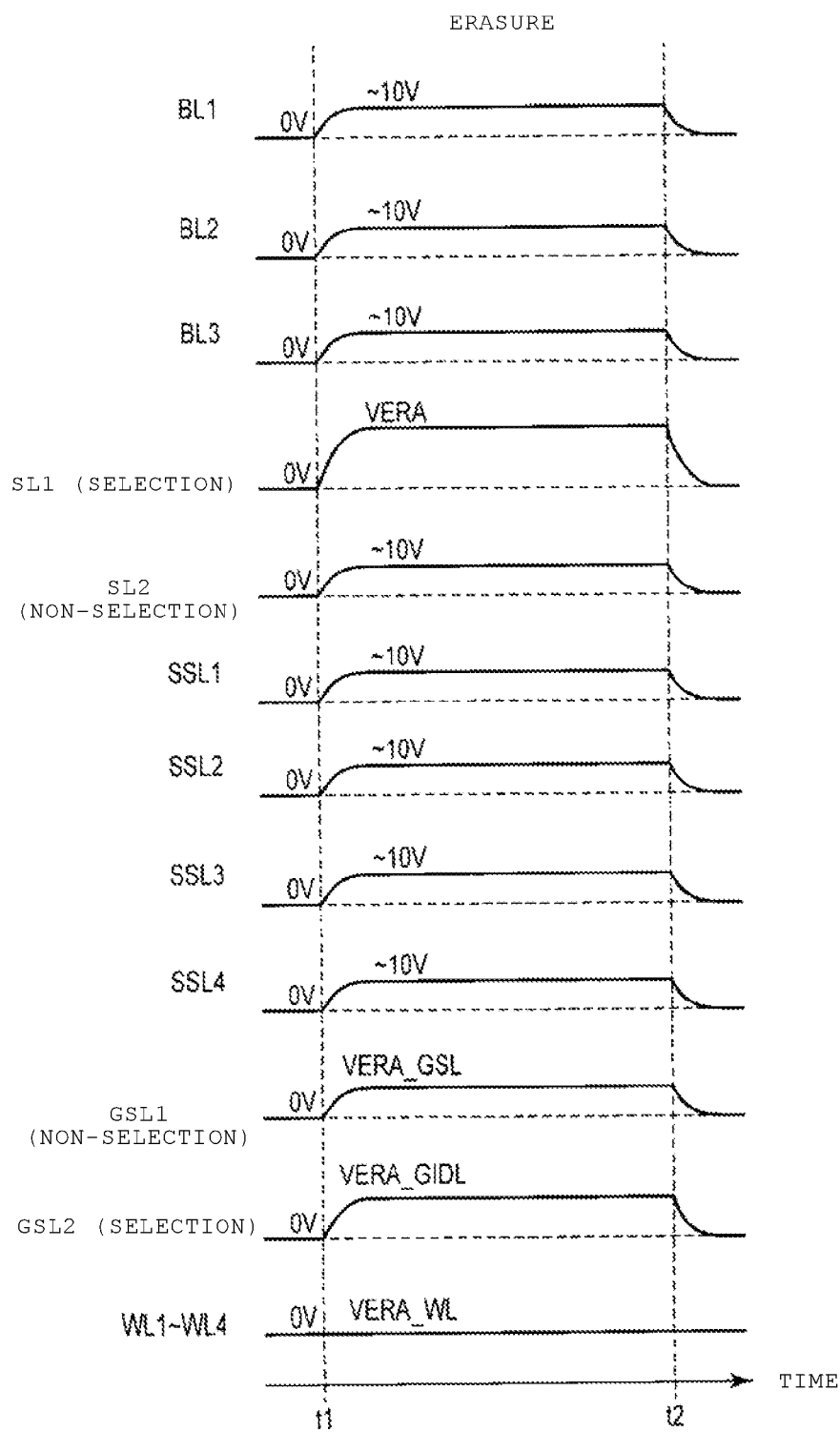
FIG. 59 is a timing chart showing potentials of wirings during data erasing according to the second example of the tenth embodiment.

FIG. 59 is a timing chart showing potentials of wirings according to this example during the erasing operation. As shown in the drawing, the driver 124 selects the source line SL1 corresponding to the string groups GR1-1 and GR3-1 and applies VERA to the source line SL1. In addition, the source line driver 114 applies a voltage (for example, approximately 10 V) which does not cause GIDL to an unselected source line SL2. In addition, for example, the sense amplifier 113 applies a voltage (for example, approximately 10 V) which does not cause GIDL to bit lines BL1 to BL3. Further, the driver 124 applies a voltage (for example, approximately 10 V) which does not cause GIDL to control signal lines SSL1 to SSL4. In addition, the row decoder 112 selects a selection gate line GSL2 and applies VERA_GIDL to the selection gate line GSL2. Further, the row decoder 112 applies VERA_GSL (for example, approximately 10 V) which is a voltage that does not cause GIDL, to an unselected selection gate line GSL1. Further, the row decoder 112 applies VERA_WL (for example, 0 V) to word lines WL1 to WL4. Thus, GIDL occurs in a selection transistor ST2 connected to the source line SL1. As a result, the data of the string groups GR1-1 and GR3-1 are erased.

10.3 Third Example of Sub-Block Erasing Operation

In this example, erasing is performed in units of word lines WL. In this example, the data of a plurality of memory cell transistors MT connected to the same word line are collectively erased.

Figure 60:
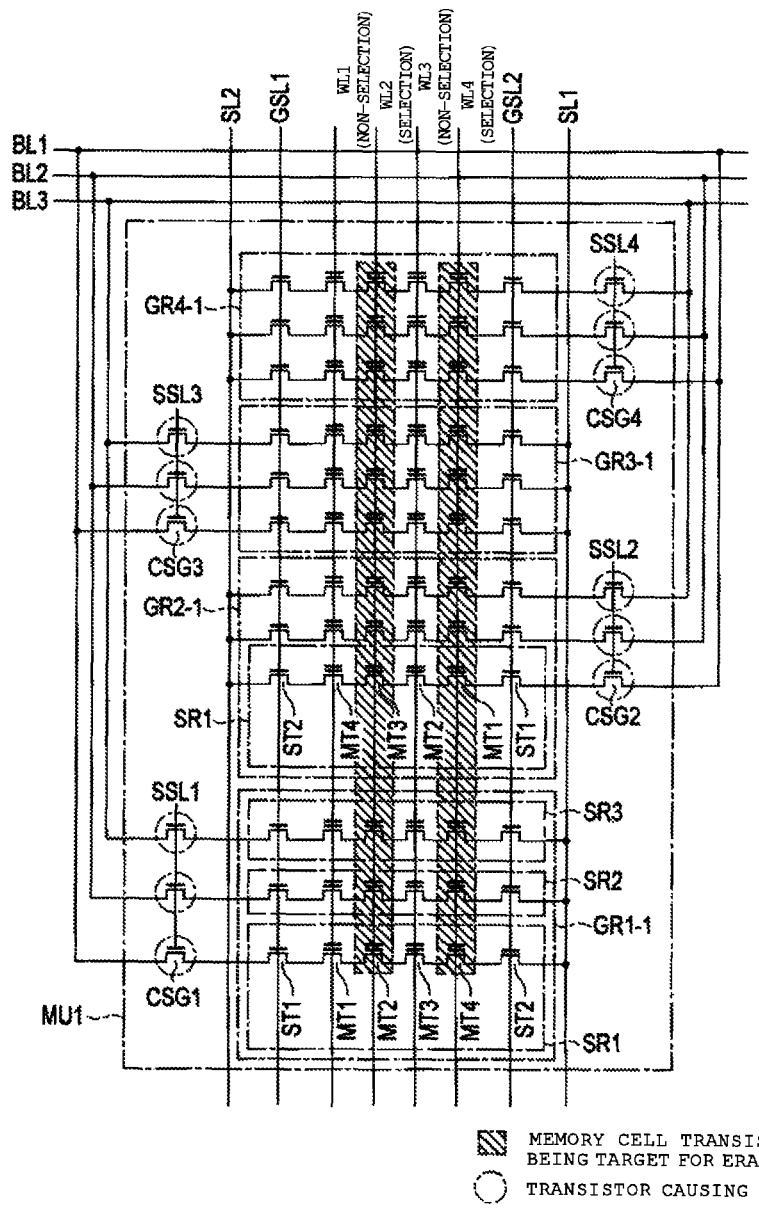
FIG. 60 is a circuit diagram of a memory cell array according to a third example of the tenth embodiment.

FIG. 60 is a circuit diagram of the memory cell array 111 according to this example and shows a memory unit MU1 when this example is applied to the first embodiment.

In the example shown in the drawing, memory cell transistors MT2 and MT4 of all NAND strings SR connected to word lines WL2 and WL4 are set as erasing targets. Accordingly, in this example, GIDL occurs in column selection transistors CSG1 to CSG4. Meanwhile, in the example of FIG. 60, the word lines WL2 and WL4 are set as erasing targets. However, for example, only a word line WL1 may be set as an erasing target, and a word line WL that is an erasing target may be arbitrarily selected.

Figure 61:
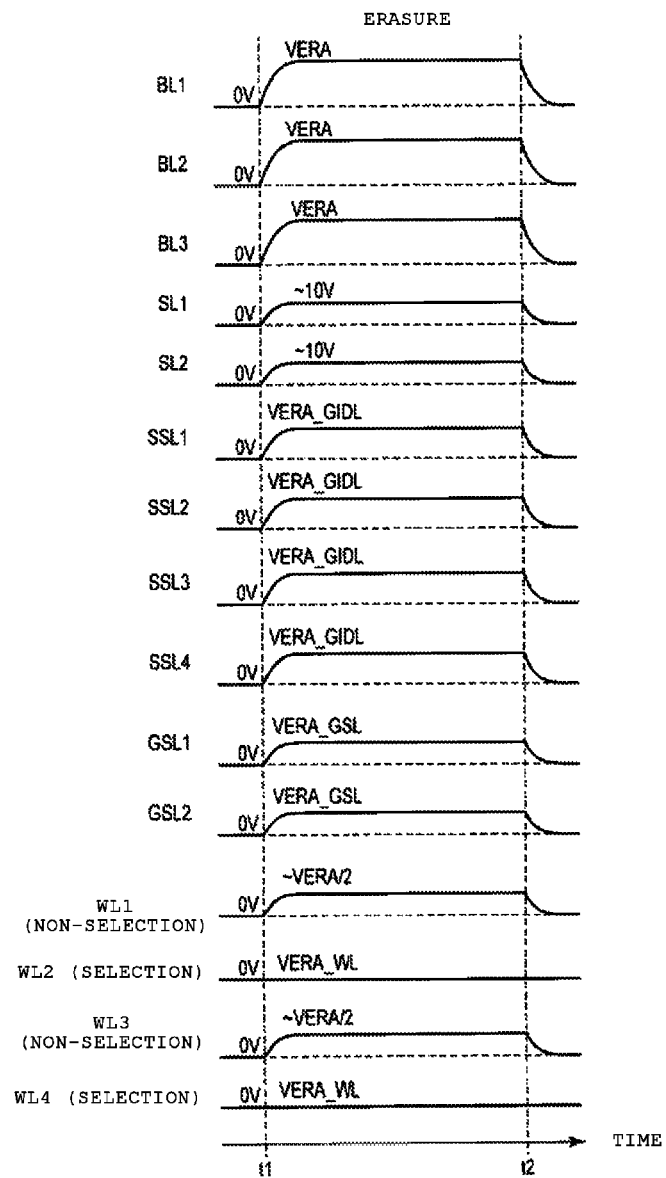
FIG. 61 is a timing chart showing potentials of wirings during data erasing according to the third example of the tenth embodiment.

FIG. 61 is a timing chart showing potentials of wirings according to this example during the erasing operation. As shown in the drawing, the row decoder 112 selects word lines WL2 and WL4 corresponding to memory cell transistors MT2 and MT4 and applies VERA_WL (for example, 0 V) to the word lines WL2 and WL4. Further, the row decoder 112 applies a potential (for example, approximately a half voltage of VERA) at which holes generated due to GIDL are not injected, to non-selected word lines WL1 and WL3. During this time, the potentials of bit lines BL1 to BL3, source lines SL1 and SL2, control signal lines SSL1 to SSL4, and selection gate lines GSL1 and GSL2 are set to potentials which are the same as those described during time t1 to t2 of FIG. 9. Thus, GIDL occurs in column selection transistors CSG1 to CSG4. In addition, holes generated due to GIDL are injected into the memory cell transistors MT2 and MT4 connected to the word lines WL2 and WL4, and data is erased.

Meanwhile, this example may also be applied to the second to ninth embodiments.

When this example is applied to the second or fourth embodiments, the row decoder 112 applies VERA_WL (for example, 0 V) to word lines WL2 and WL4 that are erasing targets, and applies a potential (for example, approximately a half voltage of VERA) at which holes generated due to GIDL are not injected, to word lines WL1 and WL3 which are not erasing targets. In addition, the potentials of the other wirings are set to potentials which are the same as those described in the second or fourth embodiments.

In addition, when this example is applied to the third embodiment, the row decoder 112 applies a voltage (for example, −18 V) for applying an FN tunnel current, to the word lines WL2 and WL4 that are erasing targets, and applies a voltage (for example, 0 V) at which an FN tunnel current does not flow to the word lines WL1 and WL3 which are not erasing targets. In addition, the potential of the other wirings are set to potentials which are the same as those described in the third embodiment.

10.4 Fourth Example of Sub-Block Erasing Operation

In this example, erasing is performed in units of string groups GR. In this example, data of a plurality of NAND strings SR located at a string group GR that is an erasing target are collectively erased. However, this example is different from the second example described above in that a string group GR that is an erasing target may be freely selected. That is, in the case of the second example, the erasing is performed in units of odd-numbered string groups (for example, GR1 and GR3) or in units of even-numbered string groups (for example, GR2 and GR4). However, in this example, it is possible to completely freely select a string group GR that is an erasing target. In other words, it is also possible to set only one string group GR as an erasing target and to set any two or more arbitrary string groups GR as erasing targets.

Figure 62:
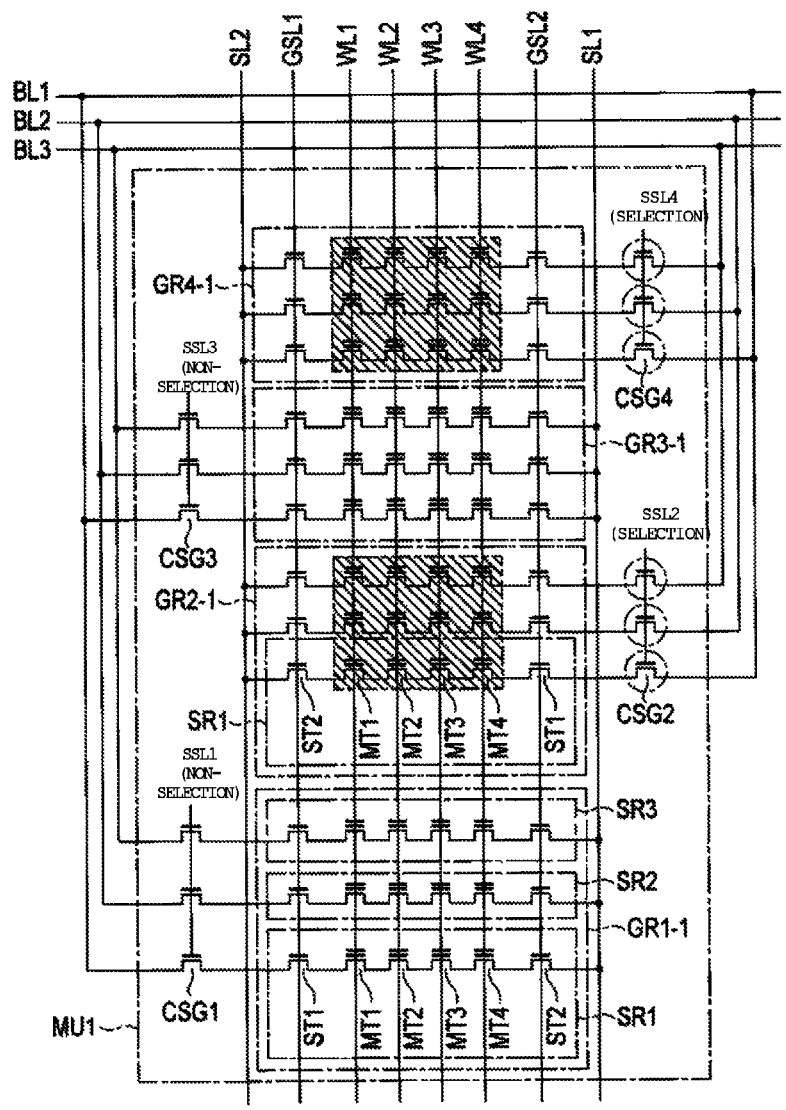
FIG. 62 is a circuit diagram of a memory cell array according to a fourth example of the tenth embodiment.

FIG. 62 is a circuit diagram of a memory cell array 111 according to this example and shows a memory unit MU1 when this example is applied to the first embodiment. In the example shown in the drawing, string groups GR2-1 and GR4-1 are set as erasing targets. Unlike the second example, in this example, GIDL occurs in a column selection transistor CSG corresponding to a string group GR that is an erasing target. Accordingly, as shown in the drawing, GIDL occurs in column selection transistors CSG2 and CSG4.

Figure 63:
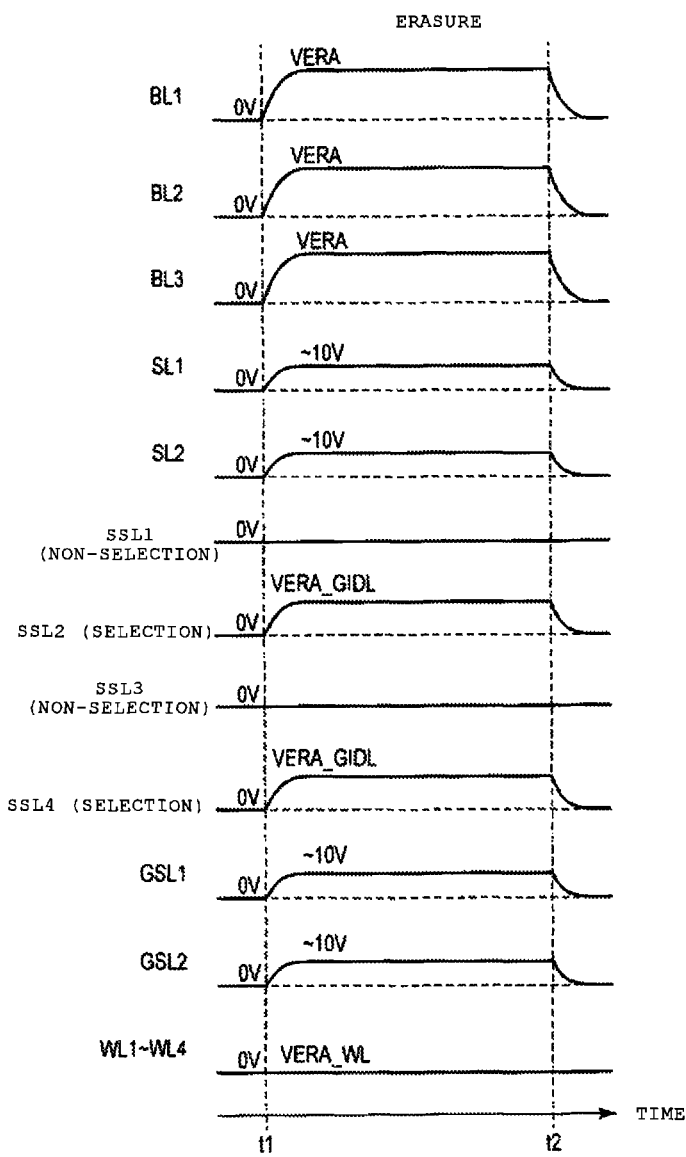
FIG. 63 is a timing chart showing potentials of wirings during data erasing according to the fourth example of the tenth embodiment.

FIG. 63 is a timing chart showing potentials of wirings according to this example during the erasing operation. As shown in the drawing, the driver 124 selects control signal lines SSL2 and SSL4 and applies VERA_GIDL to the control signal lines. Further, the driver 124 applies a voltage (for example, 0 V) for setting a column selection transistor CSG to be in an off-state to unselected control signal lines SSL1 and SSL3. Thus, column selection transistors CSG2 and CSG4 are set to be in an on-state and column selection transistors CSG1 and CSG3 are set to be in an off-state. In addition, the potentials of bit lines BL1 to BL3, source lines SL1 and SL2, selection gate lines GSL1 and GSL2, and word lines WL1 to WL4 are set to potentials which are the same as those described during time t1 to t2 of FIG. 9 according to the first embodiment. Thus, GIDL occurs in the column selection transistors CSG2 and CSG4 connected to the control signal lines SSL2 and SSL4. As a result, data of memory cell transistors MT of string groups GR2-1 and GR4-1 are erased.

10.5 Effects According to this Embodiment

In the configuration according to this embodiment, the same effects as those in the first to ninth embodiments described above are obtained. Further, the following effects are obtained by performing sub-block erasing operation.

That is, in the configuration according to this embodiment, erasing may be performed in a unit smaller than a block size. Thus, it is possible to reduce the amount of movement of valid data moving from a block BLK targeted for erasing to a block BLK not targeted for erasing.

That is, when a region being a target for erasing includes valid data which should not be erased, it is necessary to save the valid data in a region which is not a target for erasing before the erasing operation. As the size of a region serving as an erasing unit increases, the amount of data to be saved is generally increased. In this regard, according to this embodiment, it is possible to make the size of the region being a target for erasing smaller than that of the block BLK. For this reason, it is possible to reduce the amount of valid data to be saved.

In addition, it is possible to select a region being a target for erasing (sub-block) which has an optimum size in accordance with the amount of data to be erased. Accordingly, it is possible to minimize the size of data for erasing and the size of valid data to be saved and to reduce a processing time of the erasing operation.

11. Eleventh Embodiment

Next, a semiconductor memory device and a data erasing method according to an eleventh embodiment will be described. In this embodiment, an erasing condition is corrected for each layer when erasing characteristics of a memory cell transistor MT are changed due to repeated erasing operations in the first to tenth embodiments described above. Hereinafter, only differences from the first to tenth embodiments will be described.

Figure 64:
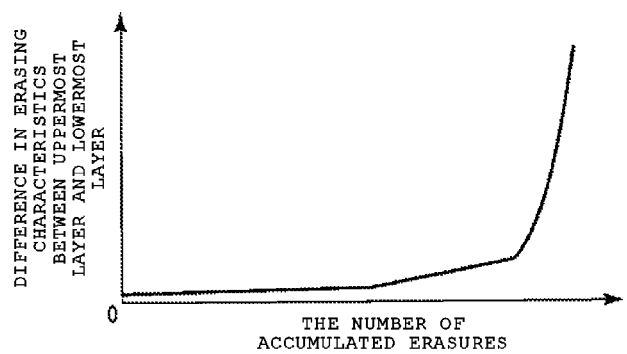
FIG. 64 is a graph showing the number of accumulated erasures and a difference in erasing characteristics between layers according to an eleventh embodiment.

11.1 With Regard to Relationship Between Number of Accumulated Erasures and Erasing Characteristics FIG. 64 is a graph showing a difference between the number of accumulated erasures and erasing characteristics of memory cell transistors MT between layers. FIG. 64 shows a difference in erasing characteristics based on a case where a difference in erasing characteristics between a memory cell transistor MT located at the uppermost layer and a memory cell transistor MT located at the lowermost layer is largest, as an example. In addition, the difference in erasing characteristics is specifically a difference in the easiness of data erasing (in other words, the difficulty in data erasing), and may be rephrased as, for example, a difference in an erasing voltage or an erasing pulse width which is necessary for each layer.

The difference in erasing characteristics becomes more prominent as a difference in the size of the memory cell transistor MT between the layers increases. For example, an erasing condition which is corrected for each layer may be set at the time of shipping in order to correct the difference in erasing characteristics between the layers. However, when programming and erasing are repeated, erasing characteristics may change due to the deterioration of a gate insulating film of the memory cell transistor MT.

The amount of change in the erasing characteristics varies depending on layers depending on the shape (easiness of data erasing) of the memory cell transistor MT, an erasing condition, and the like. For example, a layer having data being likely to be erased is exposed to stress of an excessive erasing voltage, and thus the erasing characteristics of the layer vary more largely than those of other layers. Alternatively, a layer having data being not likely to be erased has a tendency to have an increased number of erasing loops. As a result, a high erasing voltage is repeatedly applied, and thus the erasing characteristics thereof may vary more largely than those of other layers.

As a result, as shown in FIG. 64, a difference in erasing characteristics between layers increases in association with an increase in the number of accumulated erasures.

Some methods may be adopted as a specific method of correcting the above-mentioned difference in erasing characteristics. Hereinafter, three examples thereof will be described. Meanwhile, here, a case where GIDL erasing is used is described, but erasing using an FN tunnel effect may also be used.

11.2 First Example of Data Erasing Operation

In this example, a method of changing a voltage condition of erasing for each layer using the number of accumulated erasures n (n is any integer) is provided.

11.2.1 With Regard to Erasing Condition During Data Erasing Operation

Next, the erasing condition during data erasing in this example will be described. In this example, a controller 200 holds a management table for determining an erasing condition in, for example, a built-in memory 220. In addition, the built-in memory 220 holds the number of accumulated erasures n for each block (and/or for each sub-block).

The management table in this example is a table showing a relationship between the number of determinations N for determining the number of accumulated erasures n and a prefix command. Here, the number of determinations N is the number of determinations for determining an erasing condition in accordance with the number of accumulated erasures n and is any integer which is set in the order of N1, N2, N3, n4, . . . from a smaller number. In addition, the prefix command is a command for determining an erasing condition issued by the controller 200 and is set in the order of a first prefix command, a second prefix command, . . . in accordance with the numbers of determinations N1, N2, . . . . When erasing is performed, the controller 200 determines the number of accumulated erasures n of a block BLK being a target for erasing based on the management table and issues a prefix command based on a result of the determination.

A NAND-type flash memory 100 holds a table showing a relationship between a prefix command and an erasing condition for each layer within, for example, a register 123. The NAND-type flash memory 100 determines an erasing condition in accordance with the prefix command received from the controller 200.

Figure 65:
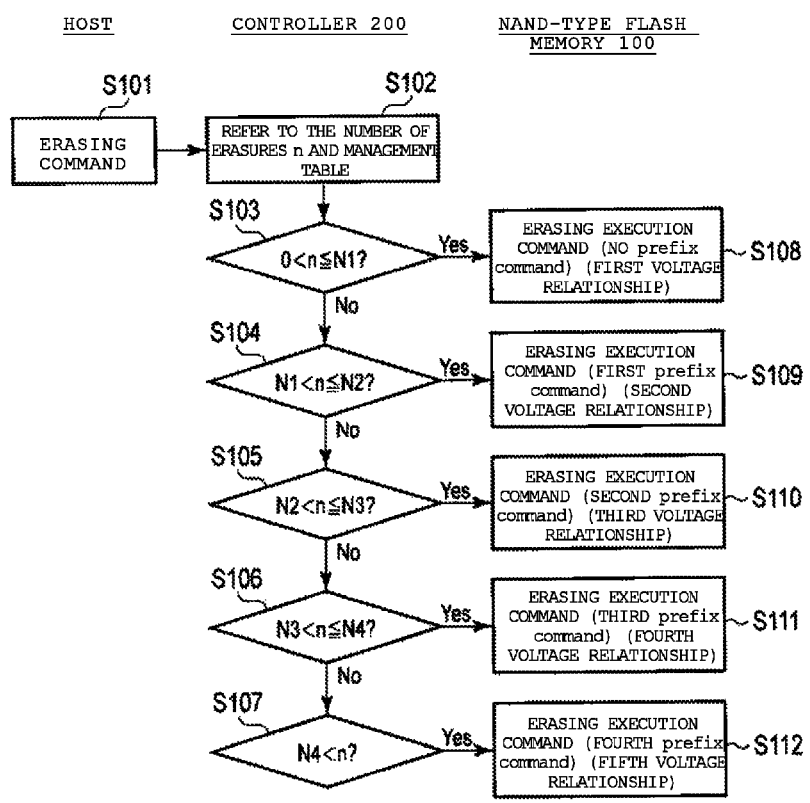
FIG. 65 is a flow chart showing a data erasing operation according to a first example of the eleventh embodiment.

FIG. 65 is a flow chart showing a relationship between the number of accumulated erasures n and an erasing voltage condition in data erasing according to this example.

First, the host interface circuit 210 of the controller 200 receives an erasing command from a host device (step S101).

Next, the CPU 230 of the controller 200 refers to the number of accumulated erasures n and a management table of a block BLK which is set as a target for erasing by the host device (step S102).

First, when the number of accumulated erasures n satisfies the relationship of 0<n≤N1 (step S103, Yes), the CPU 230 does not issue a prefix command. Accordingly, the NAND interface circuit 250 transmits only an erasing command to the NAND-type flash memory 100. The NAND-type flash memory 100 performs data erasing under a first voltage condition which is set at the time of shipping (step S108).

Next, when the number of accumulated erasures n satisfies the relationship of N1<n≤N2 (step S104, Yes), the CPU 230 issues a first prefix command, and a NAND interface circuit 250 transmits an erasing command and the first prefix command to the NAND-type flash memory 100. The NAND-type flash memory 100 performs data erasing under a second voltage condition in accordance with the first prefix command (step S109).

Next, when the number of accumulated erasures n satisfies the relationship of N2<n≤N3 (step S105, Yes), the CPU 230 issues a second prefix command, and the NAND interface circuit 250 transmits an erasing command and the second prefix command to the NAND-type flash memory 100. The NAND-type flash memory 100 performs data erasing under a third voltage condition in accordance with the second prefix command (step S110).

Next, when the number of accumulated erasures n satisfies the relationship of N3<n≤N4 (step S106, Yes), the CPU 230 issues a third prefix command, and the NAND interface circuit 250 transmits an erasing command and the third prefix command to the NAND-type flash memory 100. The NAND-type flash memory 100 performs data erasing under a fourth voltage condition in accordance with the third prefix command (step S111).

Next, when the number of accumulated erasures n satisfies the relationship of N4<n (step S107), the CPU 230 issues a fourth prefix command, and the NAND interface circuit 250 transmits an erasing command and the fourth prefix command to the NAND-type flash memory 100. The NAND-type flash memory 100 performs data erasing under a fifth voltage condition in accordance with the fourth prefix command (step S112).

11.2.2 With Regard to Data Erasing Voltage

Figure 66:
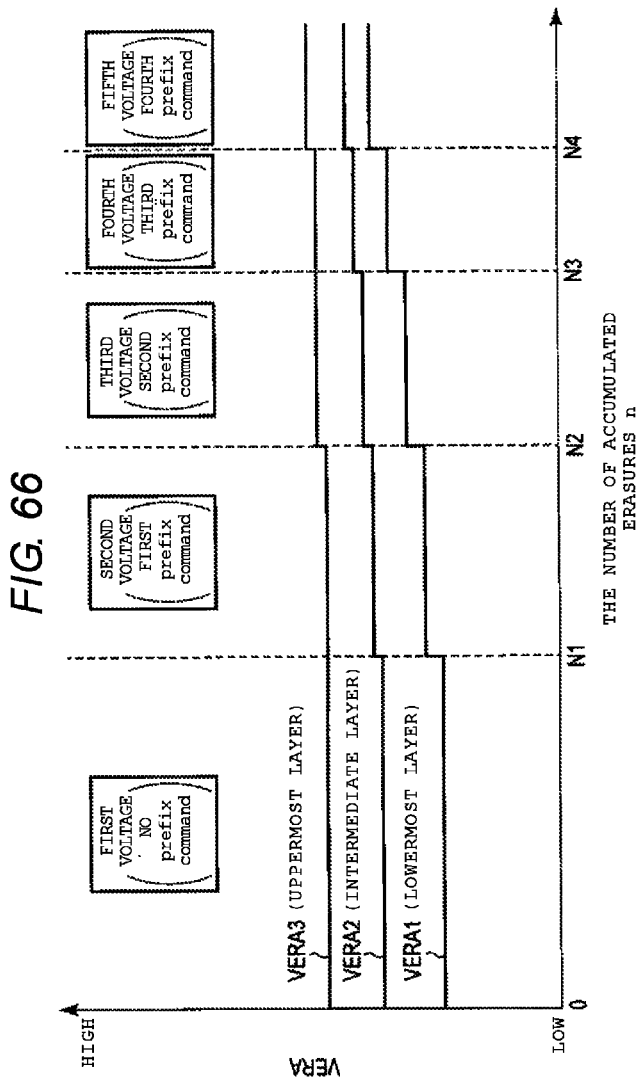
FIG. 66 is a graph showing a relationship between the number of accumulated erasures and a voltage VERA according to the first example of the eleventh embodiment.

Next, a voltage value of VERA applied to NAND strings SR located at the respective layers will be described. FIG. 66 is a graph showing a relationship between the number of accumulated erasures n (prefix command) and VERA. FIG. 66 shows the following case as an example. That is, a NAND string SR3 located at the uppermost layer has data being least likely to be erased, but has a small variation in the erasing characteristics thereof due to the number of accumulated erasures n. A NAND string SR1 has data being most likely to be erased, but has a large variation in the erasing characteristics thereof due to the number of accumulated erasures n. A NAND string SR2 shows intermediate characteristics between the uppermost layer and the lowermost layer.

As shown in the drawing, as the number of accumulated erasures increases, the value of the erasing voltage VERA is stepped up. Here, the step-up width thereof increases as the erasing voltage is applied to a NAND string having a larger variation in erasing characteristics. Accordingly, as the number of accumulated erasures increases, a difference between VERA1 and VERA3 is decreased.

More specifically, as shown in FIG. 66, when the number of accumulated erasures n is the number of determinations N1 or less (0<n≤N1), the first voltage condition (no prefix command) is applied. In the first voltage condition, the control unit 121 sets VERA1 to VERA3 to initial values, and each of VERA1 to VERA3 is set to a smallest value.

Next, when the number of accumulated erasures n is greater than the number of determinations N1 and is the number of determinations N2 or less (N1<n≤N2), the second voltage condition (first prefix command) is applied. In the second voltage condition, the control unit 121 steps up VERA in accordance with the magnitude of a variation in erasing characteristics. In the example of FIG. 66, VERA3 has the smallest step-up width and VERA1 has the largest step-up width. That is, a layer having a larger variation in erasing characteristics has a larger step-up width.

Similarly, when the number of accumulated erasures n is greater than the number of determinations N2 and is the number of determinations N3 or less (N2<n≤N3), the third voltage condition (second prefix command) is applied. In addition, when the number of accumulated erasures n is greater than the number of determinations N3 and is the number of determinations N4 or less (N3<n≤N4), the fourth voltage condition (third prefix command) is applied. Further, when the number of accumulated erasures n is greater than the number of determinations N4 (N4<n), the fifth voltage condition (fourth prefix command) is applied. In addition, VERA1 to VERA3 are stepped up in accordance with the respective voltage conditions. In addition, for example, the control unit 121 may increase a step-up width as the number of accumulated erasures n increases.

The control unit 121 sets the values of VERA1 to VERA3 to maximum values, which may be individually set, under the fifth voltage condition. As a result, a difference between VERA1 and VERA3 is minimized.

11.2.3 With Regard to Command Sequence

Next, a command sequence between the controller 200 and the NAND-type flash memory 100 during data erasing according to this example will be described.

Figure 67:
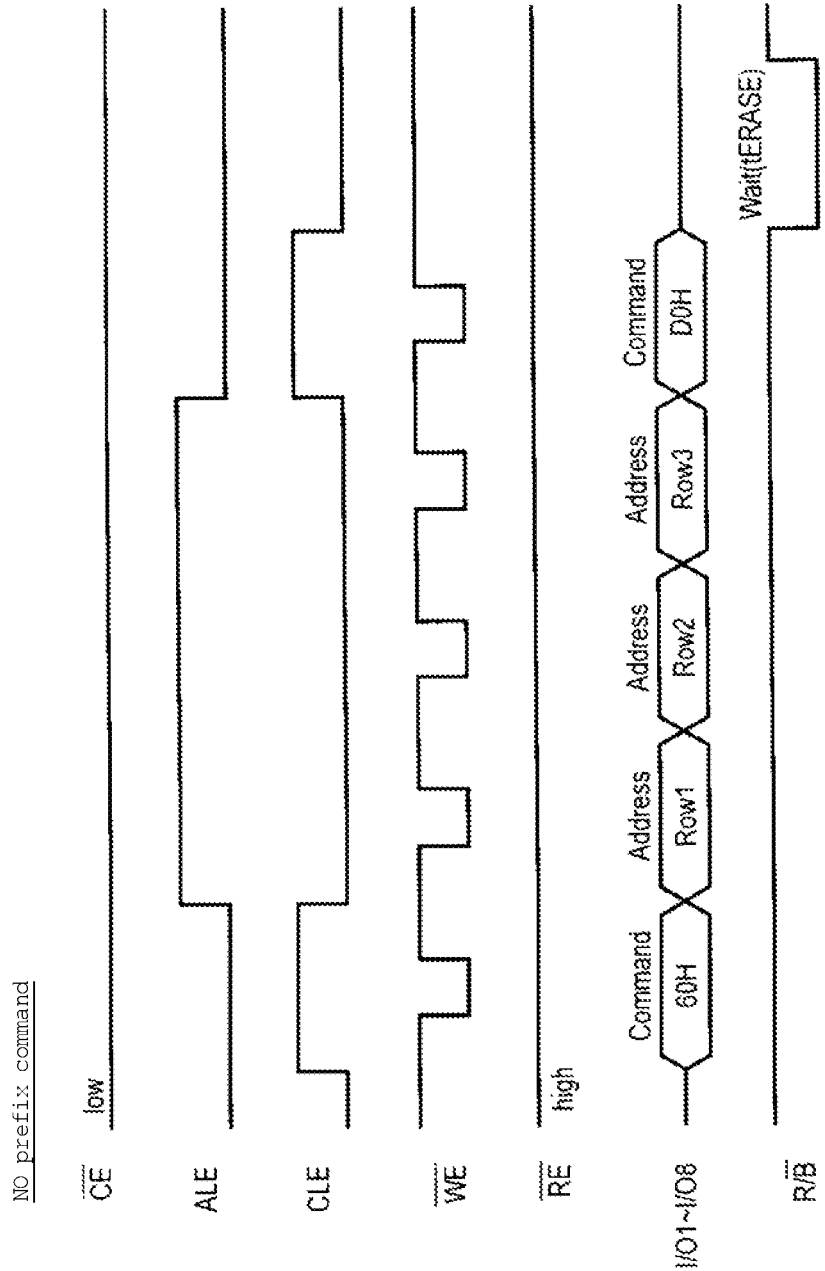
FIG. 67 is a timing chart showing various types of signals during an erasing operation based on a shipping setting mode according to the first example of the eleventh embodiment.

FIG. 67 is a timing chart showing signals that are transmitted and received between the controller 200 and the NAND-type flash memory 100 when the number of accumulated erasures n is less than the number of determinations N1. That is, the CPU 230 does not issue a prefix command, and the NAND-type flash memory 100 shows a case where data is erased in accordance with the setting at the time of shipping.

The CPU 230 transmits a chip enable signal /CE, an address latch enable signal ALE, a command latch enable signal CLE, a write enable signal /WE, and a read enable signal /RE to the NAND-type flash memory 100 from a NAND interface circuit 250. In addition, the NAND-type flash memory 100 transmits a ready/busy signal /R/B to the NAND interface circuit 250. Input/output signals I/O1 to I/O8 are, for example, data of 8 bits transmitted and received between the NAND interface circuit 250 of the controller 200 and the NAND-type flash memory 100.

The chip enable signal /CE is a signal for setting the NAND-type flash memory 100 to be in an enable state and is asserted at a low level. The address latch enable signal ALE is a signal indicating that the input/output signals I/O1 to I/O8 are addresses and is asserted at a high level. The command latch enable signal CLE is a signal indicating that the input/output signals I/O1 to I/O8 are commands and is asserted at a high level. The write enable signal /WE is a signal for writing data in the NAND-type flash memory 100 and is asserted at a low level. The read enable signal /RE is a signal for reading data from the NAND-type flash memory 1 and is asserted at a low level. The ready/busy signal /R/B is a signal indicating whether or not the NAND-type flash memory 100 is in a busy state (whether or not a state where the NAND-type flash memory may receive a signal is set) and is set to be at a low level when the NAND-type flash memory 100 is in a busy state.

As shown in the drawing, when the CPU 230 does not issue a prefix command, the CPU first issues a command "60H" for notifying of the execution of data erasing and asserts CLE ("H" level). The control unit 121 of the NAND-type flash memory 100 writes the command in a command register not shown in the drawing.

Next, the CPU 230 issues pieces of address data "Row1" to "Row3" for designating a block BLK for erasing and asserts ALE ("H" level). The control unit 121 of the NAND-type flash memory 100 writes the data in an address register not shown in the drawing. Meanwhile, FIG. 67 shows an example in which address data is transmitted in three cycles, but the number of cycles is arbitrary.

Next, the CPU 230 issues a command "D0H" for performing erasing and asserts CLE ("H" level). The control unit 121 of the NAND-type flash memory 100 writes the command in the command register.

Meanwhile, the CPU 230 asserts /WE whenever issuing a command, address data, and the like. Accordingly, whenever /WE is toggled, a signal is taken up in the NAND-type flash memory 100.

Next, the control unit 121 of the NAND-type flash memory 100 performs data erasing under an erasing condition at the time of shipping in response to the command. That is, the control unit 121 sets VERA1 to VERA3 to initial values, and data is erased using the initial values. During this time, the control unit 121 of the NAND-type flash memory 100 is set to be in a busy state (R/B="L"). When the erasing is completed, R/B returns to the "H" level.

Figure 68:
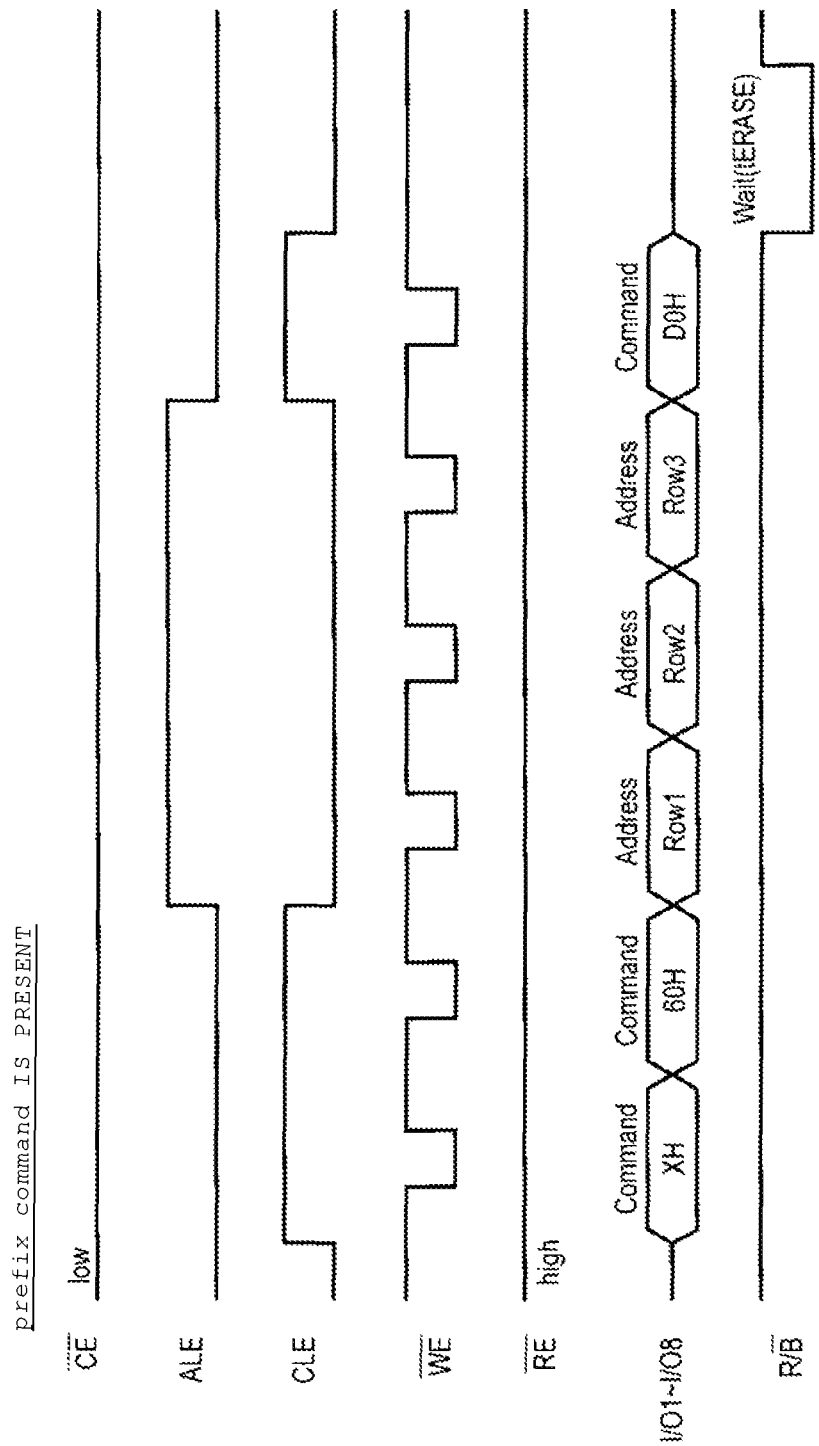
FIG. 68 is a timing chart showing various types of signals during an erasing operation using a prefix command according to the first example of the eleventh embodiment.

Next, a case where the CPU 230 issues a prefix command will be described. FIG. 68 is a timing chart showing signals that are transmitted and received between the controller 200 and the NAND-type flash memory 100 when the number of accumulated erasures n is greater than the number of determinations N1.

As shown in the drawing, the CPU 230 issues a command "XH" indicating any of the first to fourth prefix commands before the erasing command "60H" and asserts CLE ("H" level). The control unit 121 of the NAND-type flash memory 100 writes the command in the command register. Subsequently, the CPU 230 issues the commands and address data which are described in FIG. 67. In addition, the control unit 121 of the NAND-type flash memory 100 receives the command "XH" indicating the prefix command, and thus sets an erasing condition corresponding to the command and performs data erasing.

11.3 Second Example of Data Erasing

Next, a second example of data erasing will be described. In this example, a voltage condition of erasing is changed for each layer in accordance with the number of erasing loops m (m is any integer) and a prefix command when the erasing has been previously performed on a block BLK that is an erasing target.

11.3.1 With Regard to Erasing Condition During Data Erasing

First, an erasing condition during data erasing in this example will be described. FIG. 69 is a conceptual diagram of a management table according to this example. As shown in the drawing, the management table according to this example holds a relationship between a prefix command used during the last erasing operation, the number of determinations M for determining the number of erasing loops m at that time, and a prefix command. Here, the number of determinations M is any integer for determining the number of erasing loops m during the previous erasing and is arbitrarily set in response to a prefix command during the previous erasing operation. For example, when a prefix command is not issued during the previous erasing (first voltage condition), the number of determinations for determining the number of erasing loops m is set to M1. In addition, when a first prefix command is issued during the previous erasing (second voltage condition), the number of determinations for determining the number of erasing loops m is set to M2. Hereinafter, similarly, the numbers of determinations are set to M3, M4, . . . . In this manner, the numbers of determinations M1, M2, M3, M4, . . . are not related with each other. For example, the numbers of determinations M1, M2, M3, M4, . . . may be set to the same number. The CPU 230 transmits a prefix command based on the previous prefix command and the number of erasing loops m to the NAND-type flash memory 100 in accordance with the management table and sets an erasing voltage condition.

FIG. 70 is a flow chart showing an operation of the controller 200 during data erasing according to this example.

First, the host interface circuit 210 of the controller 200 receives an erasing command from a host device (step S121).

Next, the CPU 230 refers to the previous prefix command, the number of erasing loops m, and the management table (step S122).

First, when the CPU 230 does not issue a prefix command during the previous erasing (step S123, Yes), the CPU 230 compares the number of erasing loops m during the previous erasing with the number of determinations M1.

When the number of erasing loops m satisfies the relationship of 0<m≤M1 (step S128, Yes), the CPU 230 does not issue a prefix command similar to the previous time. Accordingly, the NAND interface circuit 250 transmits only an erasing command to the NAND-type flash memory 100. The NAND-type flash memory 100 performs data erasing under the first voltage condition which is set at the time of shipping (step S132).

When the number of erasing loops m satisfies the relationship of m>M1 (step S128, No), the CPU 230 issues a first prefix command. The NAND interface circuit 250 transmits an erasing command and the first prefix command to the NAND-type flash memory 100. The NAND-type flash memory 100 performs data erasing under a second voltage condition in accordance with the first prefix command (step S133).

When the CPU 230 issues the first prefix command during the previous erasing (step S124, Yes) and the number of erasing loops m during the previous erasing satisfies the relationship of 0<m≤M2 (step S129, Yes), the CPU 230 issues a first prefix command similar to the previous time. The NAND interface circuit 250 transmits an erasing command and the first prefix command to the NAND-type flash memory 100. Similarly to the previous time, the NAND-type flash memory 100 performs data erasing under a second voltage condition in accordance with the first prefix command (step S132).

When the number of erasing loops m satisfies the relationship of m>M2 (step S129, No), the CPU 230 issues a second prefix command. The NAND interface circuit 250 transmits an erasing command and the second prefix command to the NAND-type flash memory 100. The NAND-type flash memory 100 performs data erasing under a third voltage condition in accordance with the second prefix command (step S133).

When the CPU 230 issues the second prefix command during the previous erasing (step S125, Yes) and the number of erasing loops m during the previous erasing satisfies the relationship of 0<m≤M3 (step S130, Yes), the CPU 230 issues a second prefix command similar to the previous time. The NAND interface circuit 250 transmits an erasing command and the second prefix command to the NAND-type flash memory 100. The NAND-type flash memory 100 performs data erasing under a third voltage condition in accordance with the second prefix command (step S134).

When the number of erasing loops m satisfies the relationship of m>M3 (step S130_No), the CPU 230 issues a third prefix command. The NAND interface circuit 250 transmits an erasing command and the third prefix command to the NAND-type flash memory 100. The NAND-type flash memory 100 performs data erasing under a fourth voltage condition in accordance with the third prefix command (step S135).

When the CPU 230 issues the third prefix command during the previous erasing (step S126, Yes) and the number of erasing loops m during the previous erasing satisfies the relationship of 0<m≥M4 (step S131, Yes), the CPU 230 issues the third prefix command similar to the previous time. The NAND interface circuit 250 transmits an erasing command and the third prefix command to the NAND-type flash memory 100. The NAND-type flash memory 100 performs data erasing under the fourth voltage condition in accordance with the third prefix command (step S135).

When the number of erasing loops m satisfies the relationship of m>M4 (step S131, No), the CPU 230 issues a fourth prefix command. The NAND interface circuit 250 transmits an erasing command and the fourth prefix command to the NAND-type flash memory 100. The NAND-type flash memory 100 performs data erasing under a fifth voltage condition in accordance with the fourth prefix command (step S136).

When the CPU 230 issues the fourth prefix command during the previous erasing (step S127, Yes), the CPU 230 issues the fourth prefix command. The NAND interface circuit 250 transmits an erasing command and the fourth prefix command to the NAND-type flash memory 100. The NAND-type flash memory 100 performs data erasing under a fifth voltage condition in accordance with the fourth prefix command (step S136).

After the erasing is completed, the CPU 230 reads the number of erasing loops m from the NAND-type flash memory 100. Then, the CPU 230 stores the number of erasing loops m of a target block BLK which is read from the NAND flash memory 100 and the prefix command issued by the CPU 230, for example, in the built-in memory 220.

11.3.2 With Regard to Data Erasing Voltage

Figure 71:
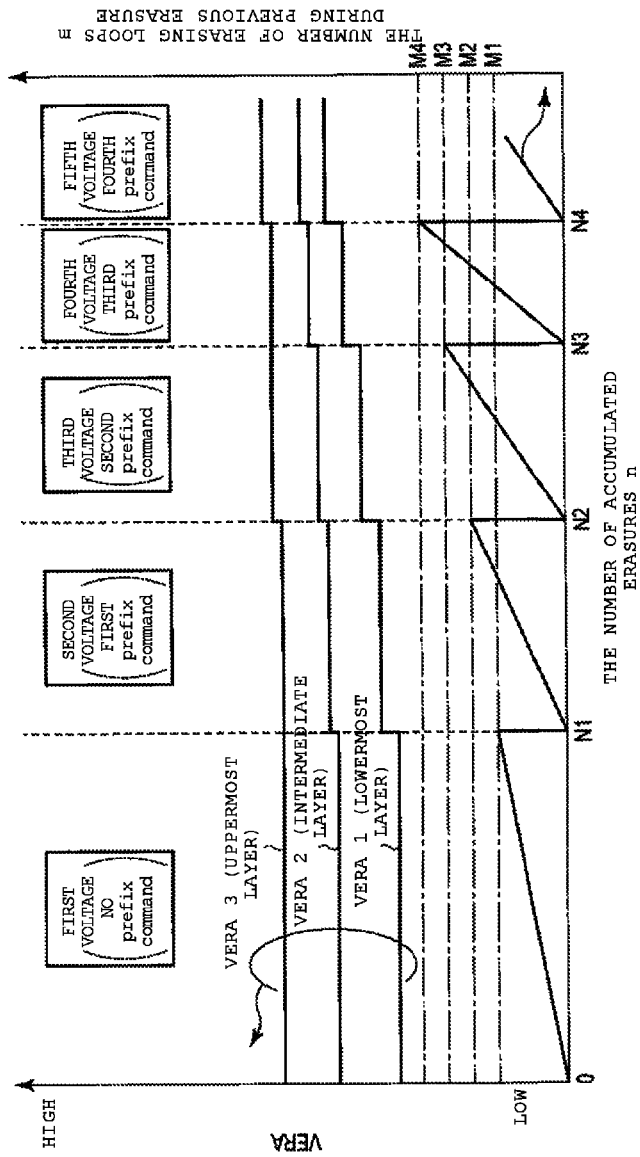
FIG. 71 is a graph showing a relationship between the number of erasing loops and a voltage VERA according to the second example of the eleventh embodiment.

FIG. 71 is a graph showing a relationship between the number of accumulated erasures n (prefix command), the number of erasing loops m, and VERA. Similarly to FIG. 66, FIG. 71 shows a case where a NAND string SR3 has data being least likely to be erased but has a small variation in erasing characteristics and a NAND string SR1 has data being most likely to be erased and thus has a large variation in erasing characteristics.

As shown in the drawing, a method of changing VERA is the same as that in FIG. 66. However, in this example, conditions when VERA is stepped up are different from those in FIG. 66. That is, as described above, the step-up of VERA is based on a prefix command which is used lately and the number of erasing loops m there, rather than being based on the number of accumulated erasures n. Accordingly, as shown in FIG. 71, when the number of erasing loops reaches M1 during a period for which an erasing operation is performed without using a prefix command, VERA is stepped up. In addition, when the number of erasing loops reaches M2 during a period for which an erasing operation is performed using the first prefix command, VERA is further stepped up. The same applies hereinafter.

Meanwhile, in FIG. 70, the numbers of determinations M have a relationship of M4>M3>M2>M1. However, the numbers of determinations M are arbitrarily set in accordance with a prefix command, and thus are not particularly related with each other. For example, all of the numbers may be set to the same number.

11.3.3 With Regard to Command Sequence

Next, with regard to a command sequence between the controller 200 and the NAND-type flash memory 100 according to this example, a reading operation having the number of erasing loops m which is particularly performed after completing erasing will be described.

Figure 72:
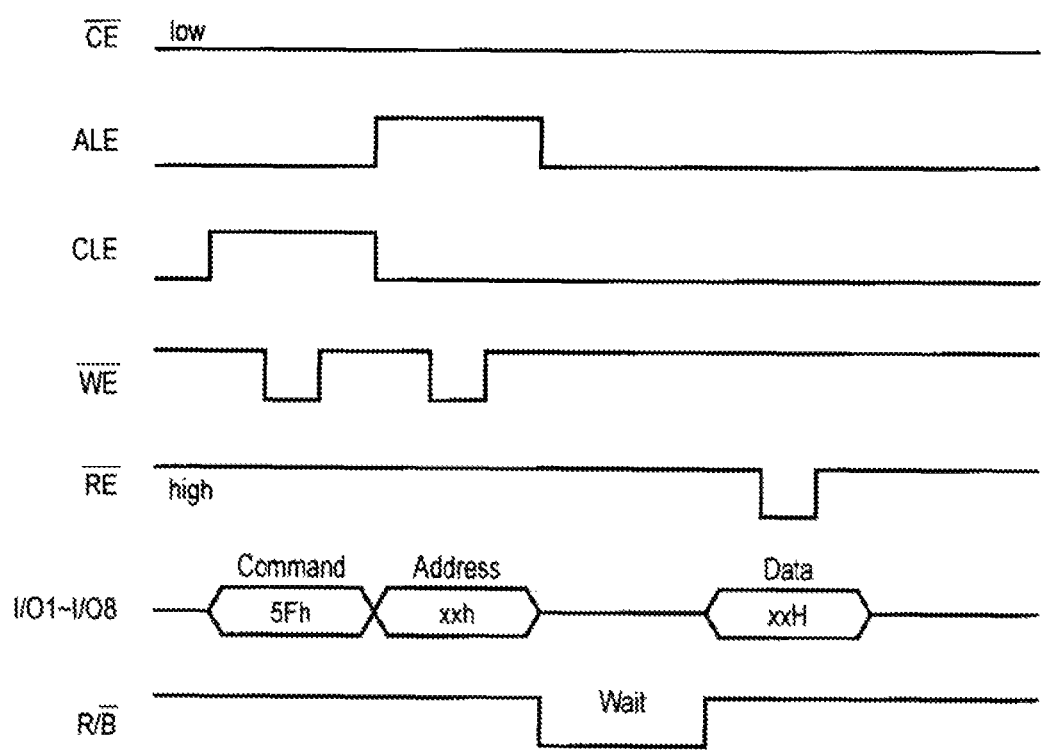
FIG. 72 is a timing chart showing various types of signals when an erasing operation is completed according to the second example of the eleventh embodiment.

In the data erasing according to this example, signals transmitted and received between the controller 200 and the NAND-type flash memory 100 until erasing is performed are the same as those in FIGS. 67 and 68 according to the first example. In this example, the controller 200 reads the number of erasing loops m necessary for the erasing operation from the NAND-type flash memory 100 after the completion of the erasing operation. FIG. 72 shows a command sequence in this case.

As shown in the drawing, first, the CPU 230 issues a command "5Fh" for performing reading and asserts CLE ("H" level). The control unit 121 of the NAND-type flash memory 100 writes the command in a command register.

Next, the CPU 230 issues an address "xxh" for designating a memory cell array (plain) from which the number of erasing loops is desired to be read and asserts ALE ("H" level). The control unit 121 of the NAND-type flash memory 100 writes the address in an address register.

Meanwhile, the CPU 230 asserts /WE whenever issuing a command, address data, and the like. Accordingly, whenever /WE is toggled, a signal is taken up in the NAND-type flash memory 100.

Next, the control unit 121 of the NAND-type flash memory 100 reads the number of erasing loops m necessary for a latest erasing operation regarding the address "xxh" from, for example, any register in response to the command "5Fh". During this time, the control unit 121 of the NAND-type flash memory 100 is set to be in a busy state (R/B="L"). Then, when the reading is completed, R/B returns to the "H" level.

Next, the CPU 230 asserts /RE. The control unit 121 of the NAND-type flash memory 100 transfers data "xxH" to the controller 200. Then, the CPU 230 stores the data in, for example, the built-in memory 220.

11.4 Third Example of Data Erasing Operation

Next, a third example will be described. This example provides a method of changing a voltage condition of erasing for each layer in accordance with the number of erasing loops m when the erasing has been previously performed on a block BLK that is an erasing target. Here, only differences from the second example will be described.

11.4.1 With Regard to Method of Erasing Data

A data erasing method in this example will be described. In this example, the management table described in the first and second examples is not necessary. In addition, the controller 200 issues a prefix command based on a result of the comparison between the number of erasing loops m during the previous erasing and the number of determinations M. In addition, the prefix command according to this example is a command for instructing the correction of an erasing voltage (step-up of VERA) and is issued only when the erasing voltage is required to be corrected.

Figure 73:
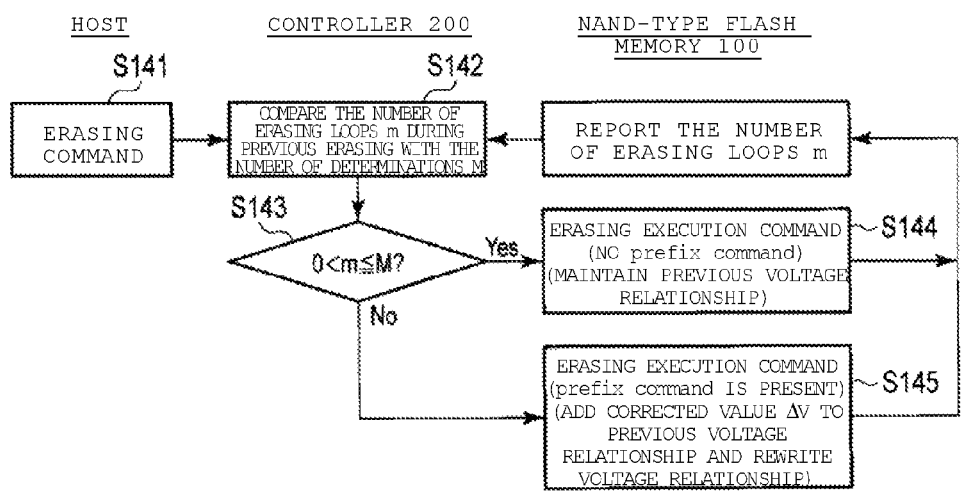
FIG. 73 is a flow chart showing a data erasing operation according to a third example of the eleventh embodiment.

FIG. 73 is a flow chart showing an operation of a controller 200 during data erasing according to this example.

First, the host interface circuit 210 of the controller 200 receives an erasing command from a host device (step S141).

Next, the CPU 230 compares the number of erasing loops m necessary for a previous erasing operation with the number of determinations M which is held in, for example, a built-in memory (step S142).

First, when the number of erasing loops m during the previous erasing satisfies the relationship of 0<m≤M (step S143, Yes), the CPU 230 does not issue a prefix command. Accordingly, the NAND interface circuit 250 transmits only an erasing command to the NAND-type flash memory 100. The NAND-type flash memory 100 performs data erasing under a voltage condition under which the previous erasing is performed (step S144).

When the previous number of erasing loops m satisfies the relationship of m>M (step S143, No), the CPU 230 issues a prefix command and transmits an erasing command and the prefix command to the NAND-type flash memory 100 from the NAND interface circuit 250. The NAND-type flash memory 100 adds a corrected value ΔV to the previous voltage condition in accordance with the prefix command and performs data erasing under a new voltage condition (step S145). Here, the corrected value ΔV is a corrected value for changing an erasing voltage and is, for example, a step-up width of VERA.

After the erasing is completed, the CPU 230 reads the number of erasing loops m from the NAND-type flash memory 100. The CPU 230 stores the number of erasing loops m of a target block BLK which is read from the NAND-type flash memory 100, for example, in the built-in memory 220.

11.4.2 With Regard to Data Erasing Voltage

Figure 74:
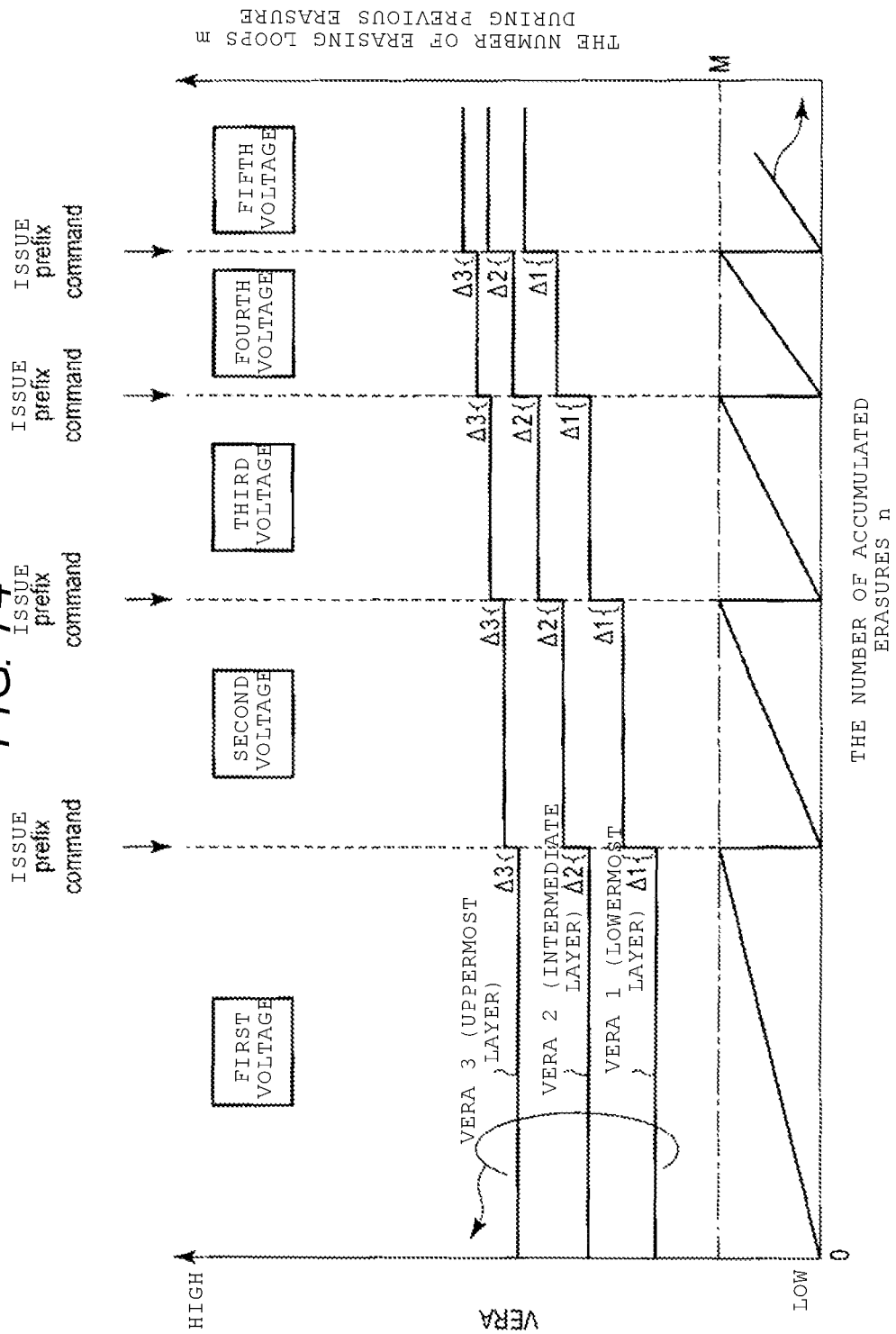
FIG. 74 is a graph showing a relationship between the number of accumulated erasures, a voltage VERA, and the number of erasing loops according to the third example of the eleventh embodiment.

FIG. 74 is a graph showing a relationship between the number of accumulated erasures n, the number of erasing loops m, and VERA. Similarly to FIG. 66, FIG. 71 shows a case where a NAND string SR3 has data being least likely to be erased but has a small variation in erasing characteristics and a NAND string SR1 has data being most likely to be erased and thus has a large variation in erasing characteristics.

As shown in the drawing, a method of changing VERA is the same as that in FIG. 66. However, in this example, conditions when VERA is stepped up are different from those in FIG. 66. That is, in this example, a prefix command is issued when the number of erasing loops m exceeds a determination value M, regardless of the number of accumulated erasures n and a prefix command used lately, and VERA1 to VERA3 are stepped up at this timing. The step-up widths of VERA1 to VERA3 are ΔV1 to ΔV3, respectively, and have a relationship of, for example, ΔV1>ΔV2>ΔV3.

11.5 Effects According to this Embodiment

In the configuration according to this embodiment, the same effects as those in the first to tenth embodiments described above are obtained.

In the configuration according to this embodiment, it is possible to perform erasing by correcting an erasing condition even when the erasing characteristics of a memory cell transistor MT vary. Further, it is possible to correct a difference in erasing characteristics between layers by applying a different correction condition for each layer. Accordingly, it is possible to apply an optimum erasing condition to each layer regardless of the variation in erasing characteristics. As a result, it is possible to reduce the number of erasing loops and to shorten a processing time of an erasing operation.

In addition, it is possible to manage a deterioration situation of erasing characteristics of the memory cell transistor MT by monitoring the number of erasing loops.

Meanwhile, in the first to third examples, a case where a voltage VERA is changed in an erasing operation using GIDL is described. However, it is also possible to apply the examples to an erasing operation using an FN tunnel effect. In the case of the erasing using an FN tunnel effect, a voltage value applied to a source line SL is changed in accordance with the easiness of data erasing, for example, as described in the third example of the sixth embodiment. Accordingly, it is possible to correct a difference in erasing characteristics between layers by stepping up the voltage of the source line SL in accordance with a prefix command.

Further, in this embodiment, the first to fifth voltage conditions are set, but a plurality of voltage conditions may be set.

Figure 75:
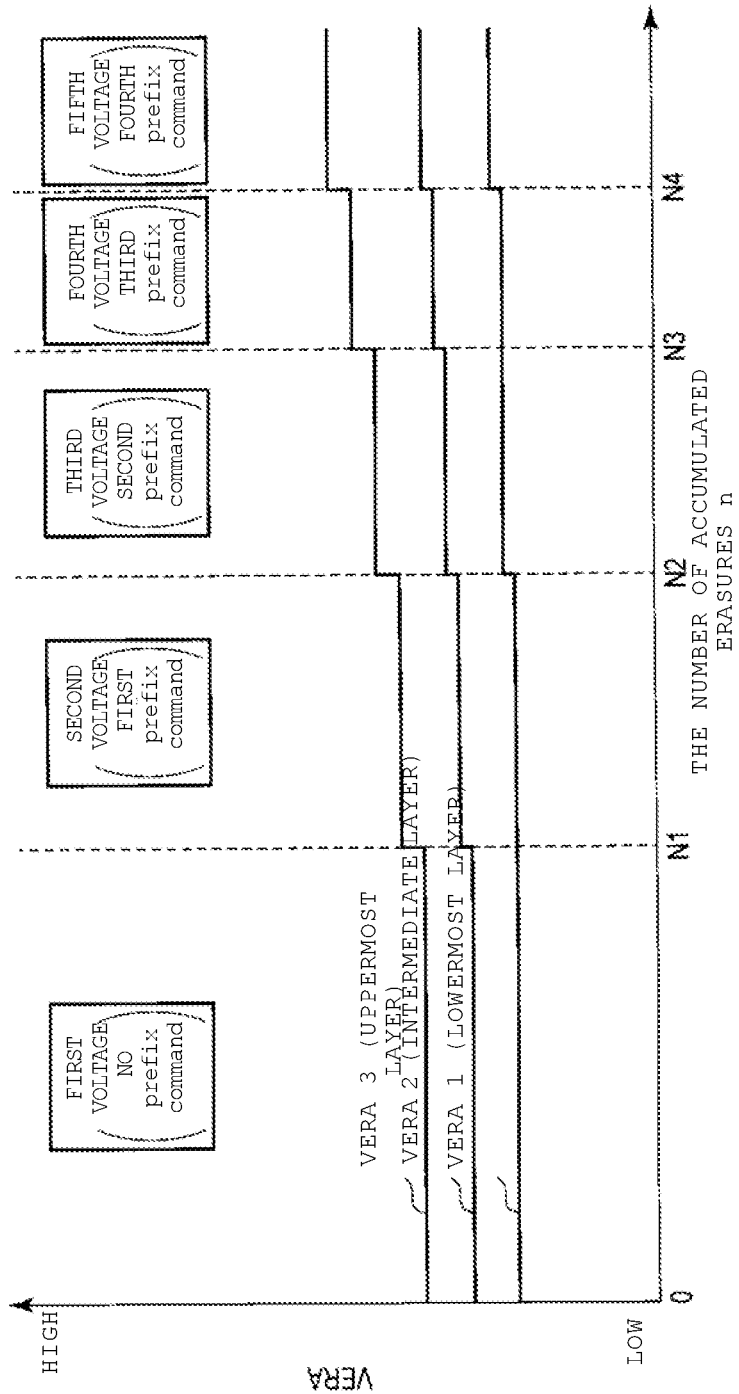
FIG. 75 is a graph showing a relationship between the number of accumulated erasures and VERA according to a modification example of the eleventh embodiment.
Figure 76:
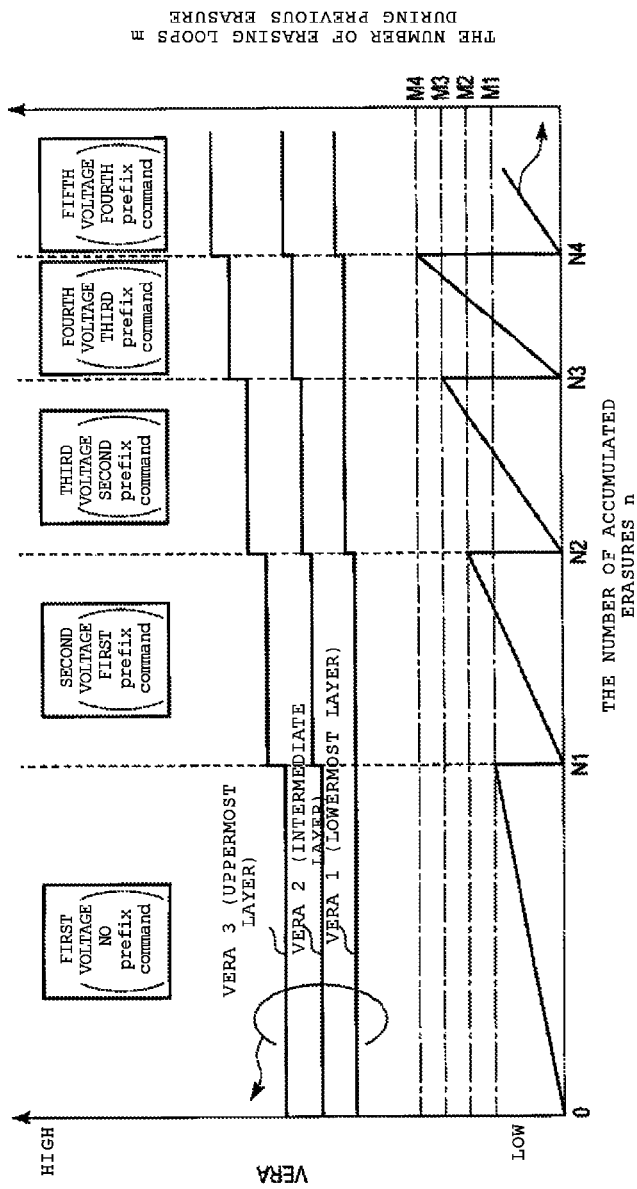
FIG. 76 is a graph showing a relationship between the number of accumulated erasures, the number of erasing loops, and VERA according to a modification example of the eleventh embodiment.

Further, in this embodiment, a description is given of a case where a NAND string SR3 has data being least likely to be erased and has a small variation in erasing characteristics and where a NAND string SR1 has data being most likely to be erased and has a large variation in erasing characteristics. However, the NAND string SR3 may have the largest variation in erasing characteristics, and the NAND string SR1 may have the smallest variation in erasing characteristics. FIGS. 75 to 77 show a case where the NAND string SR3 has the largest variation in erasing characteristics and the NAND string SR1 has the smallest variation in erasing characteristics in the first to third examples. In this manner, a layer having a large erasing variation is set to have a large step-up width of VERA, and thus it is possible to apply this embodiment to both a case where each layer has a large variation in erasing characteristics and a case where each layer has a small variation in erasing characteristics.

Further, in the second and third examples, a prefix command is determined by comparing the number of erasing loops m during the previous erasing with the number of determinations M, but may be determined by setting a difference between the numbers of erasing loops of two layers (for example, the uppermost layer and the lowermost layer) which have a large difference in erasing characteristics to m and comparing the difference m with the number of determinations M.

12. Modification Examples and the Like

The semiconductor memory device according to the above-described embodiment includes a plurality of memory cell transistors MT, a plurality of word lines WL, a plurality of NAND strings SR, a plurality of string groups GR, and a plurality of memory units MU, for example, as shown in FIG. 3. The plurality of memory cell transistors are respectively provided in a plurality of layers located above a semiconductor substrate (for example, FIG. 8). The plurality of word lines WL are connected in common to the plurality of memory cell transistors MT provided in different layers (for example, the word lines WL1 to WL4 of FIG. 8).

The plurality of NAND strings SR connect the current paths of the plurality of memory cell transistors MT, which are provided in the same layer, in series (for example, the semiconductor layers 23-1 to 23-3 of FIG. 8). Each of the plurality of string groups GR includes the plurality of NAND strings SR which are stacked on different layers (for example, the semiconductor layers 23-1 to 23-3 of FIG. 6). Each of the plurality of memory units MU includes the plurality of string groups GR (string GR1-1 to GR4-1 of FIG. 6). The data erasing of the memory cell transistor MT is performed by repeating an erasing loop including an erasing operation and a verifying operation multiple times (for example, step S12 to step S15 of FIG. 9). The verifying operation includes erasing verification and a determination operation for determining whether or not the data erasing is completed (for example, step S12 and step S13 of FIG. 10). The determination operation is performed for each layer (for example, the uppermost layer, the intermediate layer, and the lowermost layer in step S13 of FIG. 10).

It is possible to provide a semiconductor memory device and a data erasing method which are capable of improving operational reliability through the above-described embodiments.

In the above-described embodiments, a description is given of a case where an optimum erasing condition varies due to a different size of the memory cell transistor MT for each layer during an erasing operation. However, an optimum value is different for each layer even in programming and reading operations, and may be controlled individually.

Further, in the above-described embodiments, a description is given of a method of correcting an erasing condition for each layer because erasing characteristics of the memory cell transistor MT vary due to the number of accumulated erasures. However, the correction of a programming condition and a reading condition may be performed for each layer even in programming and reading operations.

Further, in the above-described embodiments, a description is given of a case where data of an uppermost layer is least likely to be erased and data of a lowermost layer is most likely to be erased. However, data of an intermediate layer may be least likely to be erased depending on the shape of the memory cell transistor MT or data of a lowermost layer may be least likely to be erased, and a relationship of the easiness of erasing between layers is not limited.

Further, in the first example according to the fifth embodiment, when an erasing operation is performed with an erasing pulse width which is different for each layer, an application period of VERA applied to the bit line BL is changed. However, an erasing pulse width may be changed by changing a period for which VERA_GIDL is applied to the control signal line SSL.

Further, in the fifth and seventh embodiments, when an erasing operation is performed with an erasing pulse width which is different for each layer, voltages applied to the respective layers are set to the same value. However, different voltages may be supplied according to the erasing characteristics of the layers.

Further, in the sixth and seventh embodiments, when an erasing operation is performed with different erasing voltages, erasing pulse times of the respective layers are set to the same value. However, voltages may be applied with different erasing pulse widths according to the erasing characteristics of the layers.

Further, in the seventh embodiment, although an N-channel MOS transistor is used for the bit line connection portion and the source line connection portion, a P-channel MOS transistor may be used.

Further, in the tenth embodiment, when the erasing of sub-blocks is performed, different erasing conditions may be applied depending on sub-blocks to be selected.

Further, in the eleventh embodiment, although an erasing operation using GIDL is described, an erasing operation using an FN tunnel effect may be used. In this case, for example, in the semiconductor memory device according to the third embodiment, the voltage of the source line SL may be changed for each layer.

Further, in the eleventh embodiment, an erasing voltage is changed as the correction of an erasing condition corresponding to the number of accumulated erasures, but an erasing pulse width may be changed.

Further, in the eleventh embodiment, an erasing condition is corrected for each layer, but may be corrected for each zone ZN.

Further, in the eleventh embodiment, the CPU 230 determines an erasing condition and issues a prefix command, but the control unit 121 of the NAND-type flash memory 100 may performed the same processing. In this case, the issuance of a prefix command from the controller 200 becomes unnecessary, and an erasing condition is determined under the control of the control unit 121.

Further, in the eleventh embodiment, an erasing condition is corrected for each layer. However, it is possible to implement this embodiment by correcting an erasing condition for each of groups classified according to differences between the shapes of memory cell transistors MT also in a three-dimensional NAND-type flash memory in which a NAND string SR does not have a layered structure.

Further, in the first and second examples of the eleventh embodiment, a prefix command is issued under the first voltage condition, but a 0-th prefix command corresponding to the first voltage condition may be issued.

Meanwhile, according to the embodiments, (1) In a reading operation, a voltage applied to a word line selected for an A-level reading operation is in a range, for example, between 0 V and 0.55 V. The voltage is not limited thereto, and may be in any of ranges between 0.1 V and 0.24 V, between 0.21 V and 0.31 V, between 0.31 V and 0.4 V, between 0.4 V and 0.5 V, and between 0.5 V and 0.55 V.

A voltage applied to a word line selected for a B-level reading operation is in a range, for example, between 1.5 V and 2.3 V. The voltage is not limited thereto, and may be in any of ranges between 1.65 V and 1.8 V, between 1.8 V and 1.95 V, between 1.95 V and 2.1 V, and between 2.1 V and 2.3 V.

A voltage applied to a word line selected for a C-level reading operation is in a range, for example, between 3.0 V and 4.0 V. The voltage is not limited thereto, and may be in any of ranges between 3.0 V and 3.2 V, between 3.2 V and 3.4 V, between 3.4 V and 3.5 V, between 3.5 V and 3.6 V, and between 3.6 V and 4.0 V.

A reading operation time (tR) may be set to be in a range, for example, between 25 μs and 38 μs, between 38 μs and 70 μs, and between 70 μs and 80 μs.

(2) As described above, a writing operation includes a programming operation and a verifying operation. In the writing operation, A voltage which is first applied to a word line selected for the programming operation is in a range, for example, between 13.7 V and 14.3 V. The voltage is not limited thereto, and may be in any of ranges, for example, between 13.7 V and 14.0 V and between 14.0 V and 14.6 V.

A voltage which is first applied to a selected word line when writing an odd-numbered word line may be switched with a voltage which is first applied to a selected word line when writing an even-numbered word line.

When an incremental step pulse program (ISPP) type programming operation is performed, a step-up voltage of, for example, approximately 0.5 V may be used.

A voltage applied to an unselected word line may be in a range, for example, between 6.0 V and 7.3 V. The voltage is not limited thereto, and may be set to be in a range, for example, 7.3 V and 8.4 V or may be set to equal to or less than 6.0 V.

A path voltage to be applied may be changed according to whether an unselected word line is an odd-numbered word line or an even-numbered word line.

A writing operation time (tProg) may be set to be in a range, for example, between 1,700 μs and 1,800 μs, between 1,800 μs and 1,900 μs, or between 1,900 μs and 2,000 μs.

(3) In an erasing operation, a voltage which is first applied to a well, which is formed on a semiconductor substrate and has the above-mentioned memory cell disposed thereon, is in a range, for example, between 12 V and 13.6 V. The voltage is not limited thereto, and may be in a range, for example, between 13.6 V and 14.8 V, between 14.8 V and 19.0 V, between 19.0 and 19.8 V, or between 19.8 V and 21 V.

An erasing operation time (tErase) may be set to be in a range, for example, between 3,000 μs and 4,000 μs, between 4,000 μs and 5,000 μs, or between 4,000 μs and 9,000 μs.

(4) The structure of a memory cell includes a charge storage layer which is disposed on a semiconductor substrate (silicon substrate) through a tunnel insulating film having a film thickness of 4 nm to 10 nm. The charge storage layer may be configured to have a stacked structure including an insulating film such as SiN or SiON having a film thickness of 2 nm to 3 nm and polysilicon having a film thickness of 3 nm to 8 nm. In addition, a metal such as Ru may be added to polysilicon. An insulating film is provided on the charge storage layer. The insulating film includes, for example, a silicon oxide film having a film thickness of 4 nm to 10 nm which is interposed between a lower High-k film having a film thickness of 3 nm to 10 nm and an upper High-k film having a film thickness of 3 nm to 10 nm. The High-k film may be HfO or the like. In addition, the film thickness of the silicon oxide film may be set larger than the film thickness of the High-k film. A control electrode having a film thickness of 30 nm to 70 nm is formed on the insulating film through a material having a film thickness of 3 nm to 10 nm. Here, the material is a metal oxide film such as TaO or a metal nitride film such as TaN. In addition, W or the like may be used for the control electrode.

In addition, an air gap may be formed between memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array including a first memory string and a second memory string, the first memory string including memory cells that are disposed in a first layer, the second memory string including memory cells that are disposed in a second layer above the first layer; and
a controller configured to perform an erasing operation on the memory cells, the erasing operation including a first period during which an erasing pulse is applied to the memory cells of the second memory string, and the erasing pulse is not applied to the memory cells of the first memory string, and a second period directly after the first period during which the erasing pulse is applied to both the memory cells of the first memory string and the memory cells of the second memory string.

2. The device according to claim 1, further comprising:
a first bit line electrically connected to a first end of the first memory string;
a first source line electrically connected to a second end of the first memory string;
a second bit line electrically connected to a first end of the second memory string; and
a second source line electrically connected to a second end of the second memory string, wherein
the erasing pulse is applied to memory cells of the first memory string through at least one of the first bit line and the first source line, and to memory cells of the second memory string through at least one of the second bit line and the second source line.

3. The device according to claim 2, wherein the erasing pulse is applied to the memory cells of the first memory string through the first bit line and to the memory cells of the second memory string through the second bit line.

4. The device according to claim 3, wherein
the memory cell array further includes:
a third memory string including memory cells in the first layer, the third memory string being directly below the second memory string, and
a fourth memory string including memory cells in the second layer, the fourth memory string being directly above the first memory string.

5. The device according to claim 4, wherein
the first bit line is electrically connected to a first end of the third memory string and the second source line is electrically connected to a second end of the third memory string, and
the second bit line is electrically connected to a first end of the fourth memory string and the first source line is electrically connected to a second end of the fourth memory string.

6. The device according to claim 3, wherein the first and second source lines are maintained at a constant voltage while the erasing pulse is applied to the memory cells of the second memory string and memory cells of the first memory string.

7. The device according to claim 6, wherein the erasing pulse is applied to the memory cells of the first memory string through the first source line and to the memory cells of the second memory string through the second source line.

8. The device according to claim 7, wherein
the memory cell array further includes:
a third memory string including memory cells that are disposed in the first layer, the third memory string being directly below the second memory string, and
a fourth memory string including memory cells that are disposed in the second layer, the fourth memory string being directly above the first memory string.

9. The device according to claim 8, wherein
the first bit line is electrically connected to a first end of the fourth memory string and the second source line is electrically connected to a second end of the fourth memory string, and
the second bit line is electrically connected to a first end of the third memory string and the first source line is electrically connected to a second end of the third memory string.

10. The device according to claim 7, wherein the first and second bit lines are maintained at a constant voltage while the erasing pulse voltage is applied to the memory cells of the second memory string and the memory cells of the first memory string.

* * * * *